(12) United States Patent
Matsui

(10) Patent No.: US 6,324,104 B1
(45) Date of Patent: Nov. 27, 2001

(54) SEMICONDUCTOR INTEGRATED CIRCUIT DEVICE

(75) Inventor: Yoshinori Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/519,073

(22) Filed: Mar. 6, 2000

(30) Foreign Application Priority Data

Mar. 10, 1999 (JP) .................................................. 11-064094

(51) Int. Cl.$^7$ ...................................................... G11C 7/00
(52) U.S. Cl. .......................................................... 365/200
(58) Field of Search .................................. 365/200, 201, 365/230.03, 230.05, 230.06

(56) References Cited

U.S. PATENT DOCUMENTS

| | | | | |
|---|---|---|---|---|
| 5,416,740 | * | 5/1995 | Fujita et al. | 365/200 |
| 5,497,347 | * | 3/1996 | Feng | 365/189.07 |
| 6,016,280 | * | 1/2000 | Maesako et al. | 365/226 |
| 6,023,433 | * | 2/2000 | Kashikawa | 365/200 |
| 6,122,207 | * | 9/2000 | Koshikawa et al. | 365/200 |
| 6,137,736 | * | 10/2000 | Kitayama | 365/200 |
| 6,201,744 | * | 2/2001 | Takahashi | 365/200 |

FOREIGN PATENT DOCUMENTS

| | | |
|---|---|---|
| 57-20983 | 2/1982 | (JP) . |
| 60-7690 | 1/1985 | (JP) . |
| 62-38590 | 2/1987 | (JP) . |
| 1-146187 | 6/1989 | (JP) . |
| 4-252486 | 9/1992 | (JP) . |
| 4-318389 | 11/1992 | (JP) . |
| 5-2872 | 1/1993 | (JP) . |

* cited by examiner

*Primary Examiner*—Amir Zarabian
*Assistant Examiner*—Anh Phung
(74) *Attorney, Agent, or Firm*—Sughrue, Mion, Zinn, Macpeak & Seas, PLLC

(57) ABSTRACT

A semiconductor integrated circuit device which can save defect bits in an auxiliary storage portion functioning as a cache memory is provided. A redundant SRAM cell array MAR is provided so as to be adjacent to a SRAM cell array MA of a SRAM portion functioning as a cache memory, and with the positions of rows matching. Redundant cells which are alternatively selected based on redundant selection signals, are arranged in matrix form in this redundant SRAM cell array MAR. Moreover, a data input/output line SIOR is provided in each row of this SRAM cell array MAR, and each data input/output line SIOR is connected to a global data input/output line GIOR via a data input/output line connection circuit which is alternatively conduction controlled based on a predetermined selection signal. This global data input/output line GIOR is connected to a read/write bus line together with a read/write amplifier which is used at normal times.

6 Claims, 80 Drawing Sheets

FIG. 4

PIN ARRANGEMENT

64M SDRAM+16K SRAM (×8)

| | | | | |
|---|---|---|---|---|
| Vcc | 1 | | 54 | Vss |
| DQ0 | 2 | | 53 | DQ7 |
| VccQ | 3 | | 52 | VssQ |
| NC | 4 | | 51 | NC |
| DQ1 | 5 | | 50 | DQ6 |
| VssQ | 6 | | 49 | VccQ |
| NC | 7 | | 48 | NC |
| DQ2 | 8 | | 47 | DQ5 |
| VccQ | 9 | | 46 | VssQ |
| NC | 10 | | 45 | NC |
| DQ3 | 11 | 54pin | 44 | DQ4 |
| VssQ | 12 | 400mil × 875mil | 43 | VccQ |
| NC | 13 | 0.8mm Pitch | 42 | NC |
| Vcc | 14 | TSOP II | 41 | Vss |
| NC | 15 | | 40 | NC, VREF |
| /WE | 16 | | 39 | DQM |
| /CAS | 17 | | 38 | CLK |
| /RAS | 18 | | 37 | CKE |
| /CS | 19 | | 36 | NC |
| A13 (BA) | 20 | | 35 | A11 |
| A12 | 21 | | 34 | A9 |
| A10 (AP) | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

FIG. 5

CORRESPONDENCE BETWEEN COMMANDS AND INPUT TERMINAL STATES

| COMMAND | CKE n-1 | CKE n | /CS | /RAS | /CAS | /WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|
| READ | H | x | L | H | L | H | x | x | x | SRAM COLUMN SELECTION | | | | | | | SRAM ROW SELECTION | | | |
| WRITE | H | x | L | H | L | L | x | x | x | SRAM COLUMN SELECTION | | | | | | | SRAM ROW SELECTION | | | |
| PREFETCH | H | x | L | L | H | L | BANK SELECTION | x | x | L | L | x | DRAM COLUMN SELECTION | | | x | SRAM ROW SELECTION | | | |
| PREFETCH (AUTO PRECHARGE) | H | x | L | L | H | L | BANK SELECTION | x | x | H | L | x | DRAM COLUMN SELECTION | | | x | | | | |
| RESTORE | H | x | L | L | H | L | BANK SELECTION | x | x | L | H | x | DRAM COLUMN SELECTION | | | x | SRAM ROW SELECTION | | | |
| RESTORE (AUTO PRECHARGE) | H | x | L | L | H | L | BANK SELECTION | x | x | H | H | x | DRAM COLUMN SELECTION | | | x | | | | |
| ACTIVE | H | x | L | L | H | H | BANK SELECTION | x | x | DRAM ROW SELECTION | | | | | | | | | | |
| PRECHARGE | H | x | L | L | H | L | BANK SELECTION | x | x | L | x | x | x | x | x | x | x | x | x | x |
| ALL BANK PRECHARGE | H | x | L | L | H | L | x | x | x | H | x | x | x | x | x | x | x | x | x | x |
| CBR REFRESH | H | x | L | L | L | H | x | x | x | x | x | x | x | x | x | x | x | x | x | x |
| NON-OPERATION | H | x | L | H | H | H | x | x | x | x | x | x | x | x | x | x | x | x | x | x |
| DEVICE NON-SELECTION | H | x | H | x | x | x | x | x | x | x | x | x | x | x | x | x | x | x | x | x |
| REGISTER SETTING (1) | H | x | L | L | L | L | L | L | L | L | L | L | L | L | REGISTER SETTING | | | | | |
| REGISTER SETTING (2) | H | x | L | L | L | L | L | x | x | x | x | x | x | x | REGISTER SETTING | | | | | |

H: HIGH LEVEL  L: LOW LEVEL  x: HIGH OR LOW (DON'T CARE)

FIG. 15 [CBR REFRESH COMMAND]
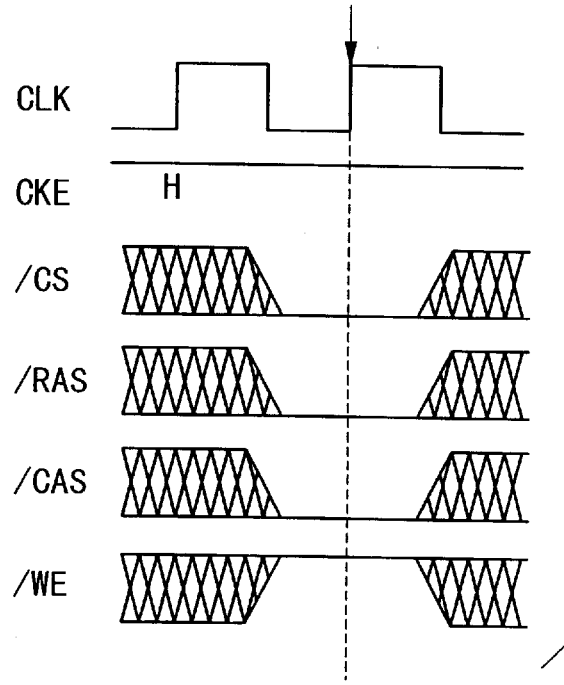
FIG. 16 NON-OPERATION COMMAND
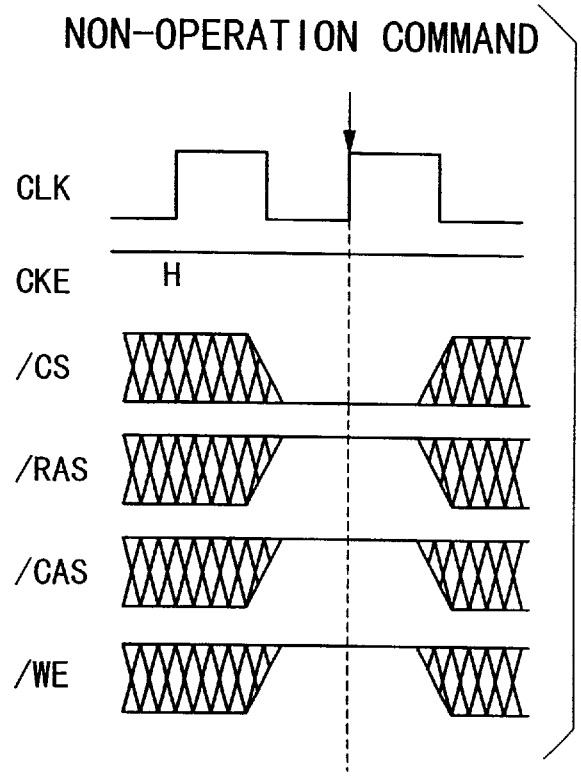

FIG. 17  [DEVICE NON-SELECTION COMMAND]
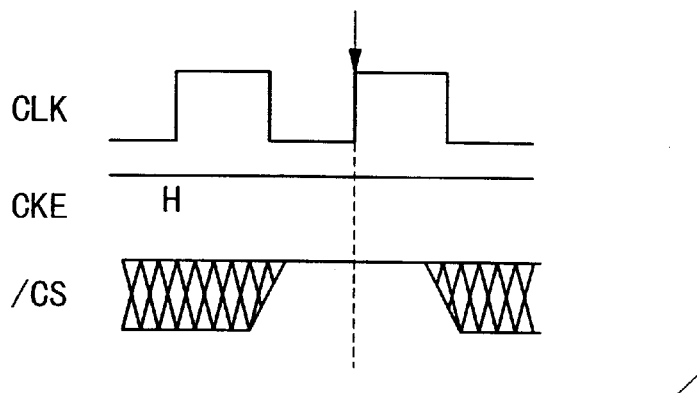
FIG. 18
(1) (1) [MODE REGISTER SETTING (1) COMMAND] OF
    [REGISTER SETTING COMMAND] (A), (B), (C) AND (D)
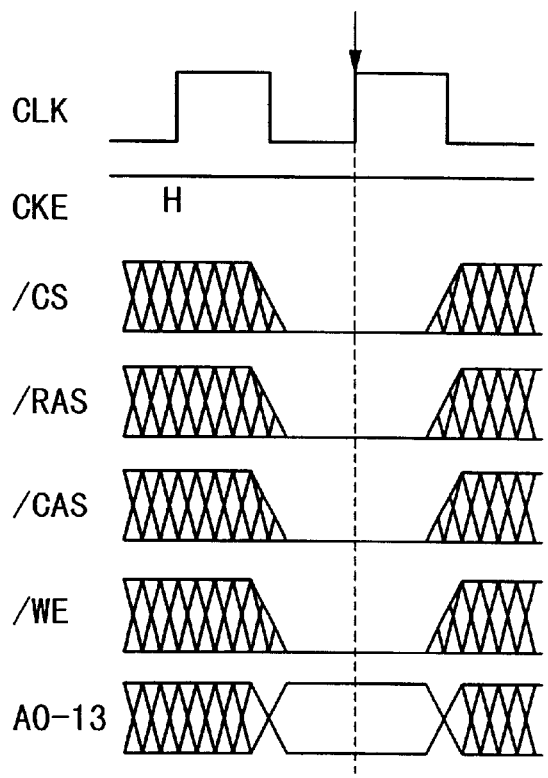

REGISTER SETTING

FIG. 20A

| A13 | A12 | A11 | A10 | A9 | A8 | A7 | A6 | A5 | A4 | A3 | A2 | A1 | A0 | |
|-----|-----|-----|-----|-----|-----|-----|-----|-----|-----|-----|-----|-----|-----|---|
| L | L | L | L | L | L | H | x | x | x | x | x | x | x | REFRESH COUNTER TEST SET (STANDARD TEST SET) |

FIG. 20B

| A13 | A12 | A11 | A10 | A9 | A8 | A7 | A6 | A5 | A4 | A3 | A2 | A1 | A0 | |
|-----|-----|-----|-----|-----|-----|-----|-----|-----|-----|-----|-----|-----|-----|---|
|  |  |  |  |  | H | L |  |  |  |  |  |  |  | UNUSED TEST SET |

FIG. 20C

| A13 | A12 | A11 | A10 | A9 | A8 | A7 | A6 | A5 | A4 | A3 | A2 | A1 | A0 | |
|-----|-----|-----|-----|-----|-----|-----|-----|-----|-----|-----|-----|-----|-----|---|
| x | x | x | x | x | H | H | V | V | V | V | V | V | V | DEVICE TEST SET |

FIG. 20D

| A13 | A12 | A11 | A10 | A9 | A8 | A7 | A6 | A5 | A4 | A3 | A2 | A1 | A0 | |
|-----|-----|-----|-----|-----|-----|-----|-----|-----|-----|-----|-----|-----|-----|---|
| L | L | L | L | L | L | L | V | V | V | V | V | V | V | MODE REGISTER SETTING COMMAND |

H: HIGH LEVEL  L: LOW LEVEL
x: INVALID DATA (DON'T CARE)  V: VALID DATA INPUT

FIG. 21

MODE REGISTER SETTING COMMAND

MODE REGISTER SETTING (1) COMMAND

| A13 | A12 | A11 | A10 | A9 | A8 | A7 | A6 | A5 | A4 | A3 | A2 | A1 | A0 |
|-----|-----|-----|-----|----|----|----|----|----|----|----|----|----|-----|
| L | L | L | L | L | L | L | L | × | × | L | L | L | LATENCY |

| A0 | LAP LATENCY |
|----|-------------|
| L | SEQUENTIAL |
| H | INTERLEAVE |

| A3 | A2 | A1 | CAS LATENCY |
|----|----|----|-------------|
| L | L | L | UNUSE |
| L | L | H | UNUSE |
| L | H | L | 2 |
| L | H | H | UNUSE |
| H | L | L | UNUSE |
| H | L | H | UNUSE |
| H | H | L | UNUSE |
| H | H | H | UNUSE |

MODE REGISTER SETTING (2) COMMAND

CLK2: 
| A13 | A12 | A11 | A10 | A9 | A8 | A7 | A6 | A5 | A4 | A3 | A2 | A1 | A0 |
|-----|-----|-----|-----|----|----|----|----|----|----|----|----|----|-----|
| L | L | L | L | L | L | L | L | H | BURST LENGTH | × | × | × | × |

CLK1:
| A13 | A12 | A11 | A10 | A9 | A8 | A7 | A6 | A5 | A4 | A3 | A2 | A1 | A0 |
|-----|-----|-----|-----|----|----|----|----|----|----|----|----|----|-----|
| L | L | L | L | L | L | L | H | L | UNUSE | SRAM ROW DATA | | | |

| | | BURST LENGTH | |
|---|---|---|---|
| A5 | A4 | A3 | SEQUENTIAL | INTERLEAVE |
| L | L | L | 1 | 1 |
| L | L | H | 2 | 2 |
| L | H | L | 4 | 4 |
| L | H | H | 8 | 8 |
| H | L | L | 16 | 16 |
| H | L | H | UNUSE | UNUSE |
| H | H | L | UNUSE | UNUSE |
| H | H | H | UNUSE | UNUSE |

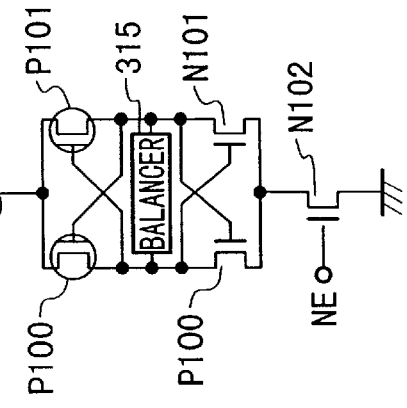
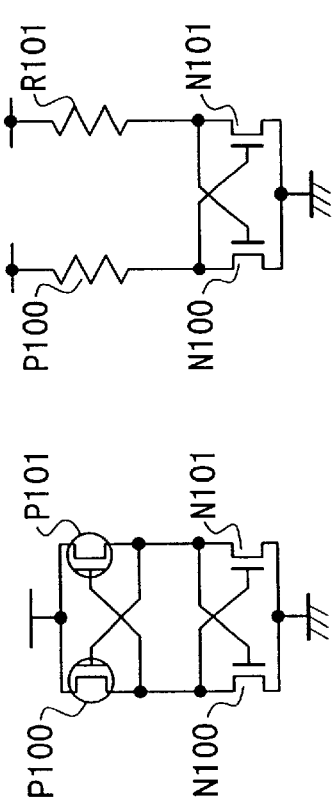
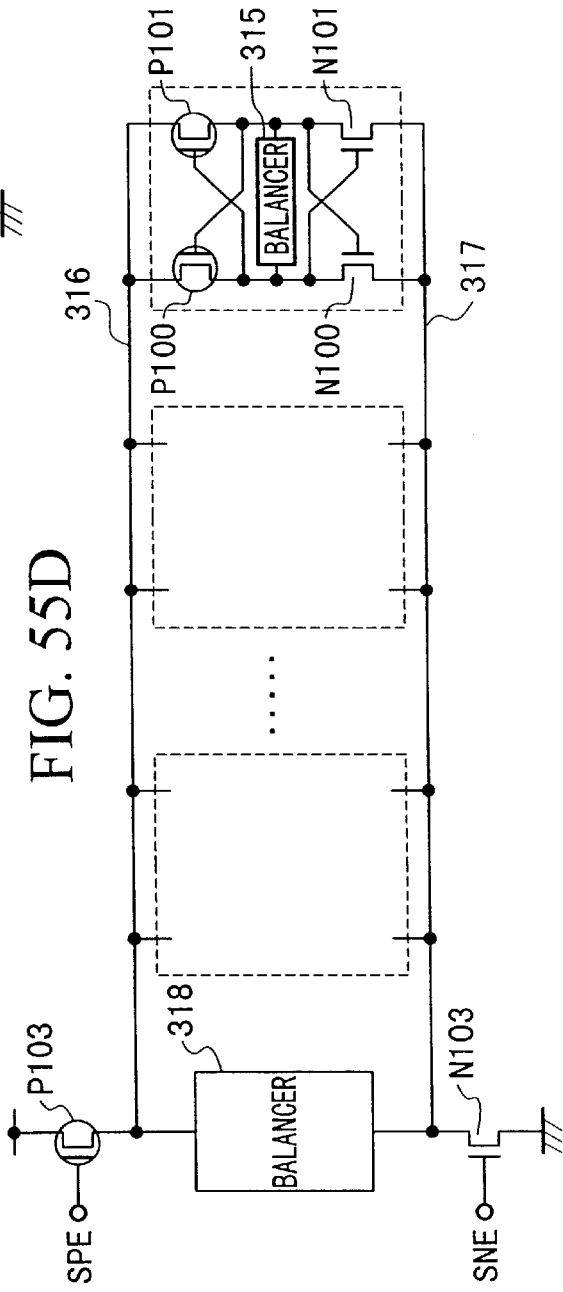
FIG. 55A  FIG. 55B  FIG. 55C  FIG. 55D

FIG. 84

| CMMAND | CKE | | CS | RAS | CAS | WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|
| | n-1 | n | | | | | | | | | | | | | | | | | | |
| READ (3) | H | × | L | H | L | H | BURST LENGTH SELECTION | | | SRAM COLUMN SELECTION | | | | | | | SRAM ROW SELECTION | | | |
| WRITE (3) | H | × | L | H | L | H | BURST LENGTH SELECTION | | | SRAM COLUMN SELECTION | | | | | | | SRAM ROW SELECTION | | | |

SEMICONDUCTOR INTEGRATED CIRCUIT DEVICE

BACKGROUND OF THE INVENTION

1. Field of the Invention

The present invention relates to a semiconductor integrated circuit device, namely a semiconductor integrated circuit device which has a main storage portion, and an auxiliary storage portion functioning as a cache memory, formed on the same semiconductor substrate, and a data transfer circuit between the main storage portion and the auxiliary storage portion. In particular the invention relates to a redundant configuration for saving defects of the auxiliary storage portion.

2. Description of the Related Art

In general, a relatively low speed low cost and large capacity semiconductor device is used as the main storage device used in a computer system. As a device which meets these requirements, a general purpose DRAM is generally used.

Moreover, with recent computer systems speeding up of the DRAM constituting the main storage portion has resulted to meet the higher speed of systems (in particular the higher speed of the MPU). However this is found to be insufficient to meet the higher speed of the MPU, and the main trend is for a system where a high speed memory is mounted as an auxiliary storage portion between the MPU and the main storage portion. Such an auxiliary storage portion is generally referred to as a cache memory, and uses for example a high speed SRAM, or a EDRAM.

As a mounting configuration for a cache memory, in general there is a configuration where this is mounted outside of the MPU, or a configuration where this is built into the MPU. Recently however a semiconductor memory device where a DRAM constituting the main storage portion, and a cache memory are mounted on the same semiconductor substrate, is gaining attention. As this conventional technology, there is for example Japanese Patent Application, First Publication Nos. Sho. 57-20983, 60-7690, 62-38590, and Japanese Patent Application, First Publication No. Hei. 1-146187. With the semiconductor memory devices of this prior art, the DRAM and the cache memory are mounted on the same substrate and hence overall this is referred to as a cache DRAM. Moreover this is also described as a CDRAM. These give a configuration where data can be transferred both ways between a SCRAM which functions as a cache memory, and the DRAM which constitutes the main storage portion.

In these prior arts, there are problems such as a delay in the operation of the data transfer at the time of a cache mis hit, and hence an improved technology is proposed. For the improved conventional technology there is the following. For example with the technology related to Japanese Patent Application, First Publication Nos. Hei. 4-252486, 4-318389, and 5-2872, a feature is that a latch or a register function is provided in a two way data transfer circuit for performing data transfer between a DRAM portion and a SCRAM portion, so that data transfer from the SCRAM portion to the DRAM portion, and data transfer from the DRAM portion to the SCRAM portion can be performed simultaneously. Hence data transfer at the time of a cache mis hit, (copy back) can be speeded up.

However, in the above-mentioned conventional technology, the occupied area of the two way transfer gate circuit becomes large so that the number of circuits which can be installed is limited. As a result the number of transfer bus lines is also limited. Therefore, the number of bits which can be transferred at a time between the DRAM array and the SCRAM array is limited to 16 bits. In general, the smaller the number of bits which can be transferred at a time, the lower the cache hit ratio.

Furthermore, recently, there is a problem of a drop in the cache hit ratio for the case where an access request is received from a plurality of processing units as shown in FIG. 86. In the case where an access request is received from a plurality of processing units (memory masters), the requesting of addresses of different sets (rows) increases. In this case, if the abovementioned CDRAM or EDRAM is used for the main memory of FIG. 86, then the cache hit ratio drops, and the speeding up of the overall system is limited. With the increase of systems having this plurality of processing units (memory masters), then the memory portion also, rather than being the conventional device which corresponds mainly to one type of access request, must be one which can correspond to multiple types of access requests.

Furthermore, with recent miniaturization, the frequency of the occurrence of defects in the memory cell region increases. Therefore, with a DRAM portion constituting a main storage portion of large storage capacity, it is common to provide a redundant circuit for saving defective bits. However, even if the defective bits of the main storage portion are saved, if defects in the auxiliary storage portion which functions as a cache memory cannot be saved, then the defect saving in the main storage portion is in vain, Moreover, with the speeding up of read speed, it is necessary to avoid reduction in the read speed accompanying defect saving.

SUMMARY OF THE INVENTION

The present invention addresses the abovementioned situation with the object of providing a semiconductor integrated circuit device which can quickly deal with an access request from a plurality of memory masters without a drop in cache hit ratio, and which can save defects of an auxiliary memory portion functioning as a cache memory without an accompanying drop in read speed.

In order to solve the abovementioned problems, the present invention has the following configuration.

That is to say, the semiconductor integrated circuit device of the present invention according to a first aspect has a main storage portion (for example a component corresponding to a later mentioned DRAM portion 101), and an auxiliary storage portion (for example a component corresponding to a later mentioned SRAM portion 102) functioning as a cache memory, and is constructed such that two way data transfer is possible between the main storage portion and the auxiliary storage portion, and the auxiliary storage portion is provided with, a normal memory cell array (for example a component corresponding to a later mentioned common SRAM array MA) with memory cells which are alternatively selected based on a selection signal, arranged in matrix form, and a redundant memory cell array (for example a component corresponding to a later mentioned redundant SCRAM array MAR) provided adjacent to the memory cell array with the position of rows matching, and with redundant memory cells which are alternatively selected based on a redundant selection signal, arranged in matrix form, and a plurality of auxiliary data lines (for example components corresponding to later mentioned redundant data input/output lines SIOR, and normal data input/output lines SIO) to which memory cell groups of each row are connected are separately provided in the normal memory cell array and the redundant memory cell array.

Moreover, the semiconductor integrated circuit device of the present invention according to a second aspect has a main storage portion (for example a component corresponding to a later mentioned DRAM portion 101), and an auxiliary storage portion for example a component corresponding to a later mentioned SRAM portion 102) functioning as a cache memory, and is constructed such that two way data transfer is possible between the main storage portion and the auxiliary storage portion, and the auxiliary storage portion is provided with, a memory cell array (for example a component corresponding to a later mentioned common SRAM array MA) with memory cells which are alternatively selected based on a selection signal (for example an element corresponding to a later mentioned read/write SRAM row selection signal and SRAM column selection signal), arranged in matrix form, a plurality of auxiliary data lines (for example components corresponding to later mentioned common data input/output lines SIO) provided along rows of the memory cell array, to which memory cell groups belonging to each row of the memory cell array are connected, a plurality of switch circuits (for example components corresponding to later described normal data input/output line connection circuits 155, 1550) respectively provided in the plurality of auxiliary data lines, and alternatively conducting controlled based on a predetermined address signal, and a main data line (for example a component corresponding to a later described normal global data input/output line GIO) provided along columns of the memory cell array, and connected to the plurality of auxiliary data lines via the plurality of switching circuits; wherein this is provided a redundant memory cell array (for example a component corresponding to a later mentioned redundant SCRAM array MAR) provided so as to be adjacent to the memory cell array with the position of rows matching, and with redundant memory cells which are alternatively selected based on a redundant selection signal (for example an element corresponding to a later mentioned redundant read/write SRAM row selection signal and redundant SRAM column selection signal), arranged in matrix form, a plurality of redundant auxiliary data lines (for example components corresponding to later mentioned redundant data input/output lines SIOR) provided along rows of the redundant memory cell arrays, to which redundant memory cell groups belonging to each row of the redundant memory cell array are connected, a plurality of redundant switch circuits (for example components corresponding to later described redundant data input/output line connection circuits 155R, 1550R) respectively provided in the plurality of redundant auxiliary data lines, and alternatively conducting controlled based on a predetermined redundant address signal, and a redundant main data line (for example a component corresponding to a later described redundant global data input/output line GIOR) provided along columns of the redundant memory cell array, and connected to the plurality of redundant auxiliary data lines via the plurality of redundant switching circuits:

Furthermore, the semiconductor integrated circuit device of the present invention according to a third aspect is characterized in that the main data line and the redundant main data line are ranged so as to have the memory cell array and the redundant memory cell array therebetween.

Moreover, the semiconductor integrated circuit device of the present invention according to a fourth aspect is characterized in that the main data line and the redundant main data line are arranged between the memory cell array and the redundant memory cell array.

In addition, the semiconductor integrated circuit device of the present invention according to a fifth aspect is characterized in that the main data line and the redundant main data line are arranged between the memory cell array and the redundant memory cell array and share each other.

Moreover, the semiconductor integrated circuit device of the present invention according to a sixth aspect of the present invention has a main storage portion, and an auxiliary storage portion functioning as a cache memory, constructed such that two way data transfer is possible between the main storage portion and the auxiliary storage portion, and is characterized in that memory cell groups of the main storage portion and the auxiliary storage portion are simultaneously replaced by redundant memory cell groups, with the memory cell group of the main storage portion and the memory cell group of the auxiliary storage portion which are common with the data line for performing the data transfer as a unit.

Figure 1:
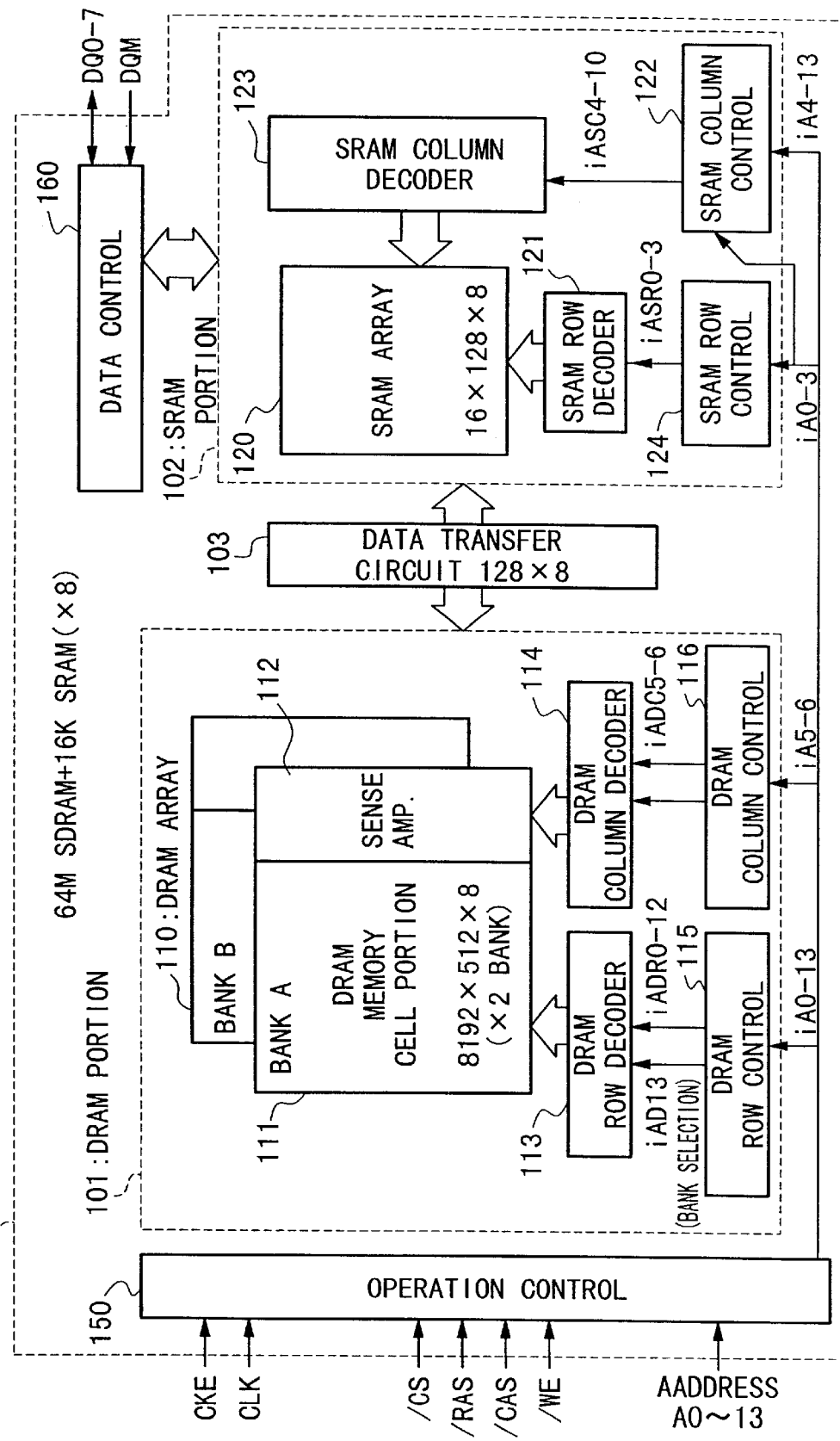
FIG. 1 is a block diagram showing an overall configuration of a semiconductor memo device according to a first embodiment of the present invention.

FIG, 4 is a layout drawing of external terminals of the semiconductor memory device shown in FIG. 1.

FIG. 5 is a correspondence diagram of various commands for determining operating functions and the conditions of external terminals, in the semiconductor memory device shown in FIG. 1.

Figure 6:
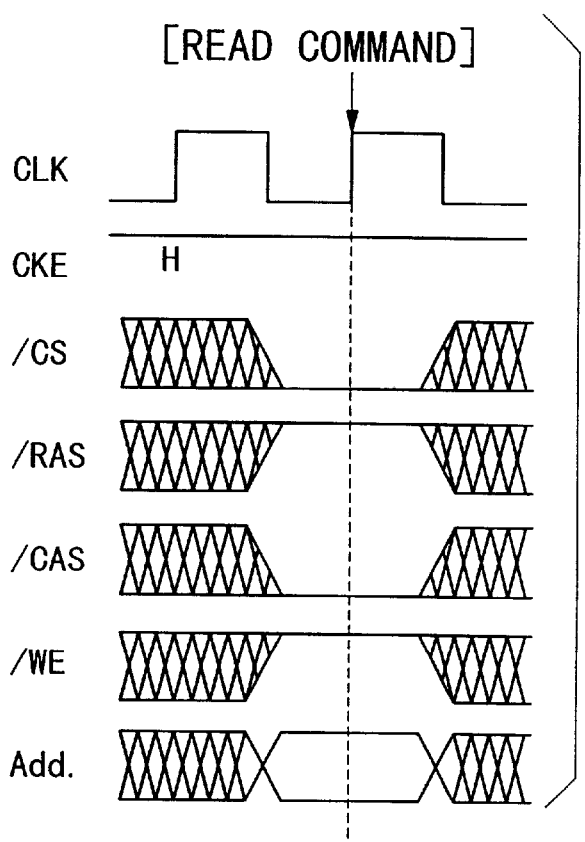

FIG. 6 is a diagram of conditions of the external terminals, showing a read command of FIG. 5.

Figure 7:
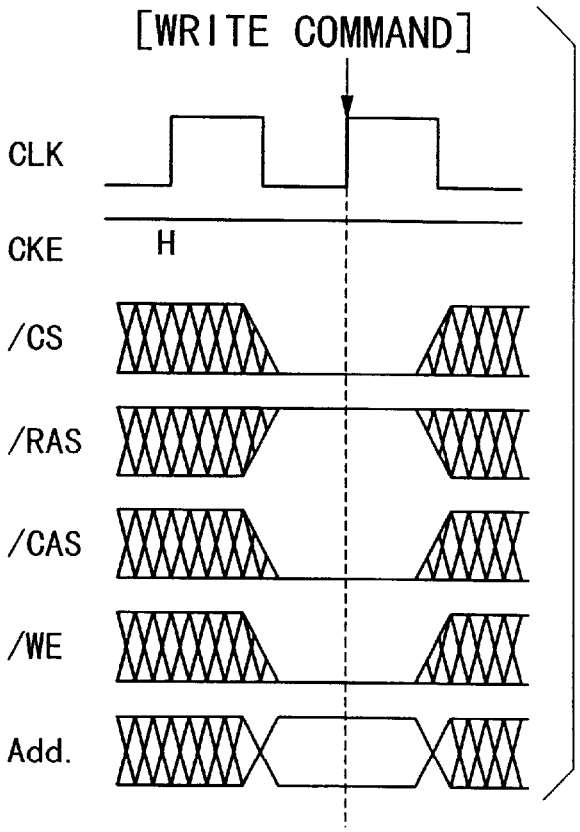

FIG. 7 is a diagram of conditions of the external terminals, showing a write command of FIG. 5.

Figure 8:
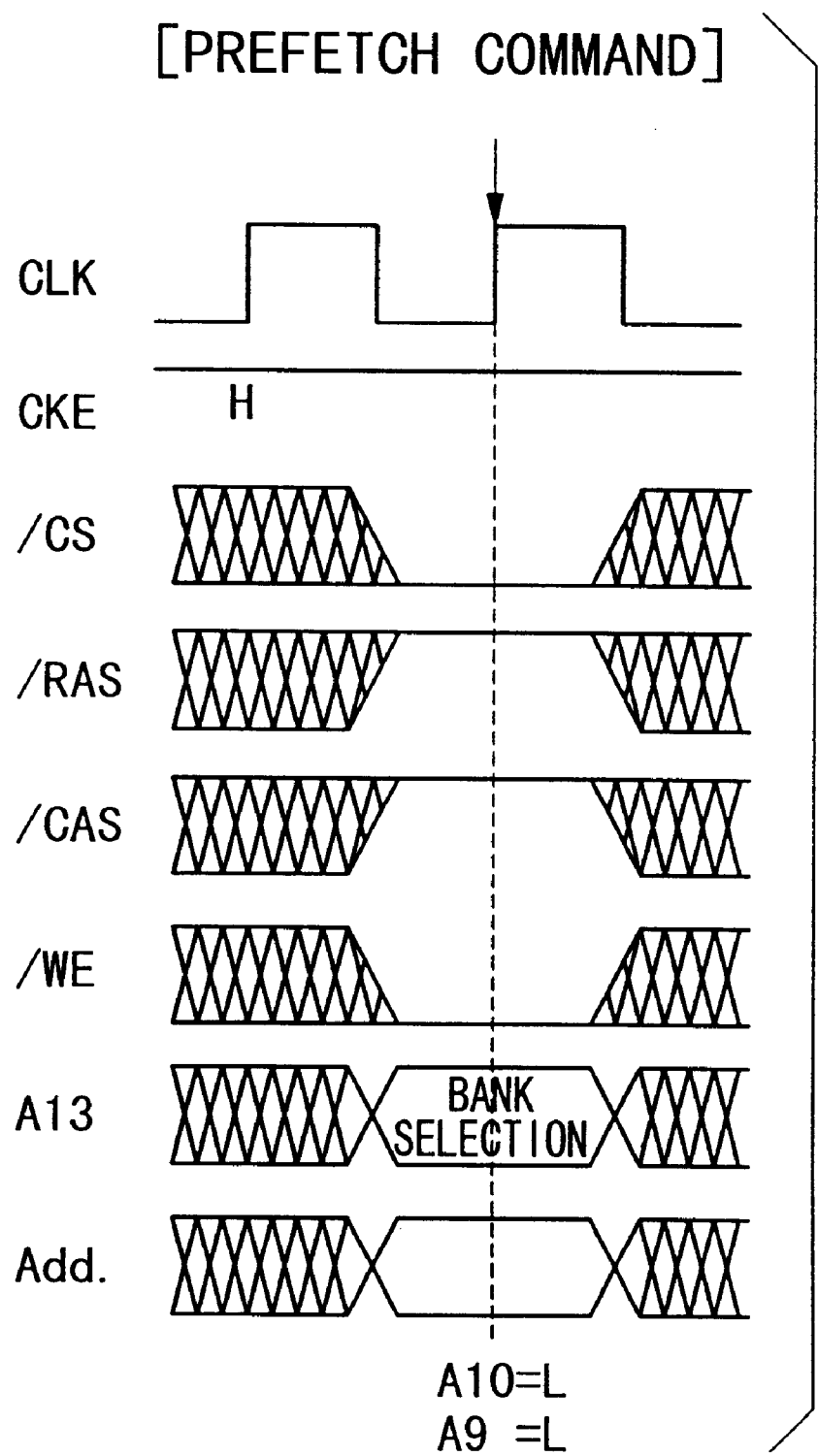

FIG. 8 is a diagram of conditions of the external terminals, showing a prefetch command of FIG. 5.

Figure 9:
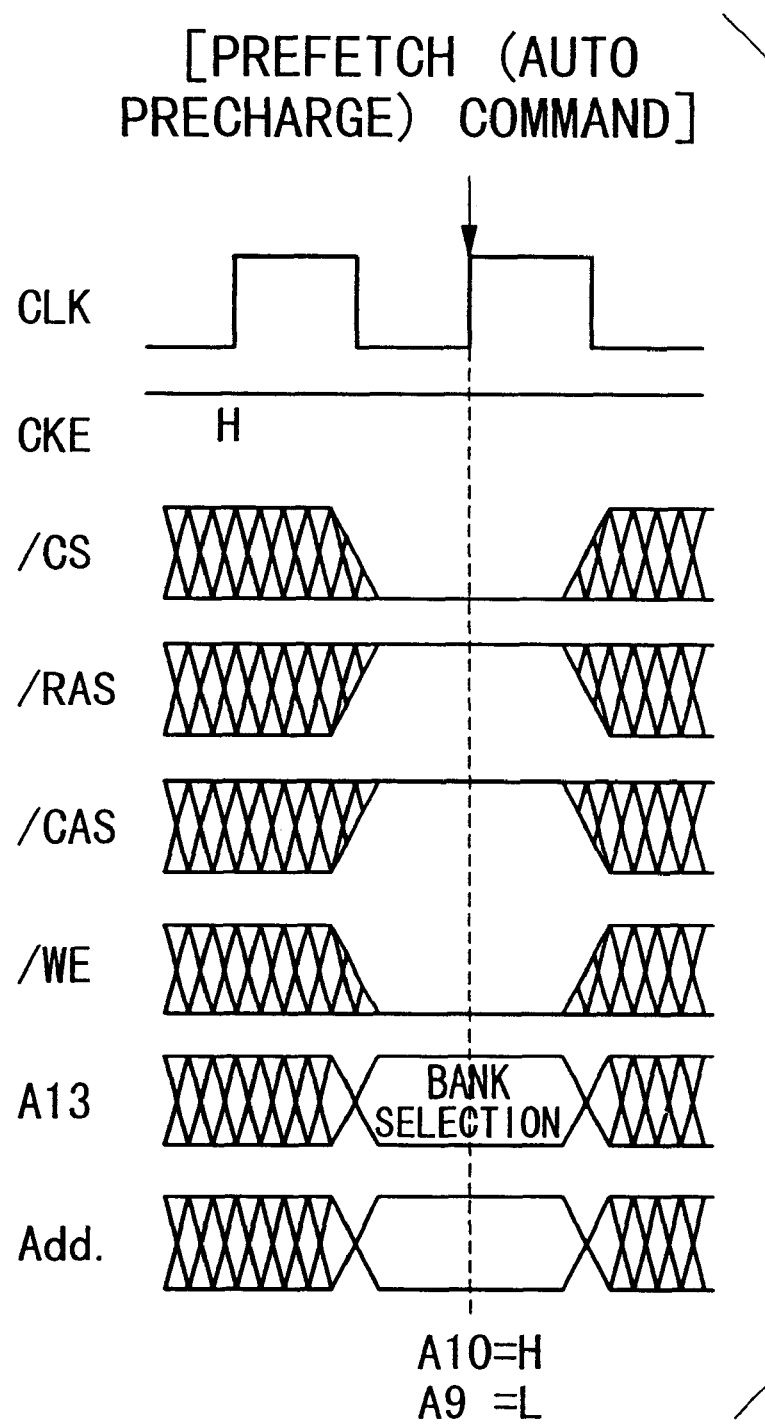

FIG. 9 is a diagram of conditions of external terminals, showing a precheck command which accompanies an auto precheck of FIG. 5.

Figure 10:
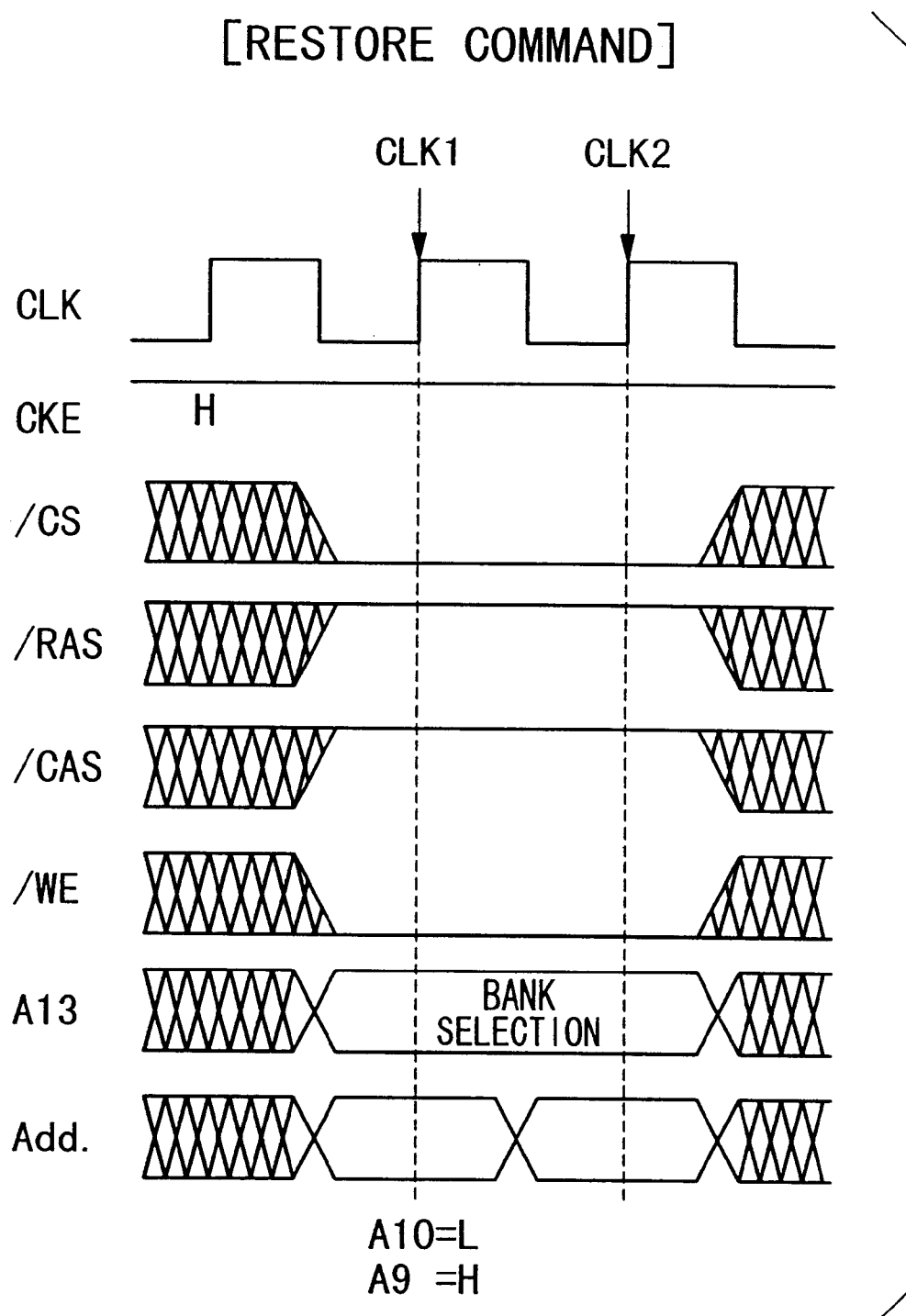

FIG.10 is a diagram of conditions of external terminals, showing a restore command of FIG. 5.

Figure 11:
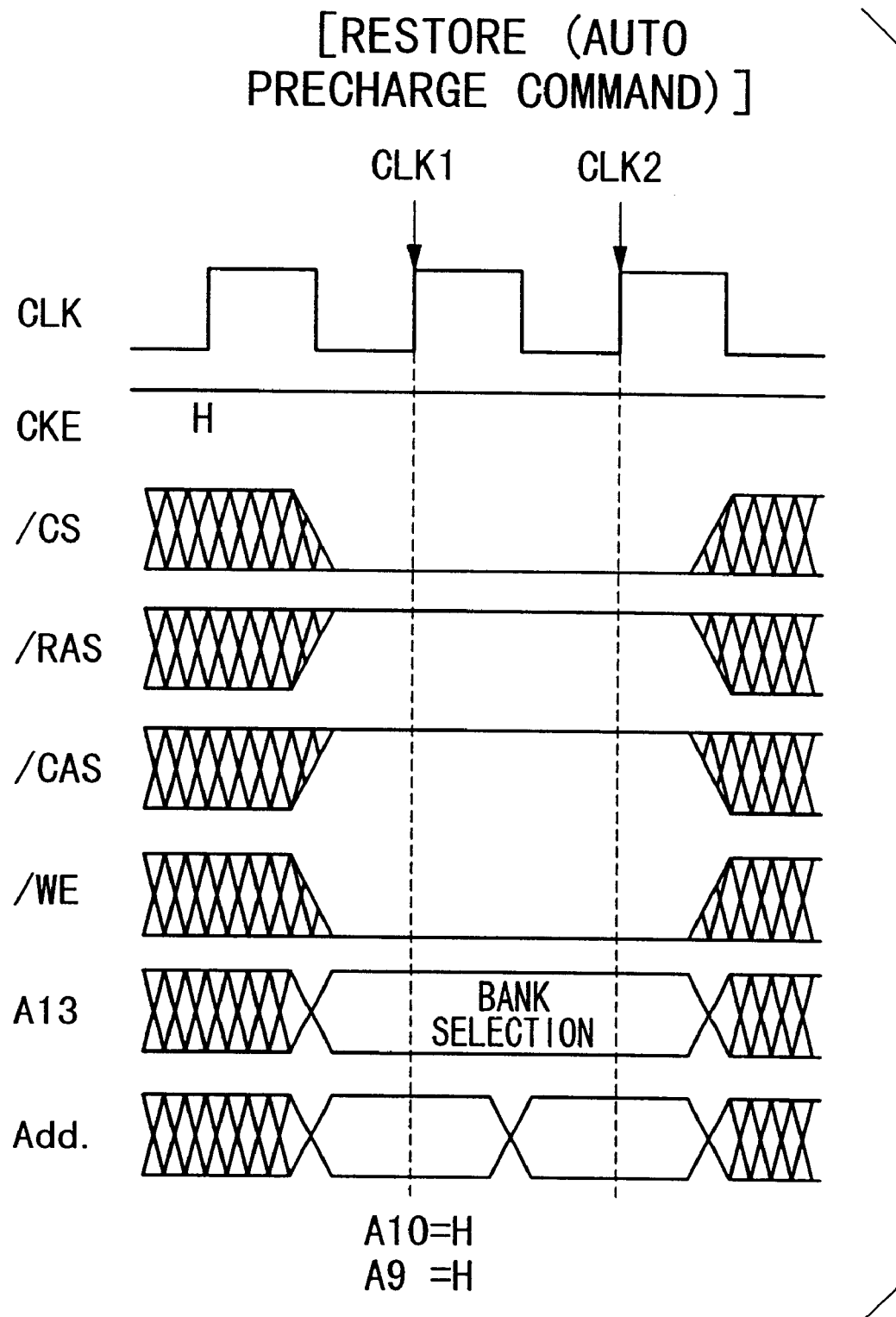

FIG. 11 is a diagram of conditions of external terminals, showing a restore command which accompanies the auto precheck of FIG. 5.

Figure 12:
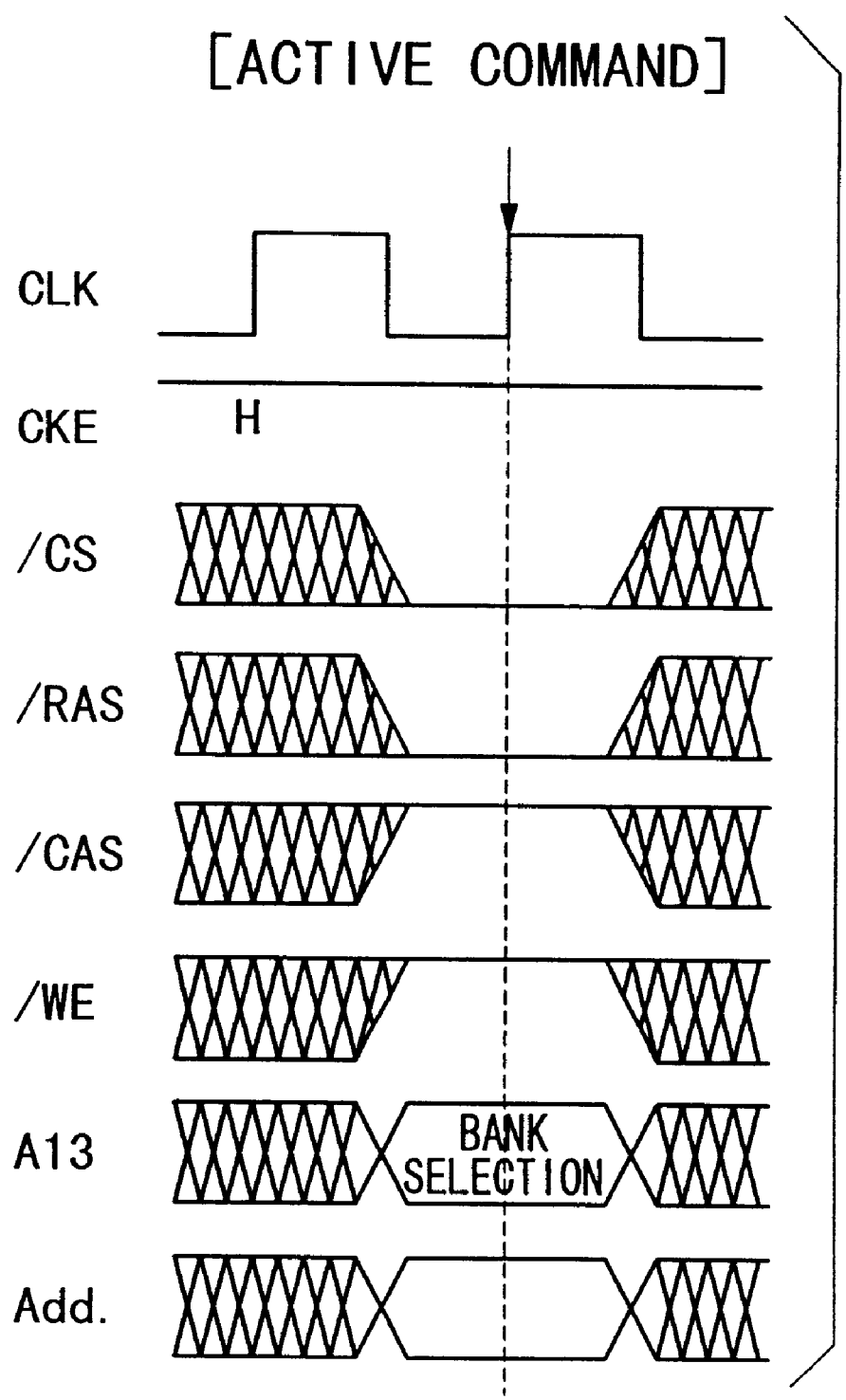

FIG. 12 is a diagram of conditions of external terminals, showing an active command of FIG. 5.

Figure 13:
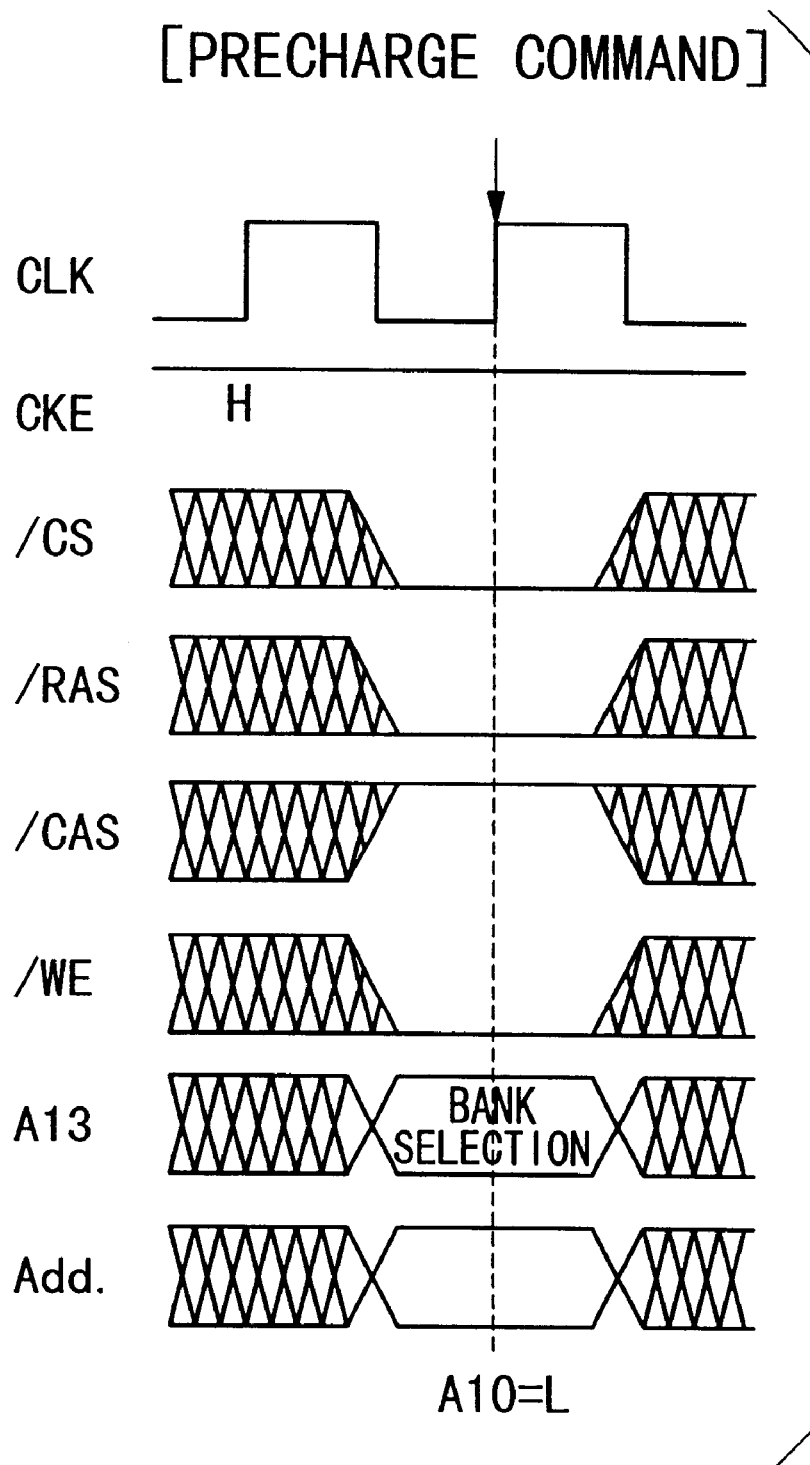

FIG. 13 is a diagram of conditions of external terminals, showing a precheck command of FIG. 5.

Figure 14:
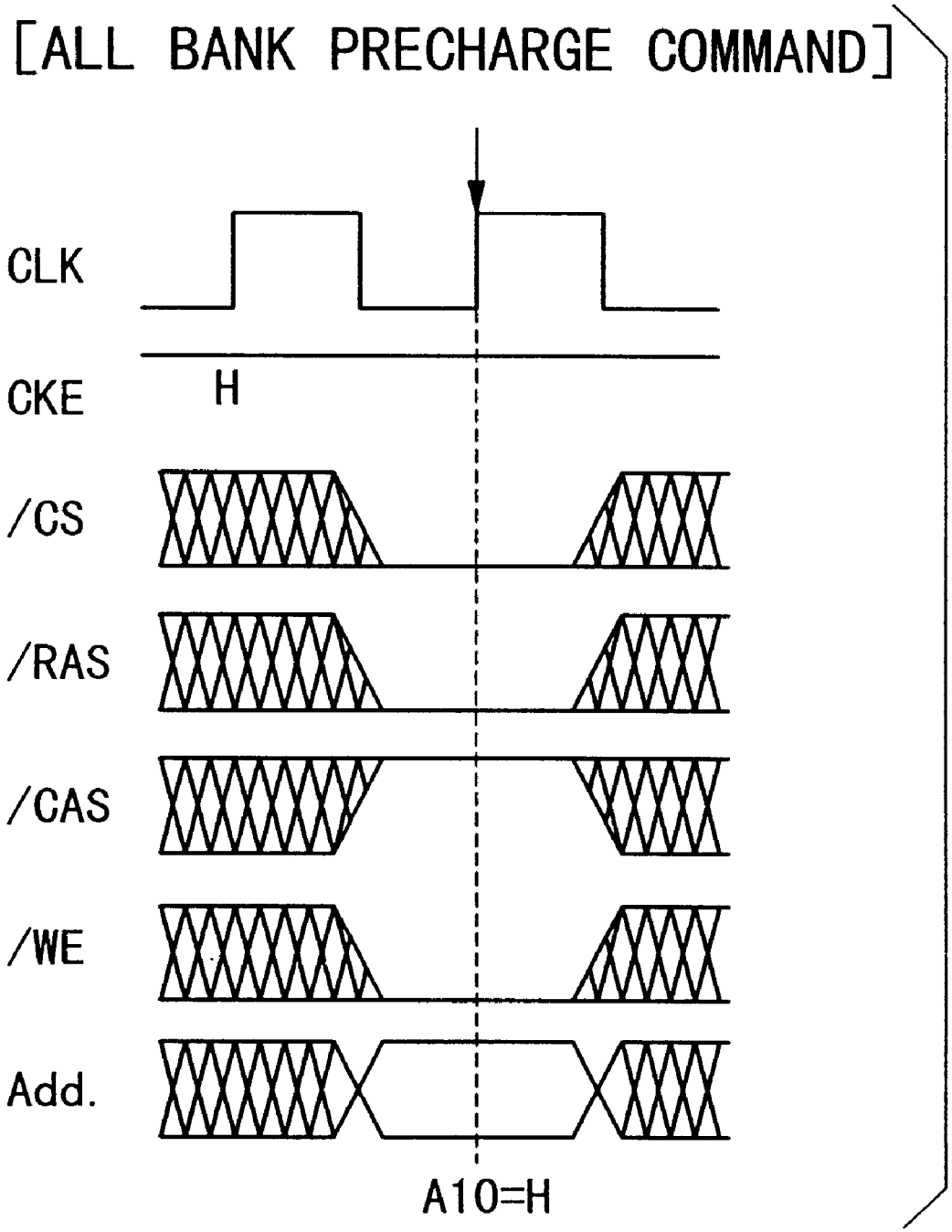

FIG. 14 is a diagram of conditions of external terminals, showing an overall bank precheck command of FIG. 5.

FIG. 15 is a diagram of conditions of external terminals, showing a CBR refresh command of FIG. 5.

FIG. 16 is a diagram of conditions of external terminals, showing an incomplete operation command of FIG. 5.

FIG. 17 is a diagram of conditions of external terminals, showing a device non-selection command of FIG. 5.

FIG. 18 is a diagram of conditions of external terminals, showing a register setting command (1) of FIG. 5.

Figure 19:
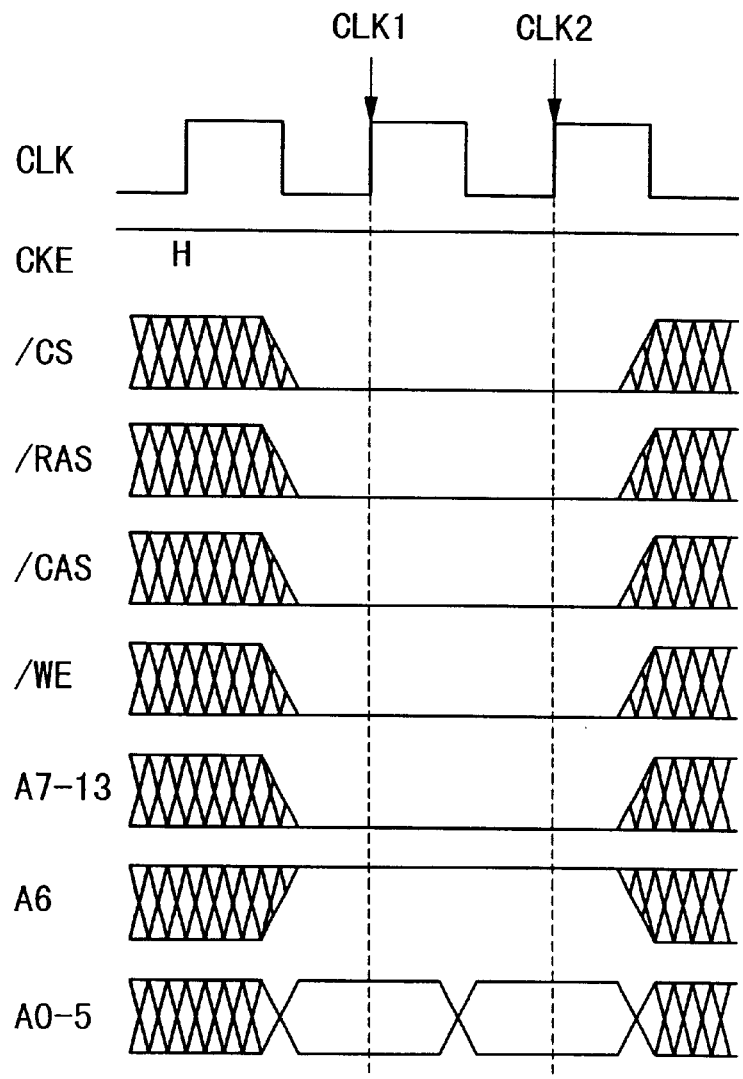

FIG. 19 is a diagram of conditions of external terminals, showing a register setting command (2) of FIG. 5.

FIGS. 20(A) to 20(D) is a detailed diagram of conditions of external terminals, showing a register setting command of FIG. 5.

FIG. 21 is a detailed diagram of conditions of external terminals showing a mode resistor setting command, being a part of the register setting command of FIG. 5.

Figure 22:
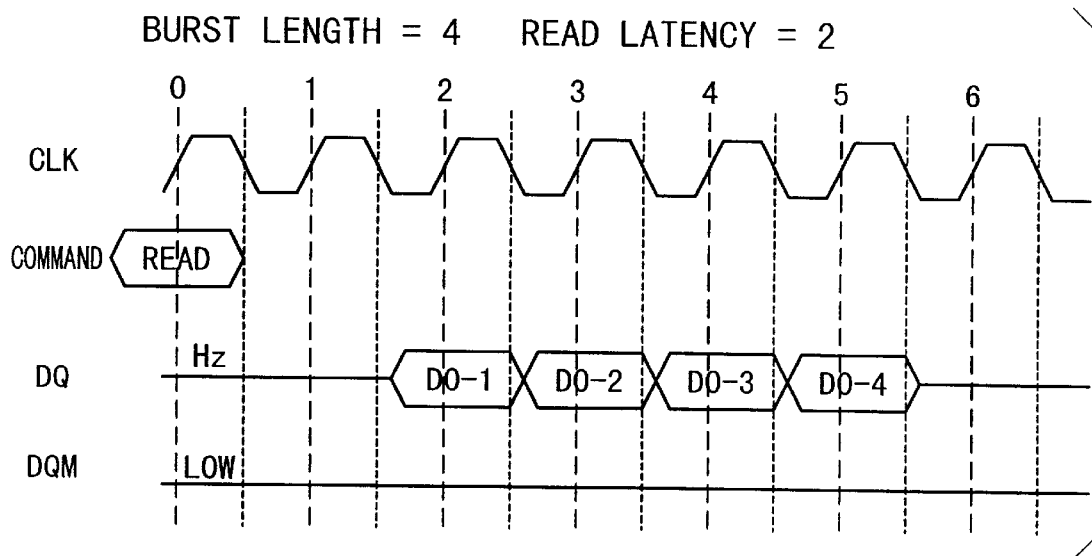

FIG. 22 is a diagram of the sequence of addresses which receive access corresponding to respective lap types and burst lengths of the data input/output format.

Figure 23:
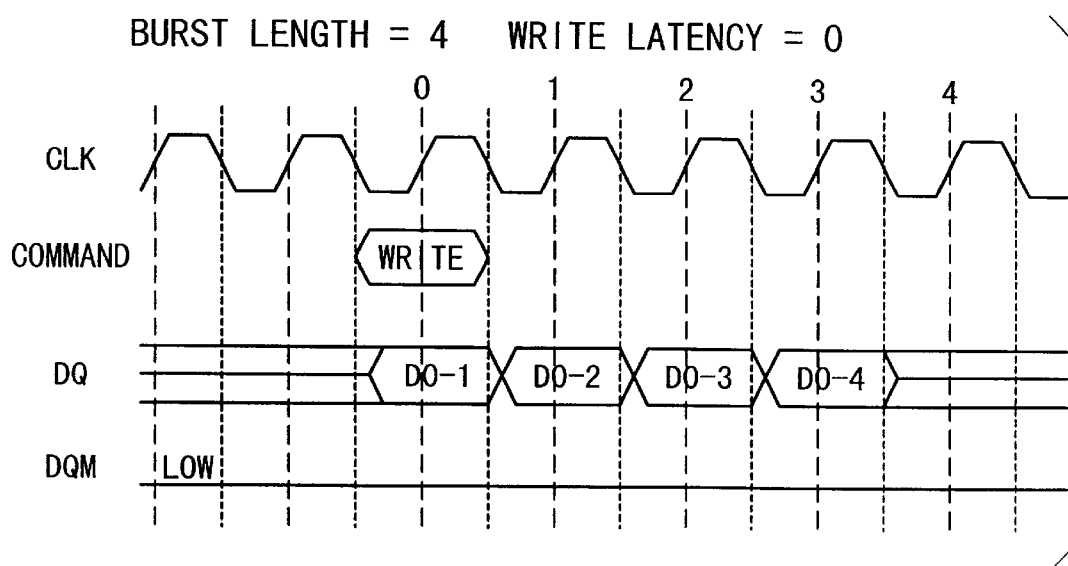

FIG. 23 is a diagram of data output timing for burst length 4 and read latency 2, at the time of read command input.

Figure 24:
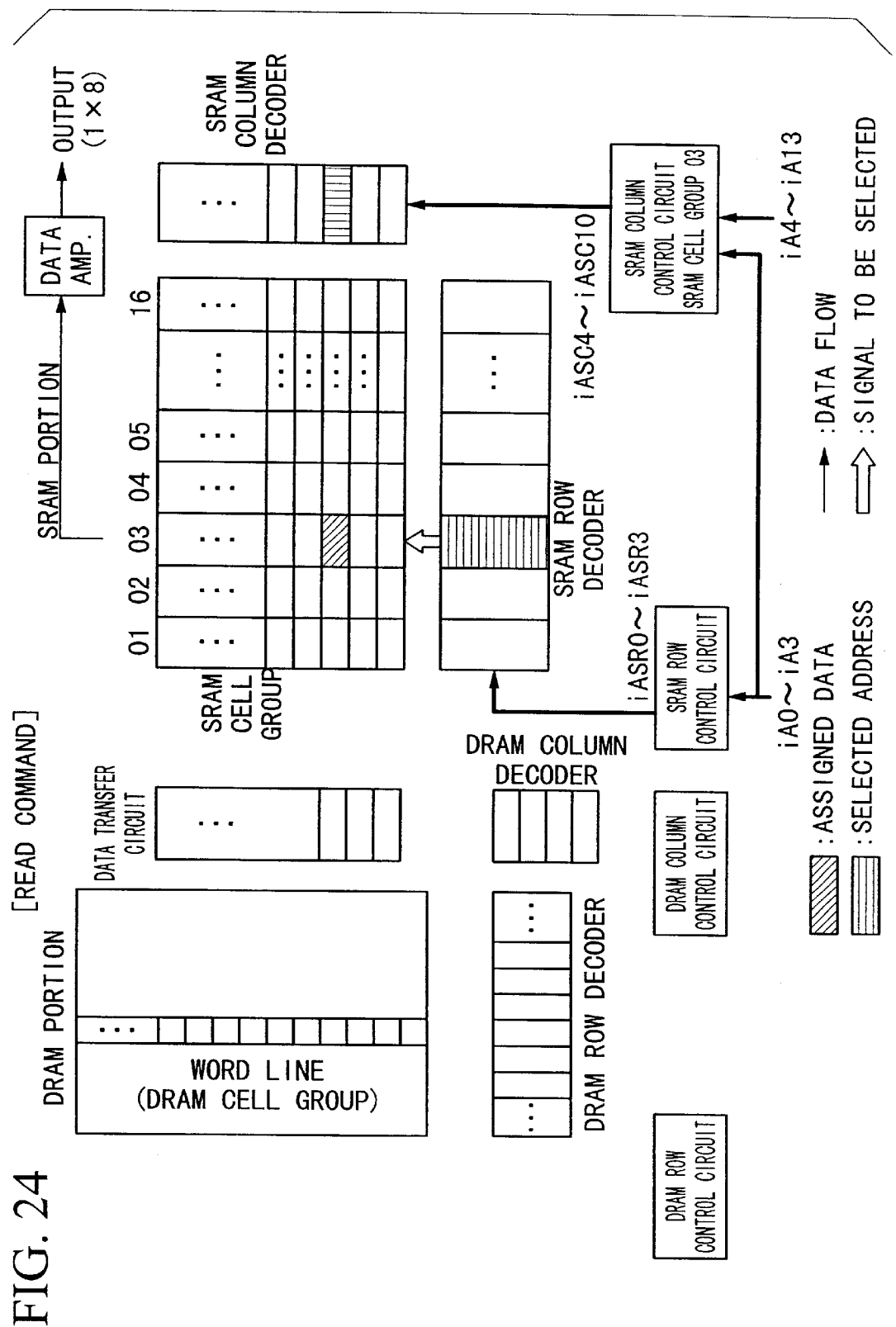

FIG. 24 is a diagram showing address specification and data flow at the time of read command operation.

Figure 25:
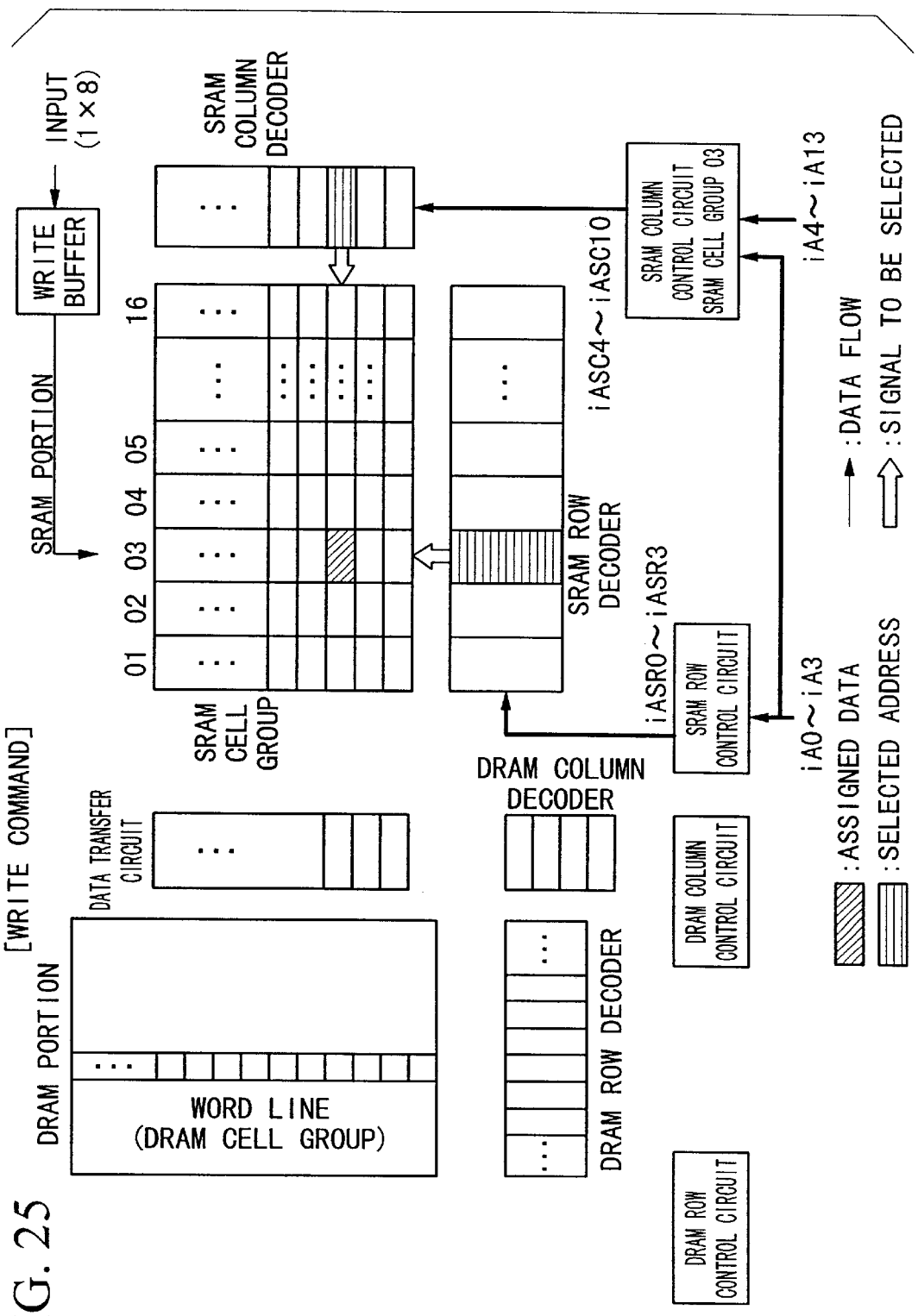

FIG. 25 is a diagram showing address specification and data flow at the time of write command operation.

Figure 26:
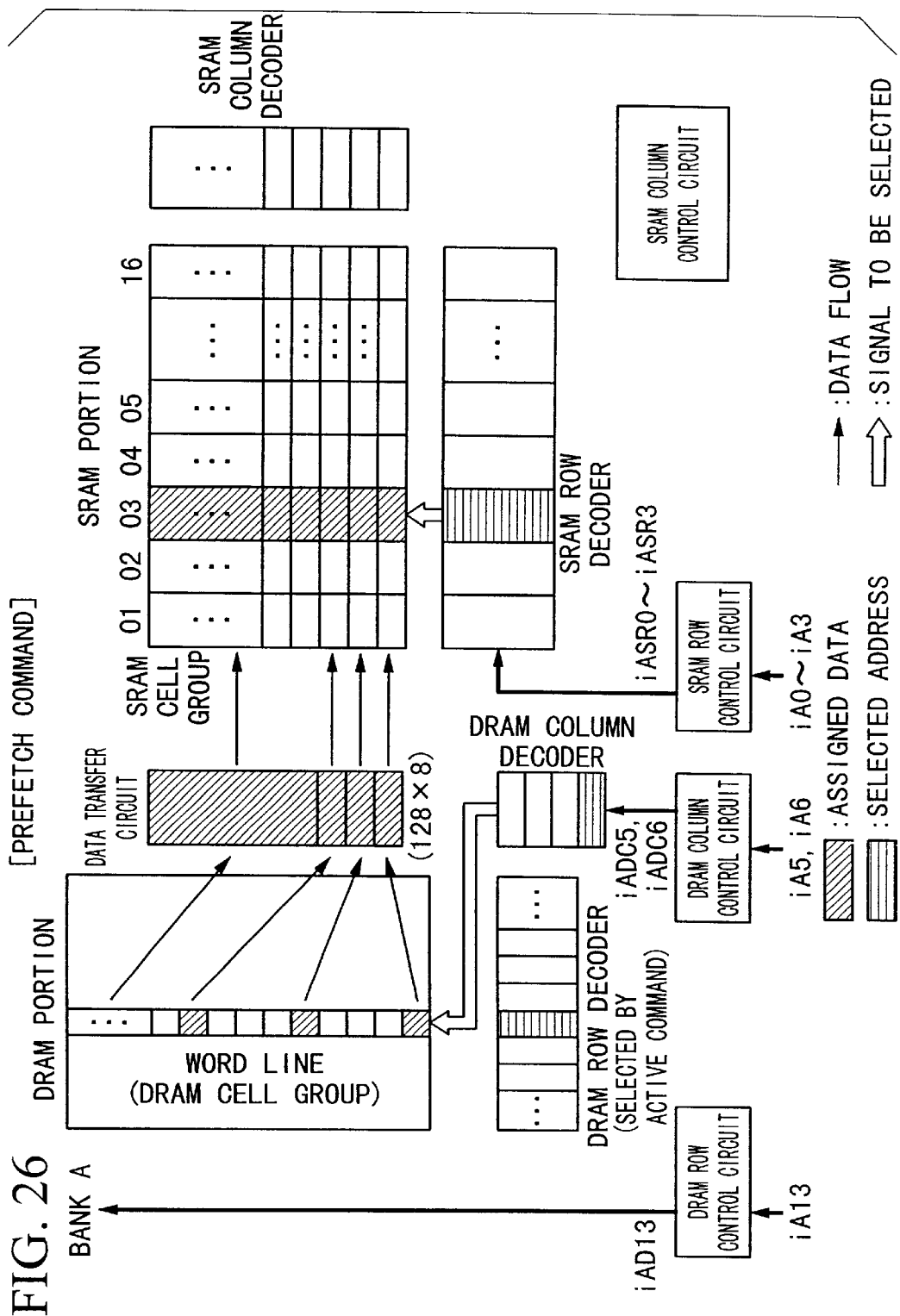

FIG. 26 is a diagram showing address specification and data flow at the time of prefetch command operation.

Figure 27:
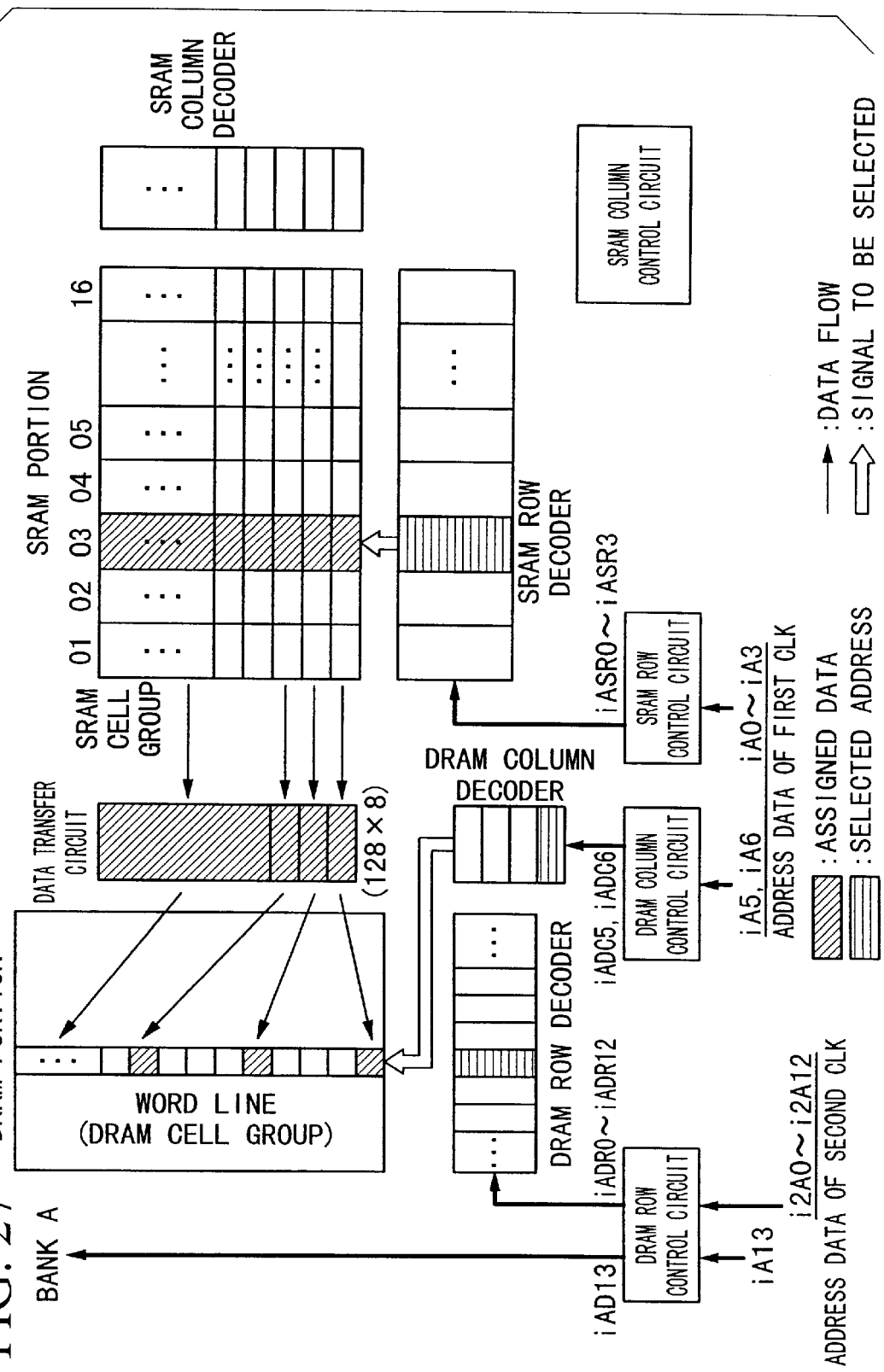

FIG. 27 is a diagram showing address specification and data flow at the time of restore command operation.

Figure 28:
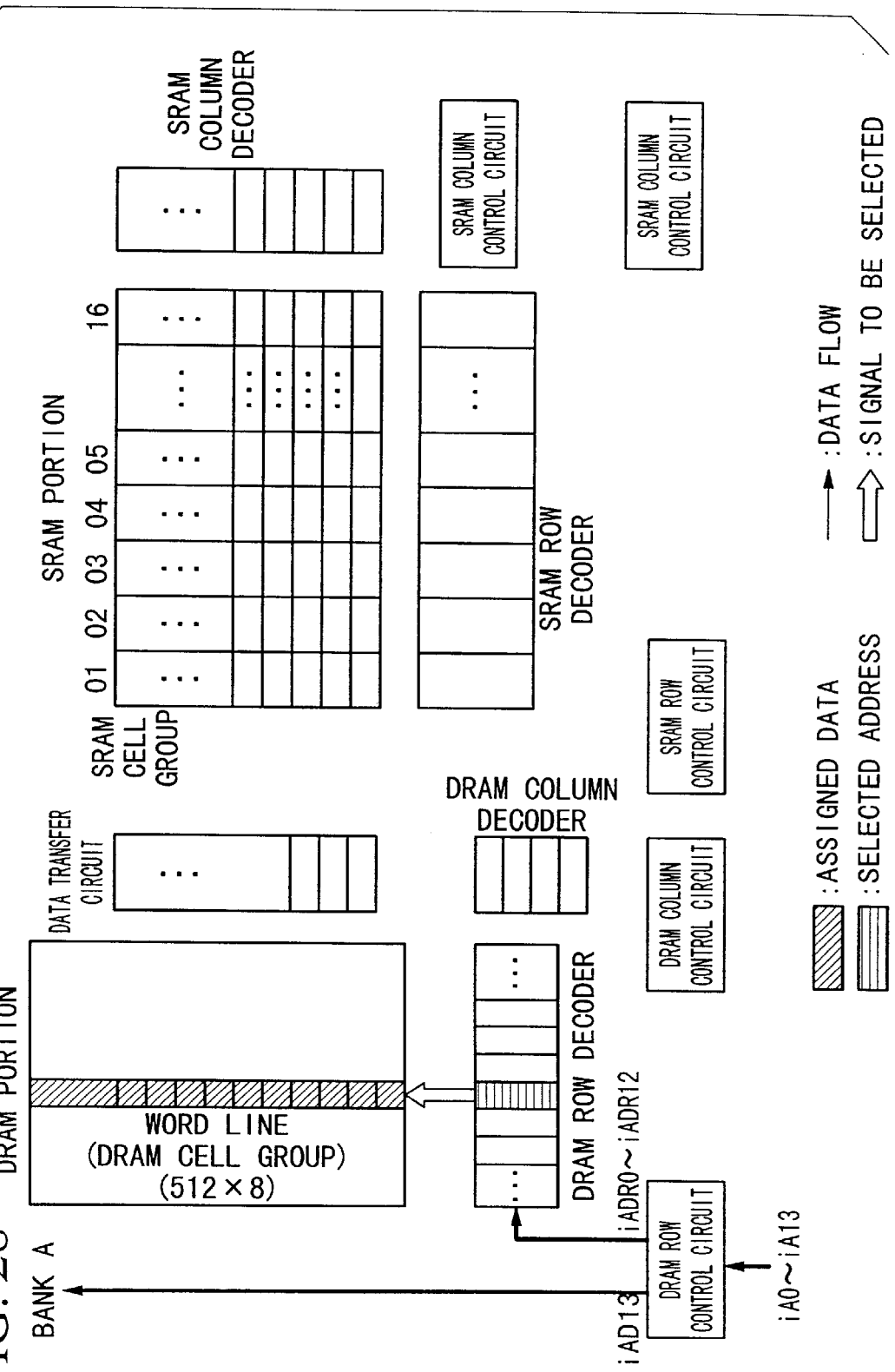

FIG. 28 is a diagram showing address specification and data flow at the time of active command operation.

Figure 29:
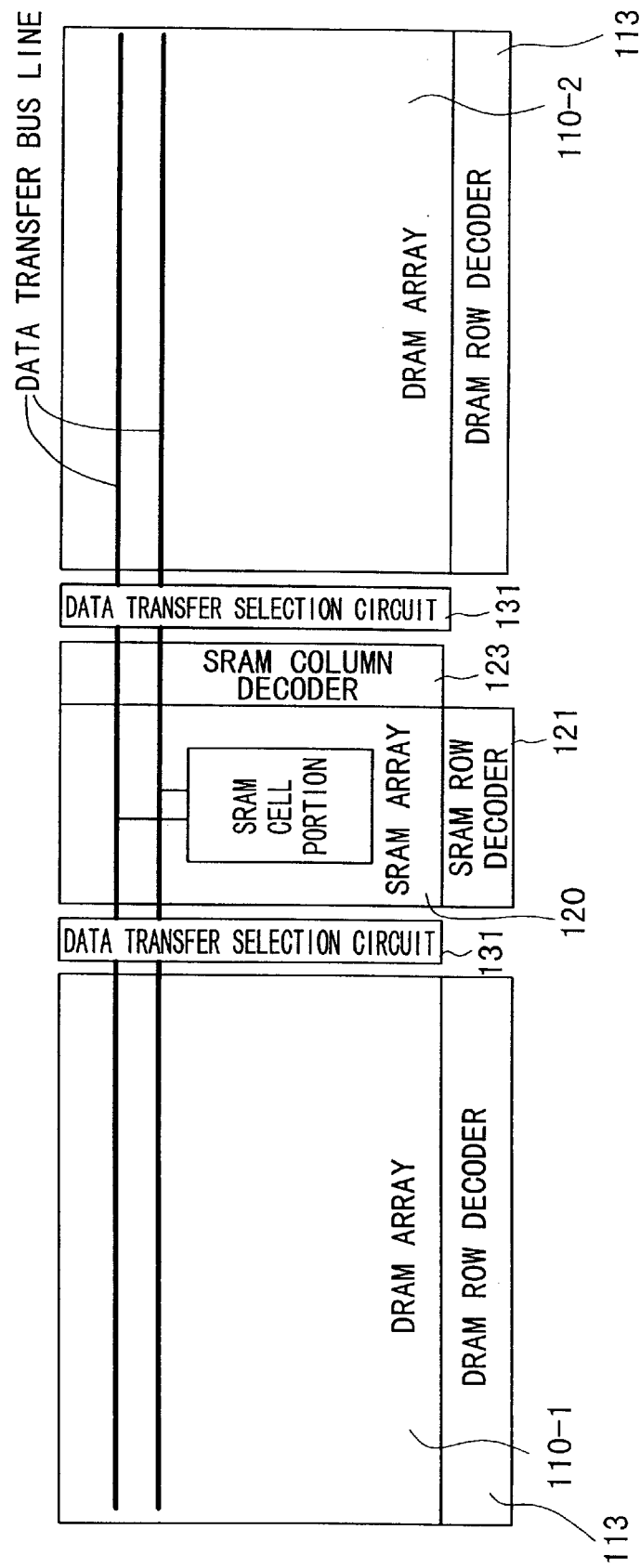

FIG. 29 is an array layout diagram schematically showing an array arrangement for the semiconductor memory device according to a first embodiment of the invention.

Figure 30:
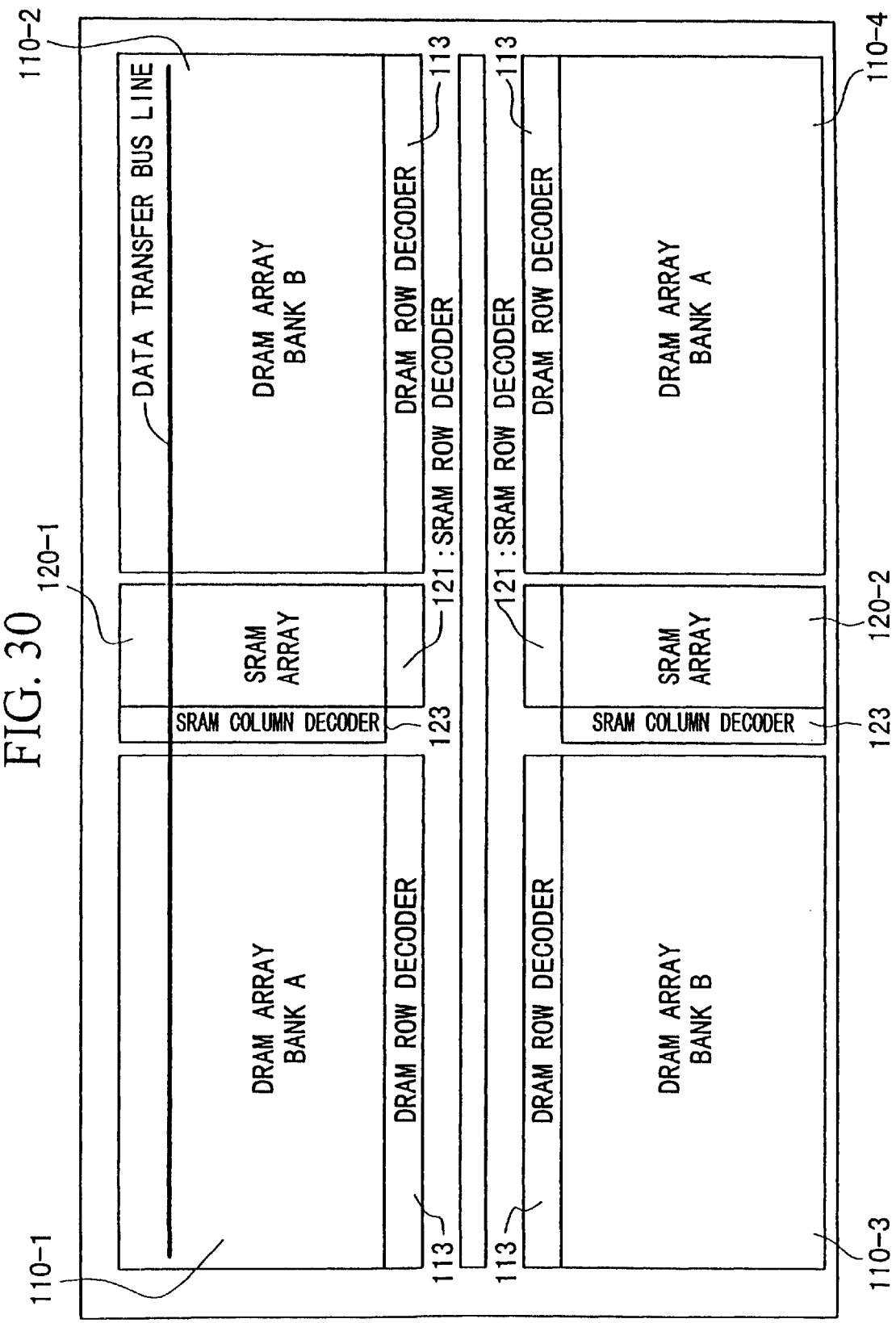

FIG. 30 is a diagram schematically showing an overall layout of a chip of the semiconductor memory device according to the first embodiment of the invention.

Figure 31:
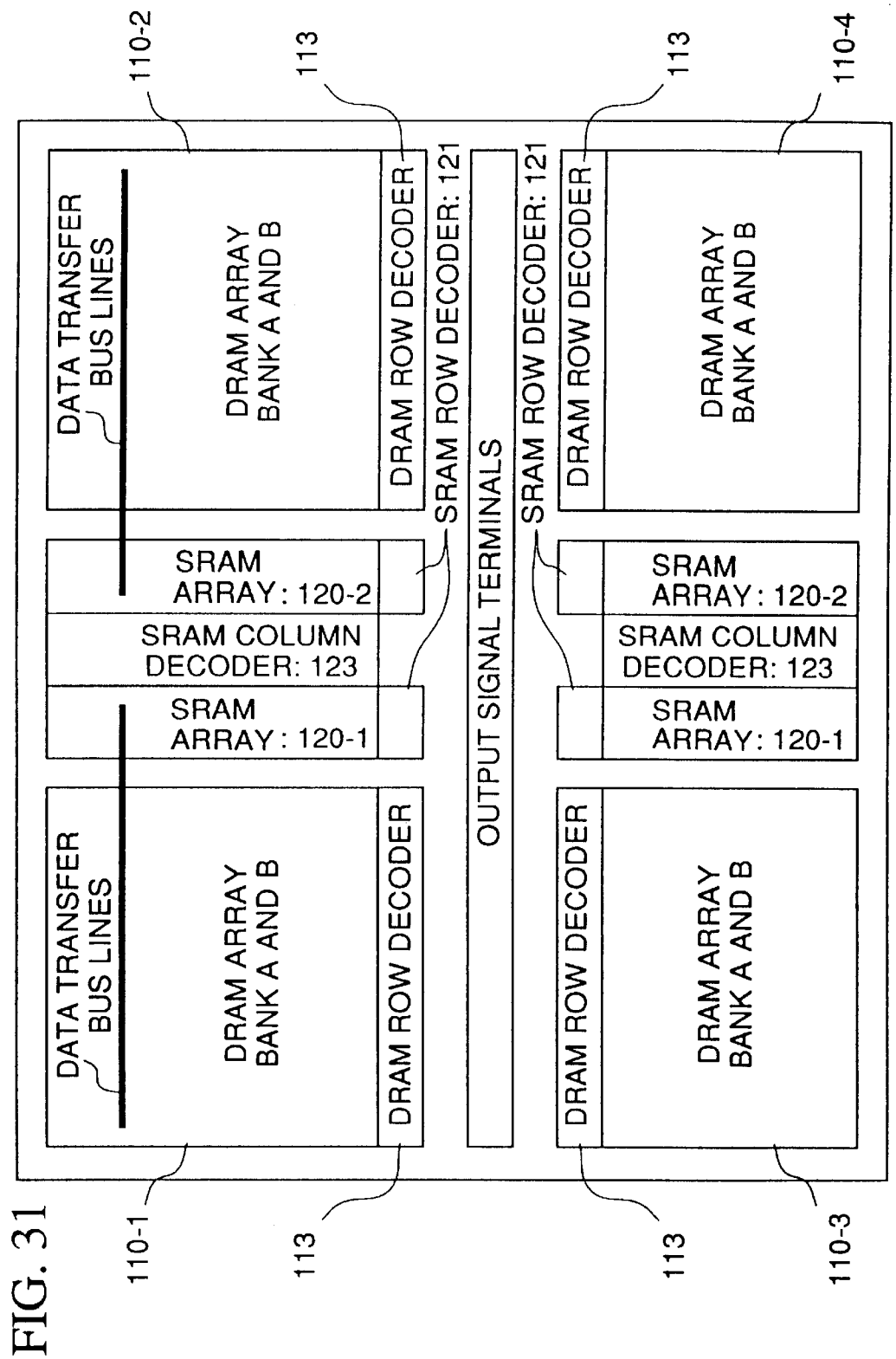

FIG. 31 is a diagram schematically showing an overall layout of a chip of the semiconductor memory device according to the first embodiment of the invention.

Figure 32:
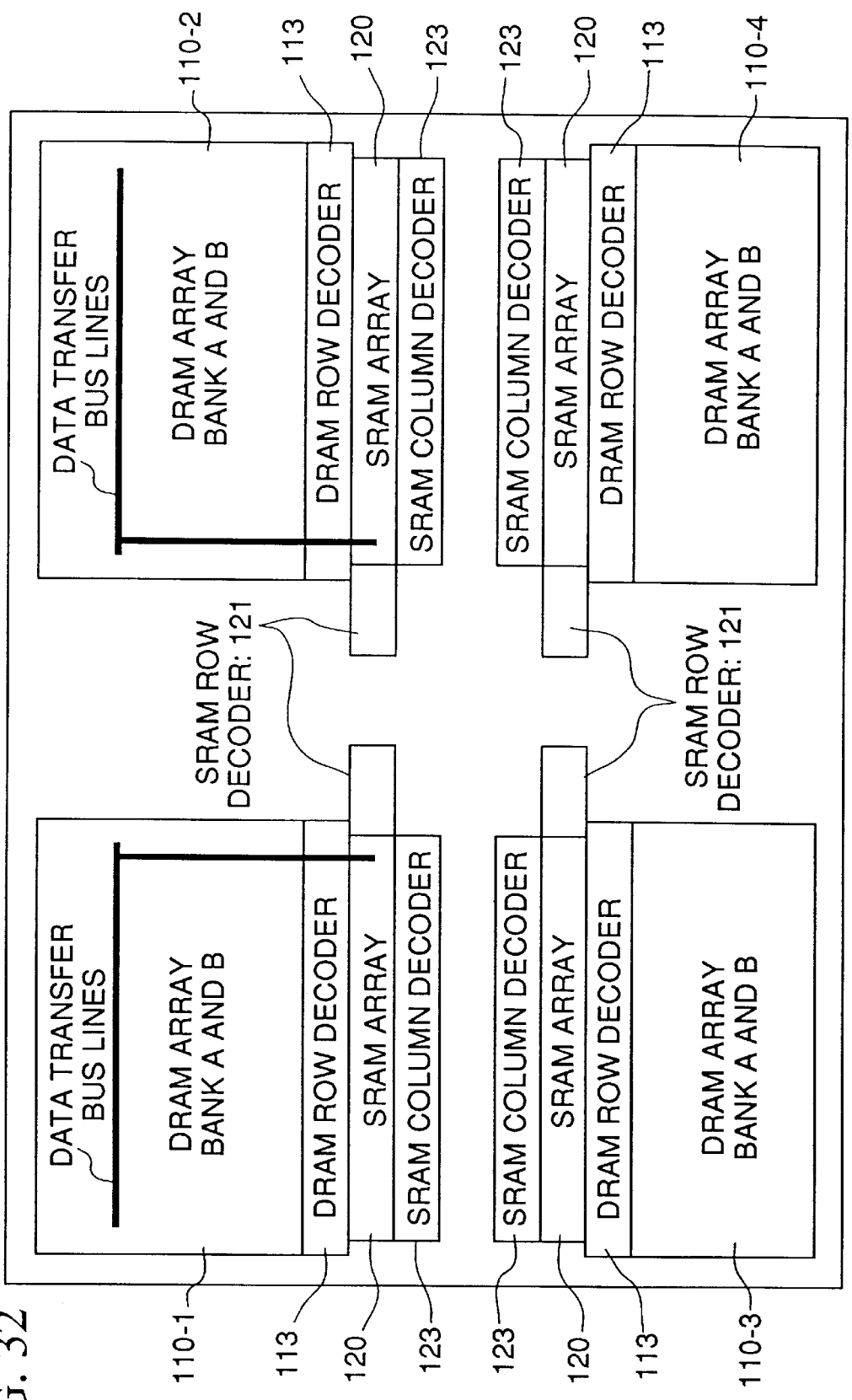

FIG. 32 is a diagram schematically showing an overall layout of a chip of the semiconductor memory device according to the first embodiment of the invention.

Figure 33:
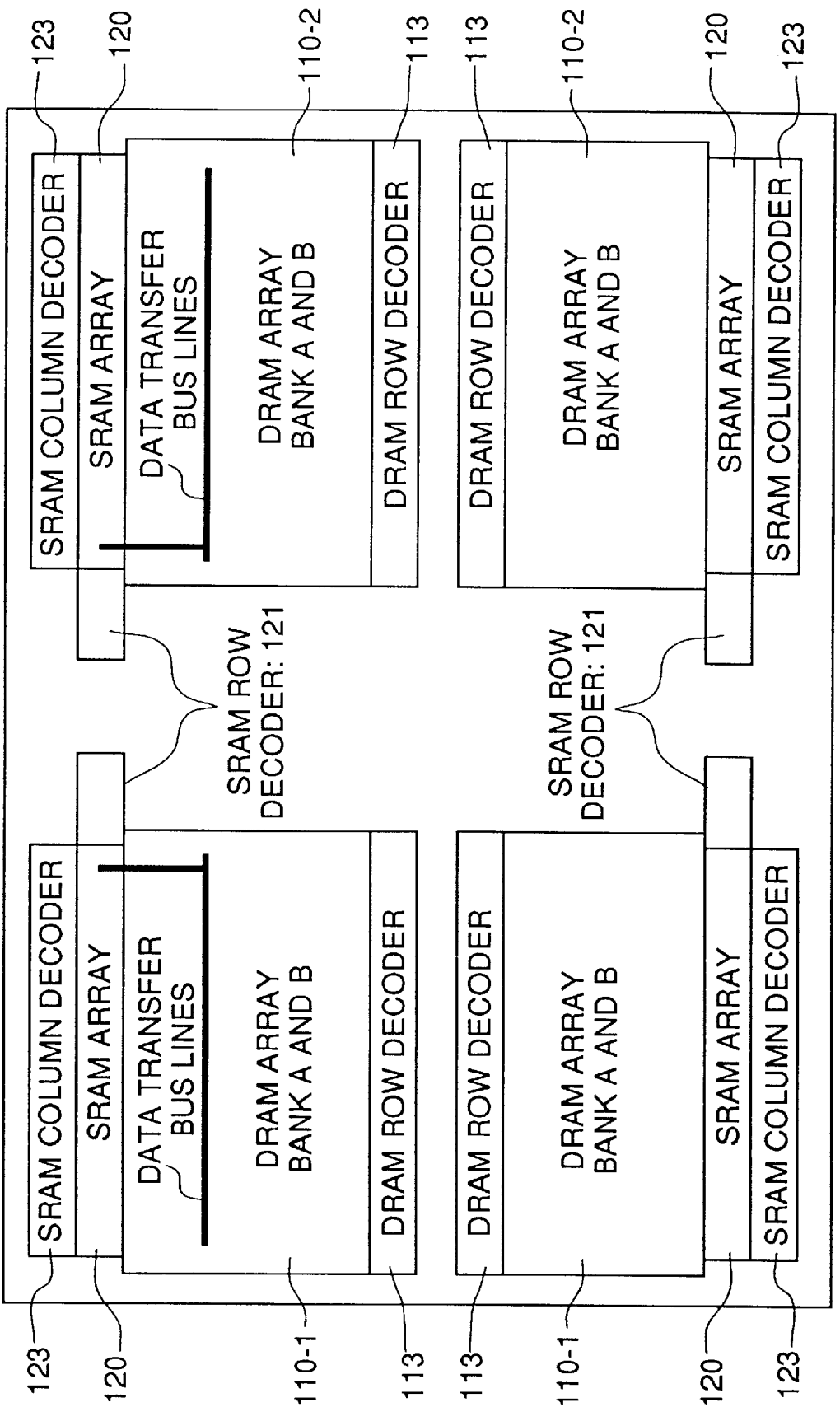

FIG. 33 is a diagram schematically showing an overall layout of a chip of the semiconductor memory device according to the first embodiment of the invention.

Figure 34:
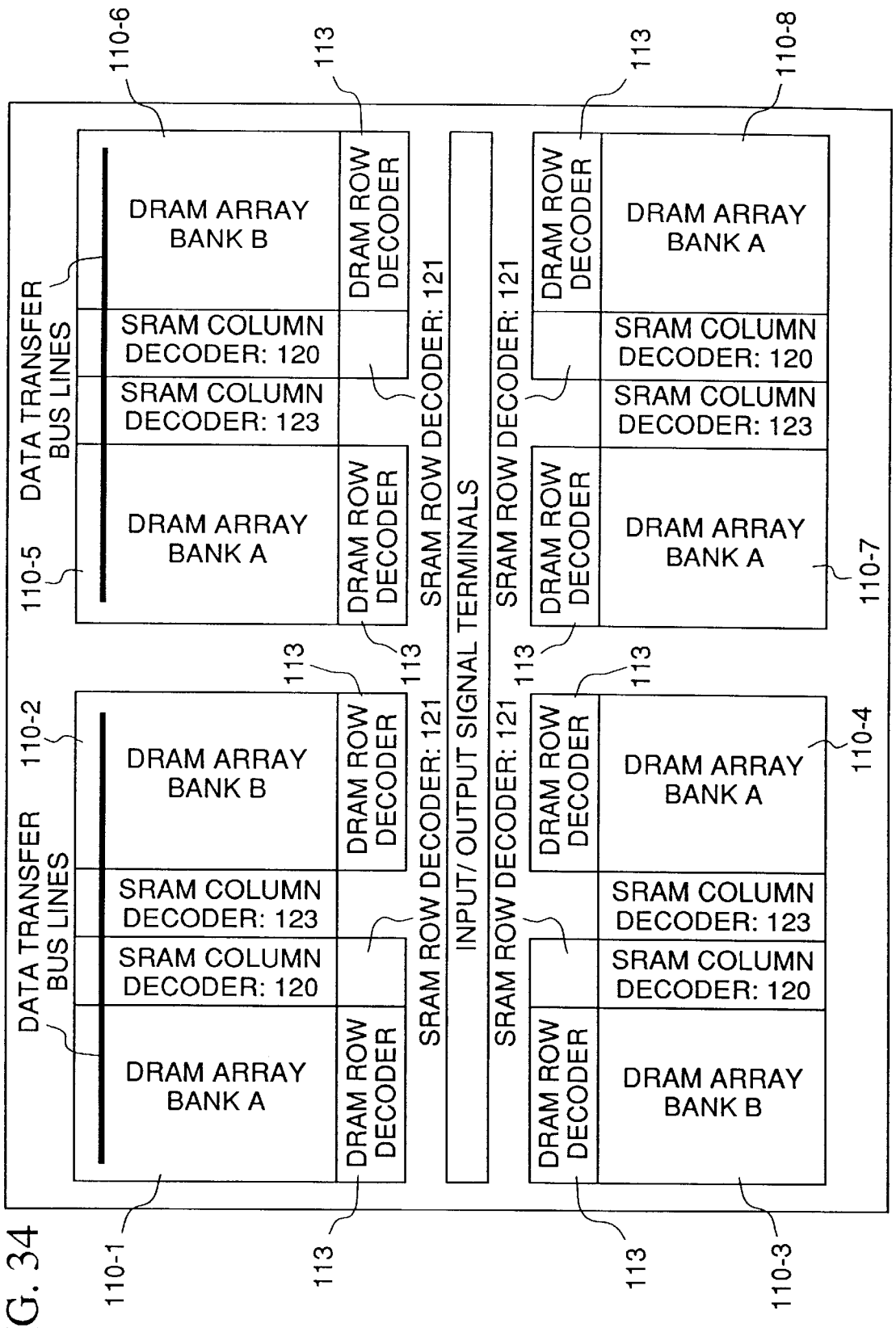

FIG. 34 is a diagram schematically showing an overall layout of a chip of the semiconductor memory device according to the first embodiment of the invention.

Figure 35:
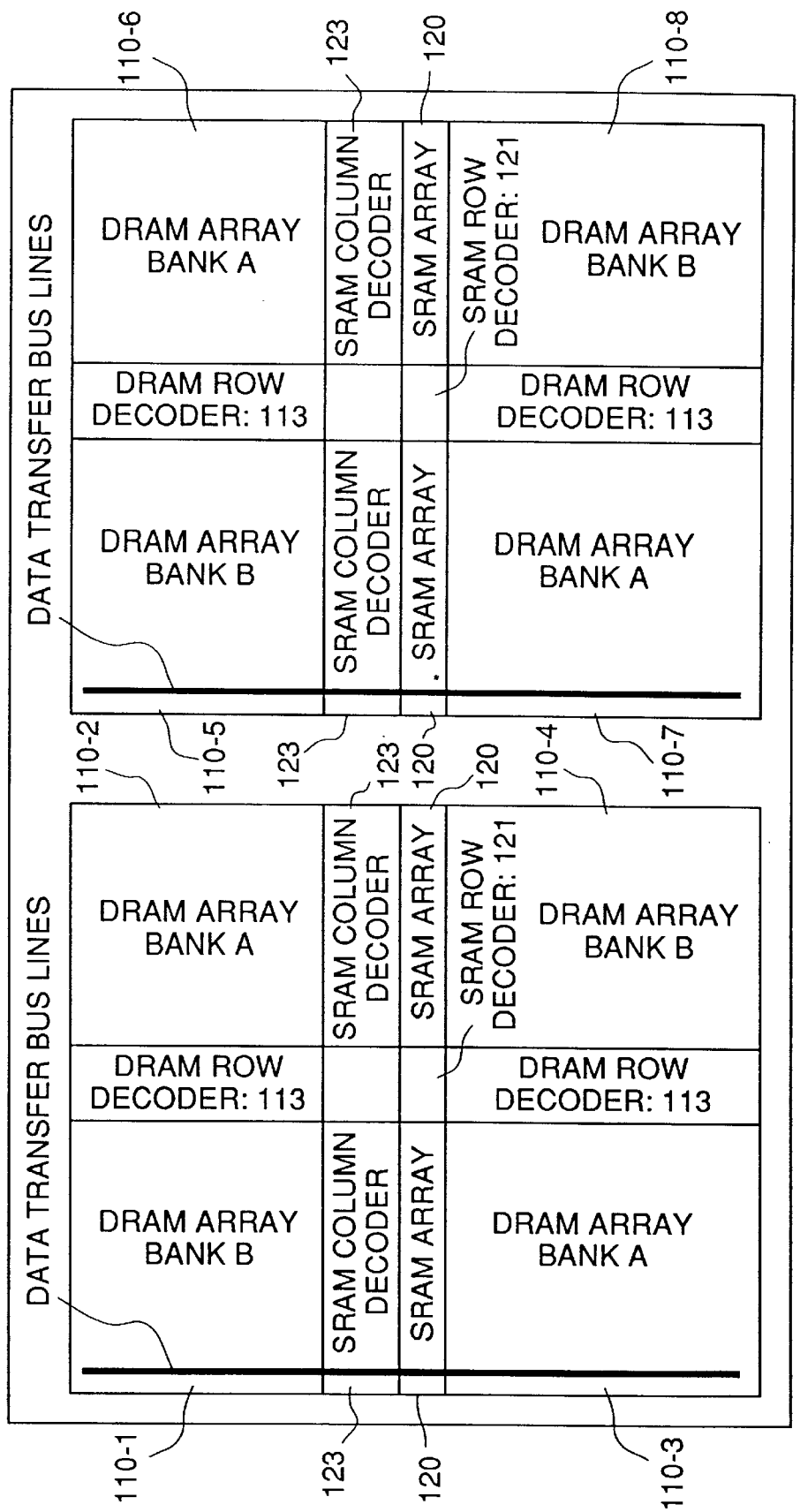

FIG. 35 is a diagram schematically showing an overall layout of a chip of the semiconductor memory device according to the first embodiment of the invention.

Figure 36:
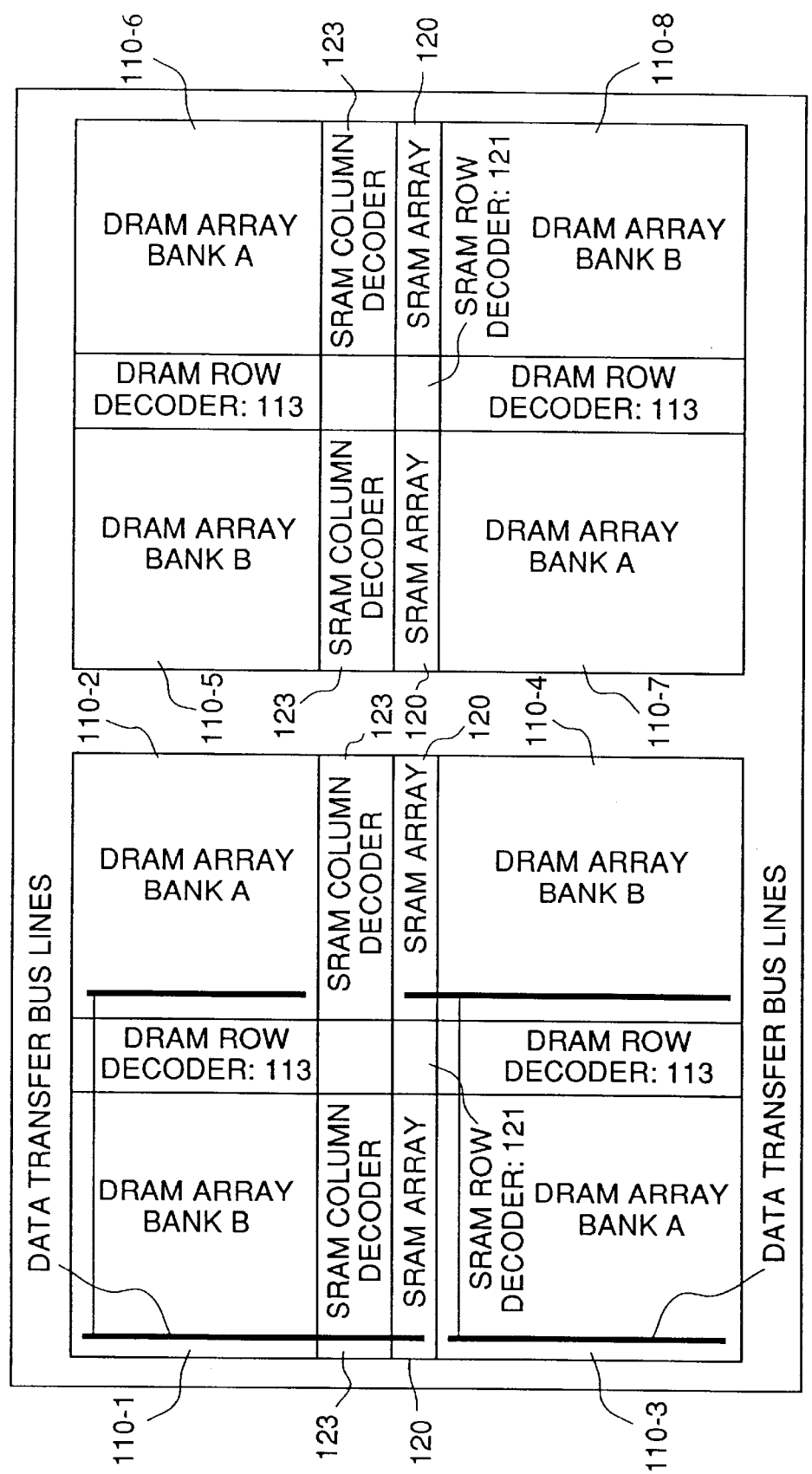

FIG. 36 is a diagram schematically showing an overall layout of a chip of the semiconductor memory device according to the first embodiment of the invention.

Figure 37:
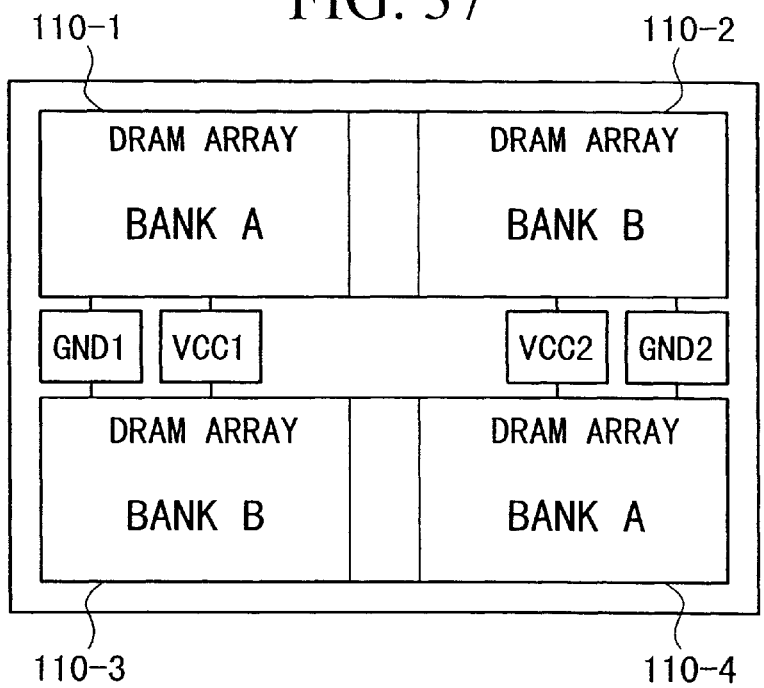

FIG. 37 is a diagram schematically showing blocks of the semiconductor memory device according to the first embodiment of the invention, which use a common power source.

Figure 38:
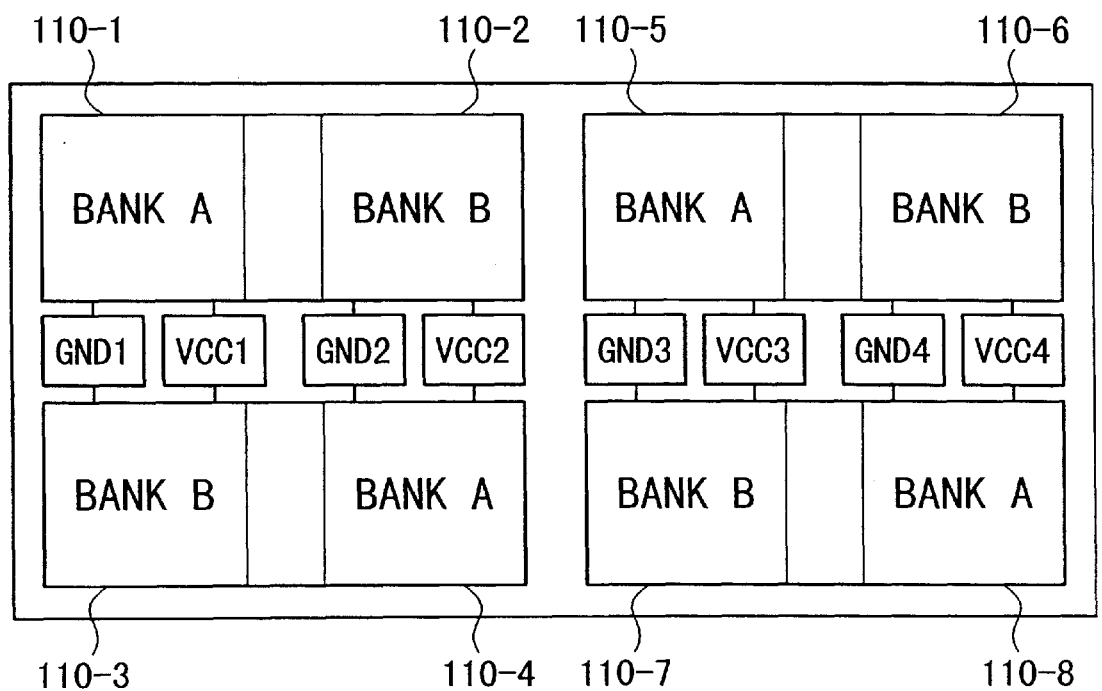

FIG. 38 is a diagram schematically showing blocks of the semiconductor memory device according to the first embodiment of the invention, which use a common power source.

Figure 39:
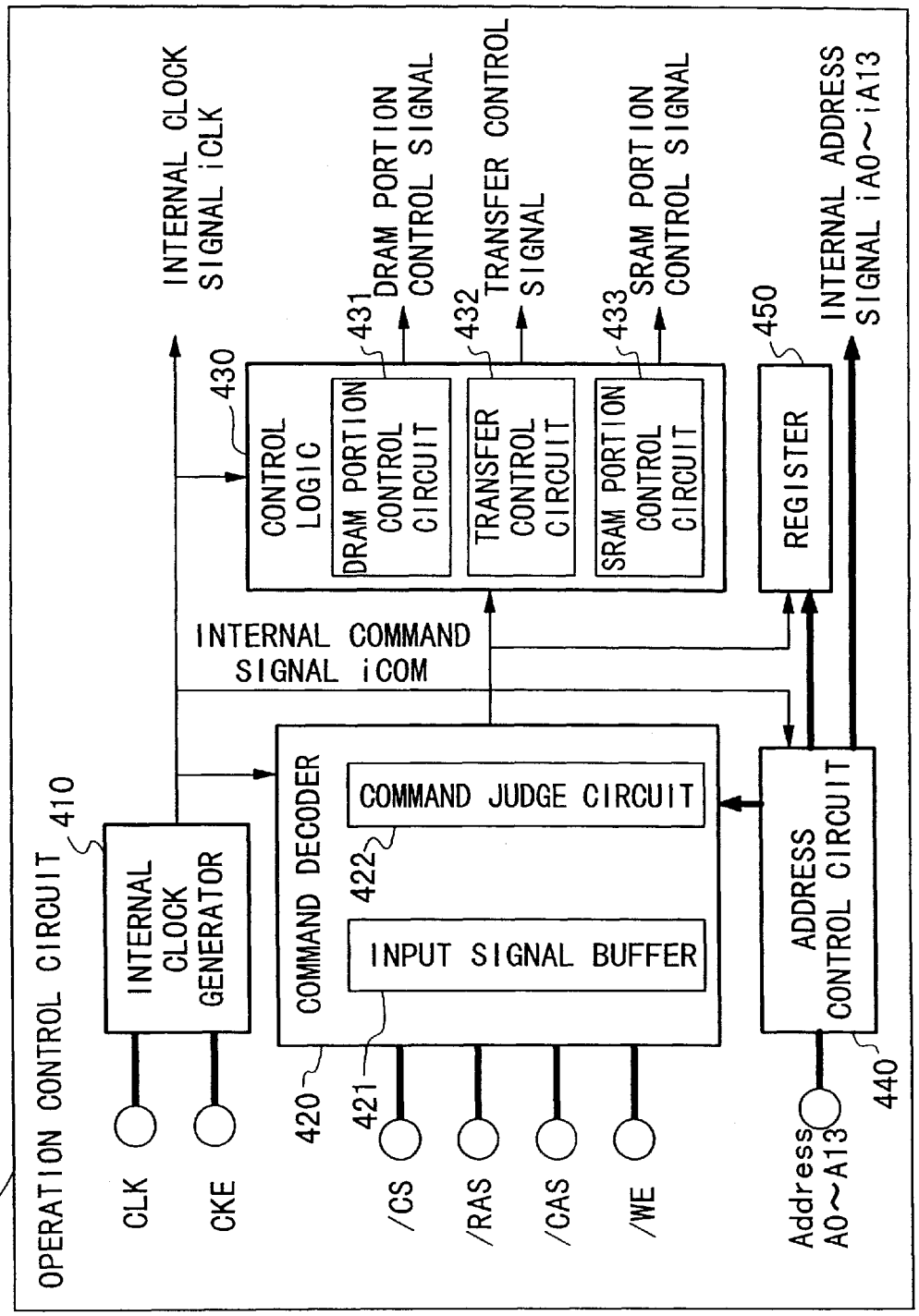

FIG. 39 is a block diagram of an operation control device of the semiconductor memory device shown in FIG. 1.

Figure 40:
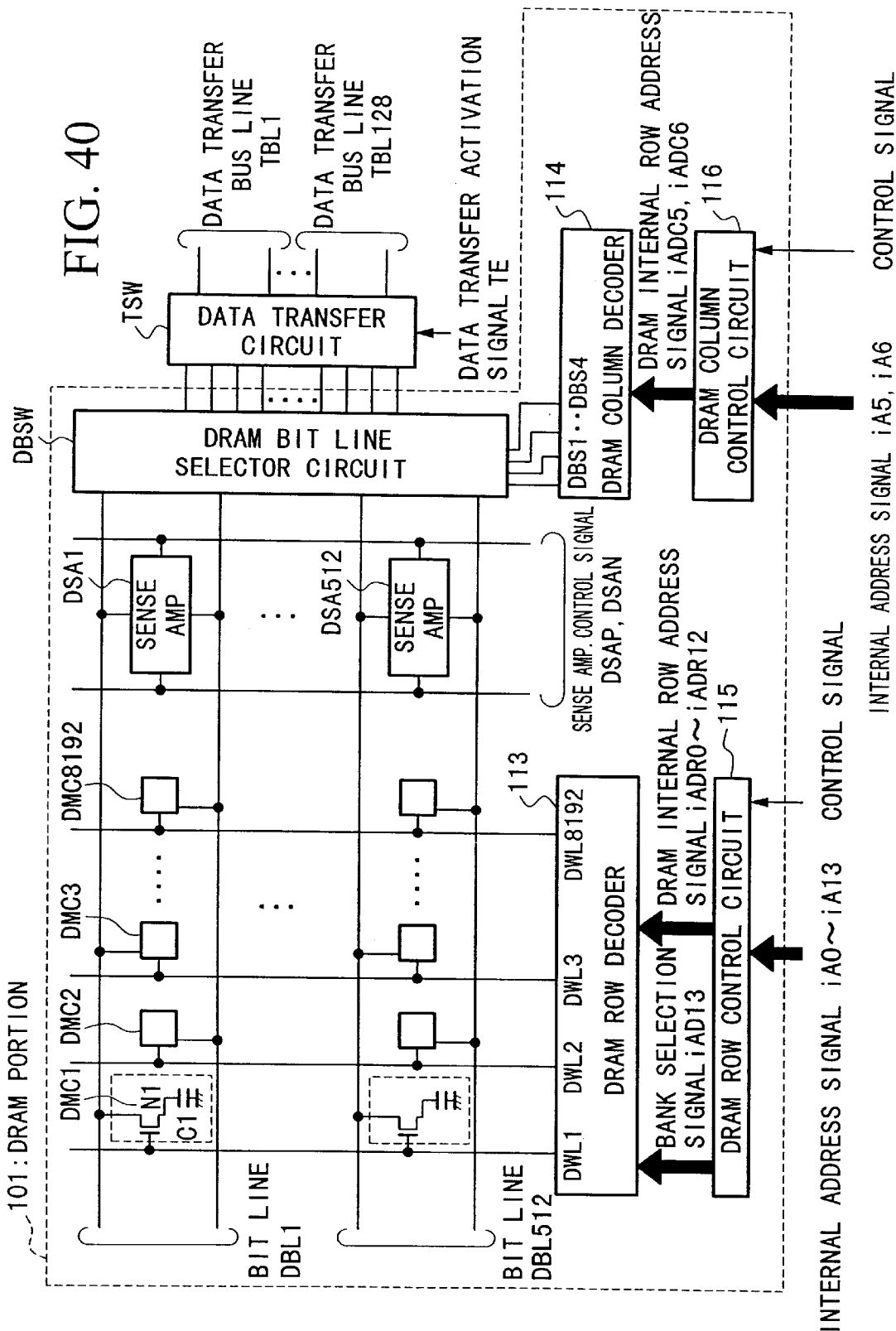

FIG. 40 is a diagram showing a specific configuration of a DRAM portion and data transfer circuit shown in FIG. 1.

Figure 41:
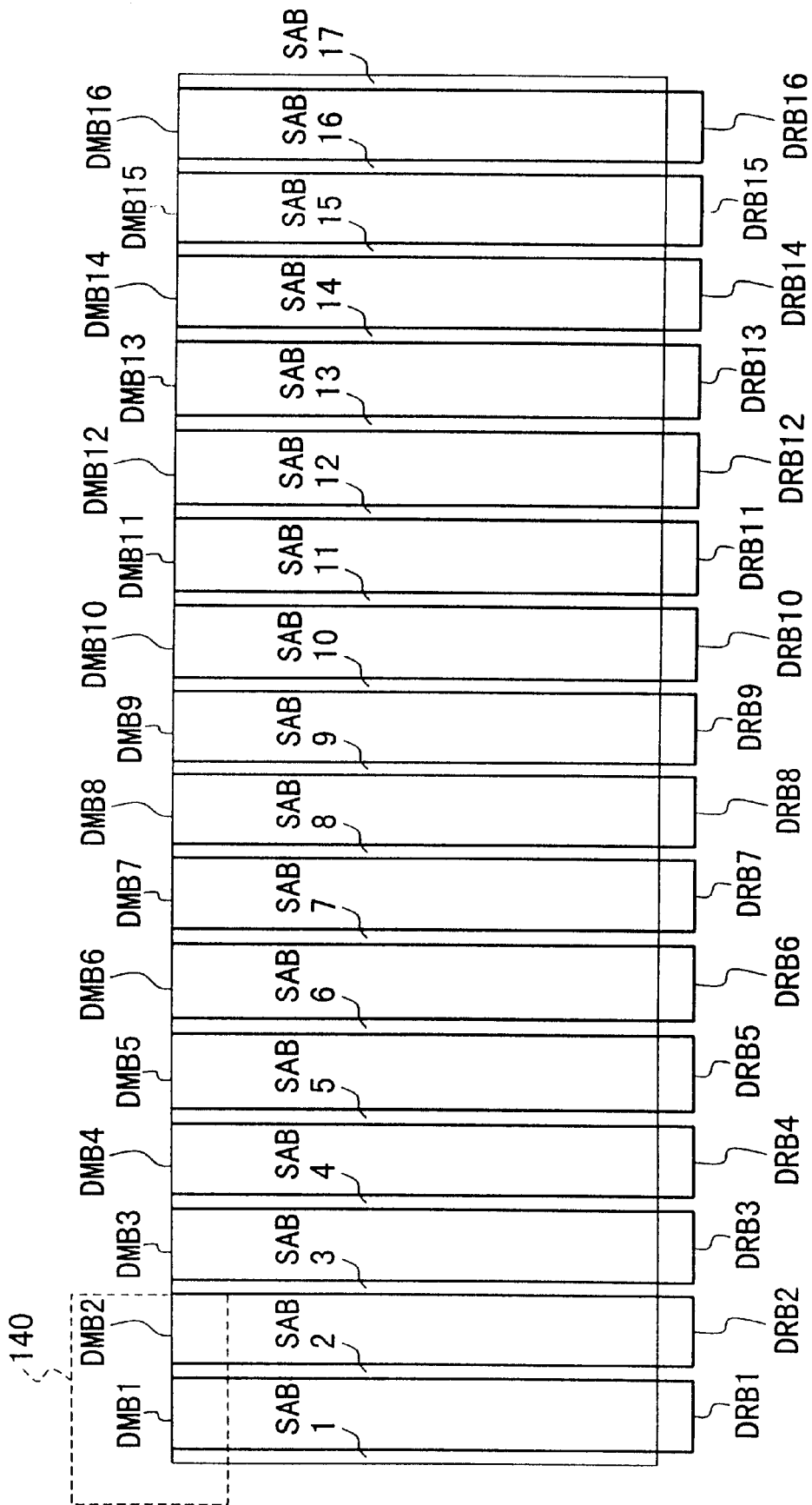

FIG. 41 is a diagram showing one example of a specific array configuration for a DRAM array 110-1 within the overall layout, being one embodiment of the present invention shown in FIG. 30.

Figure 42:
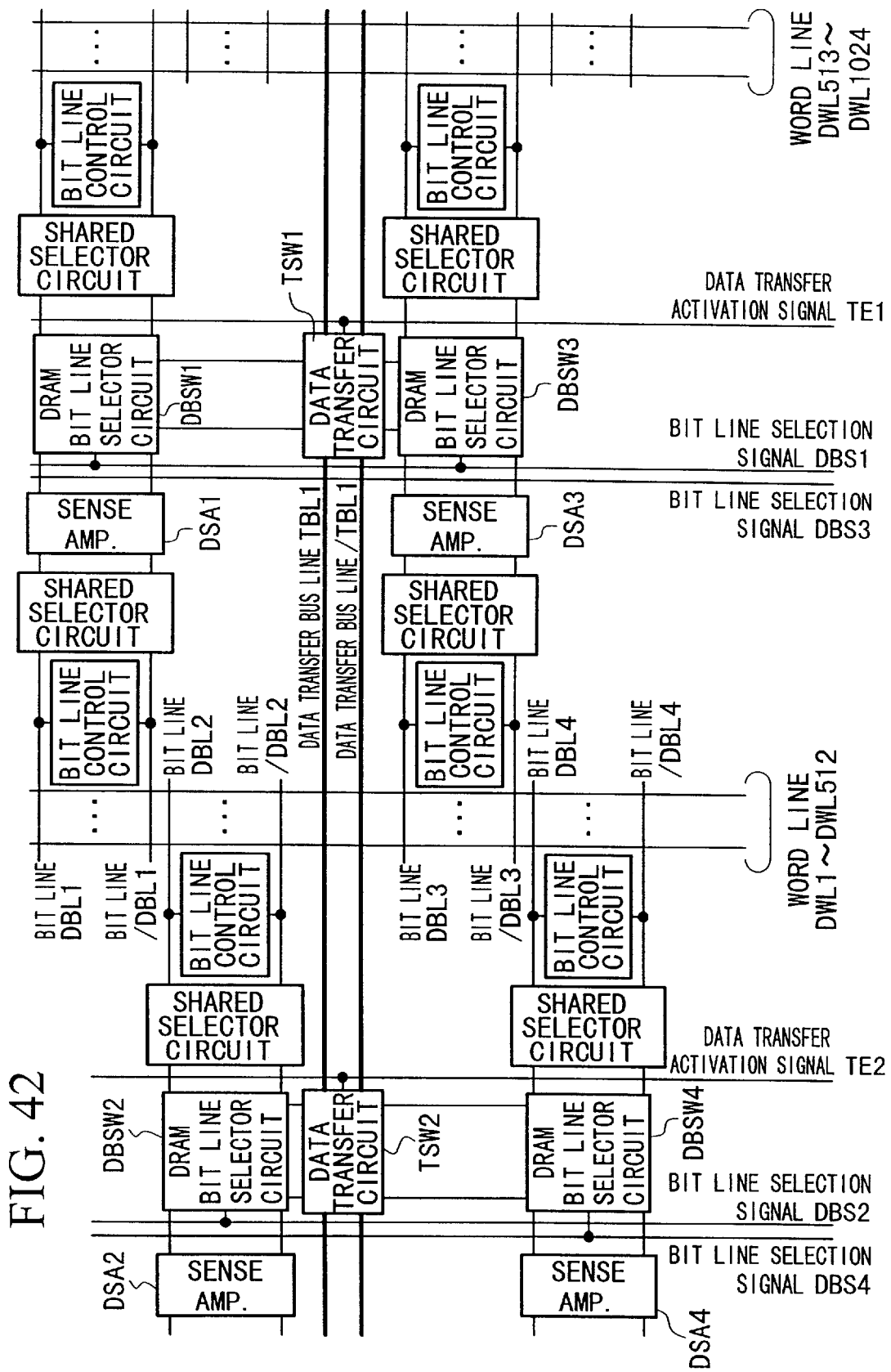

FIG. 42 is a diagram of an example showing in detail the connection relation of a transfer bus line and a bit line in one part (corresponding to the 4 bit line portion) of the layout of FIG. 41.

Figure 43:
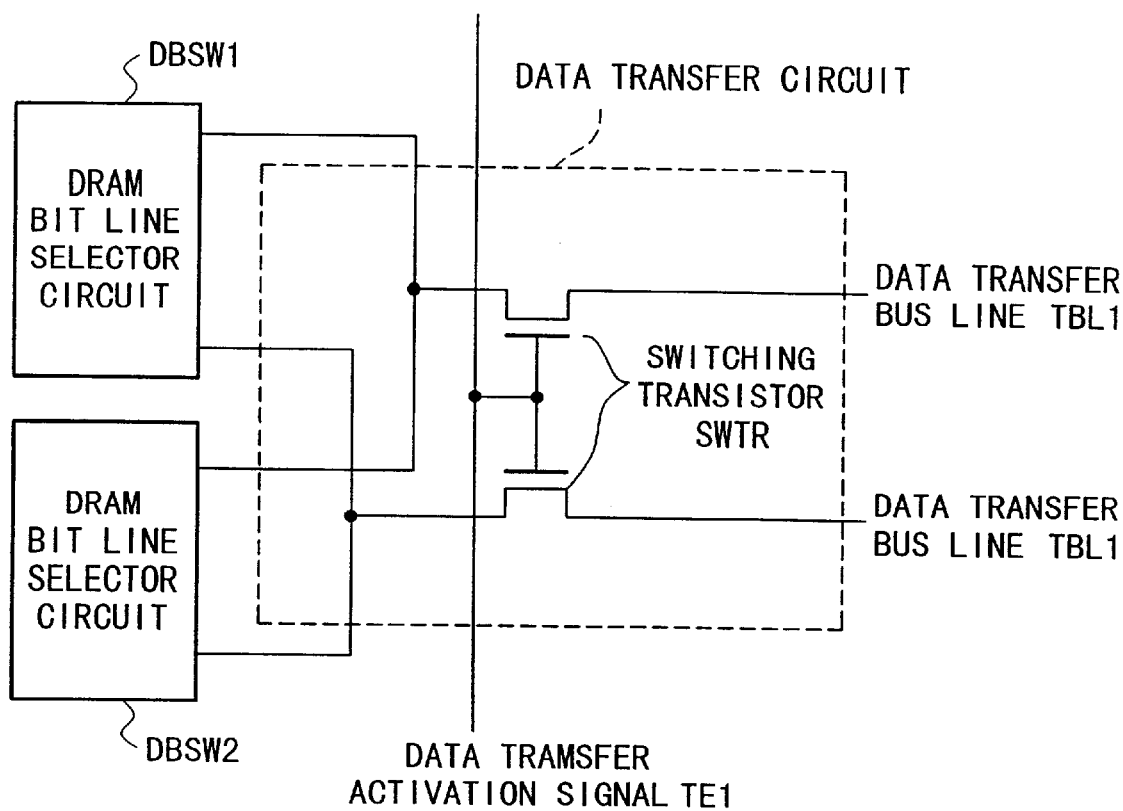

FIG. 43 is a circuit diagram showing a detailed circuit example of a data transfer circuit.

Figure 44:
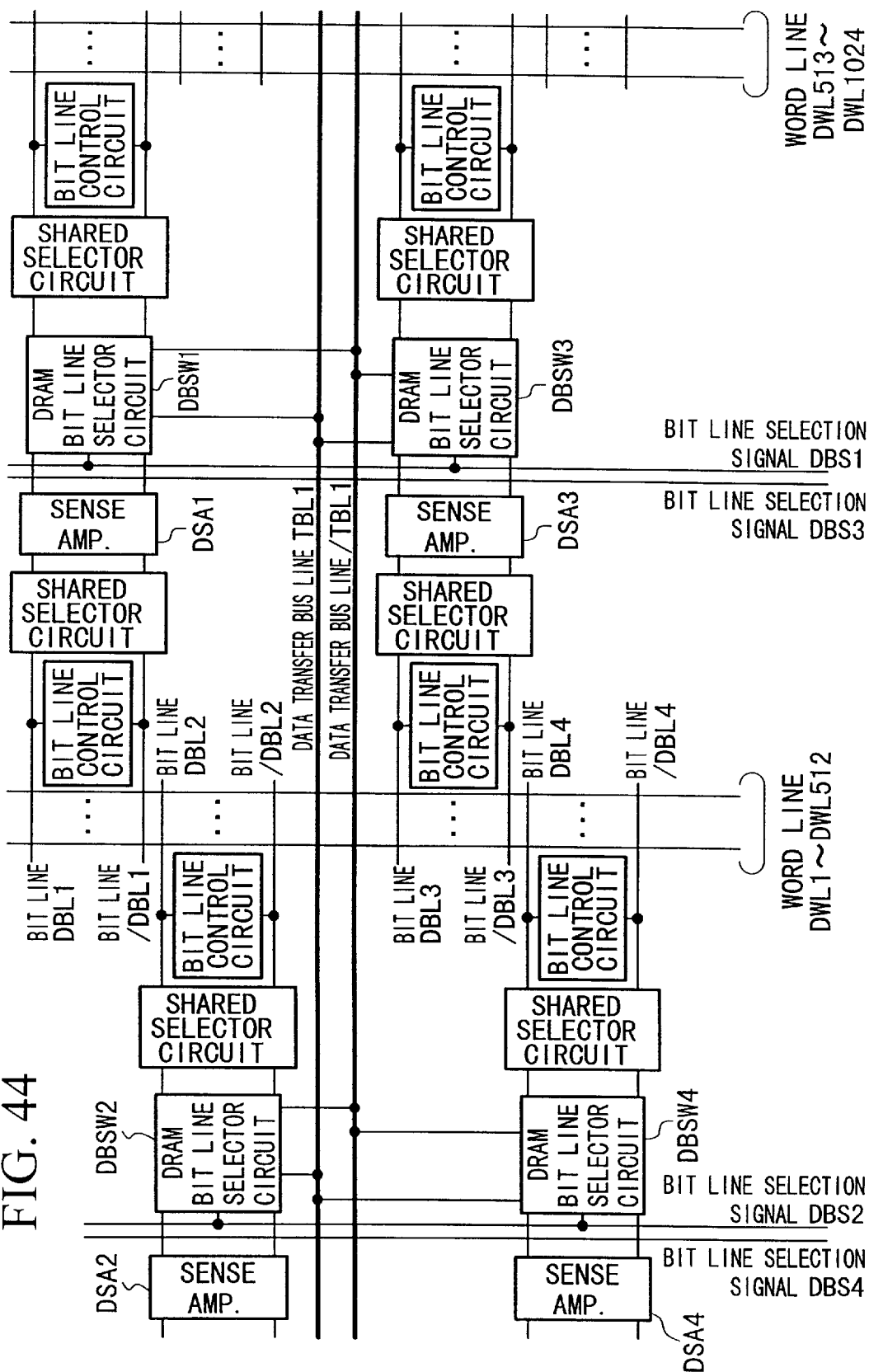

FIG. 44 is a diagram showing the configuration of one example for solving a problem point in the example shown in FIG. 42.

Figure 45:
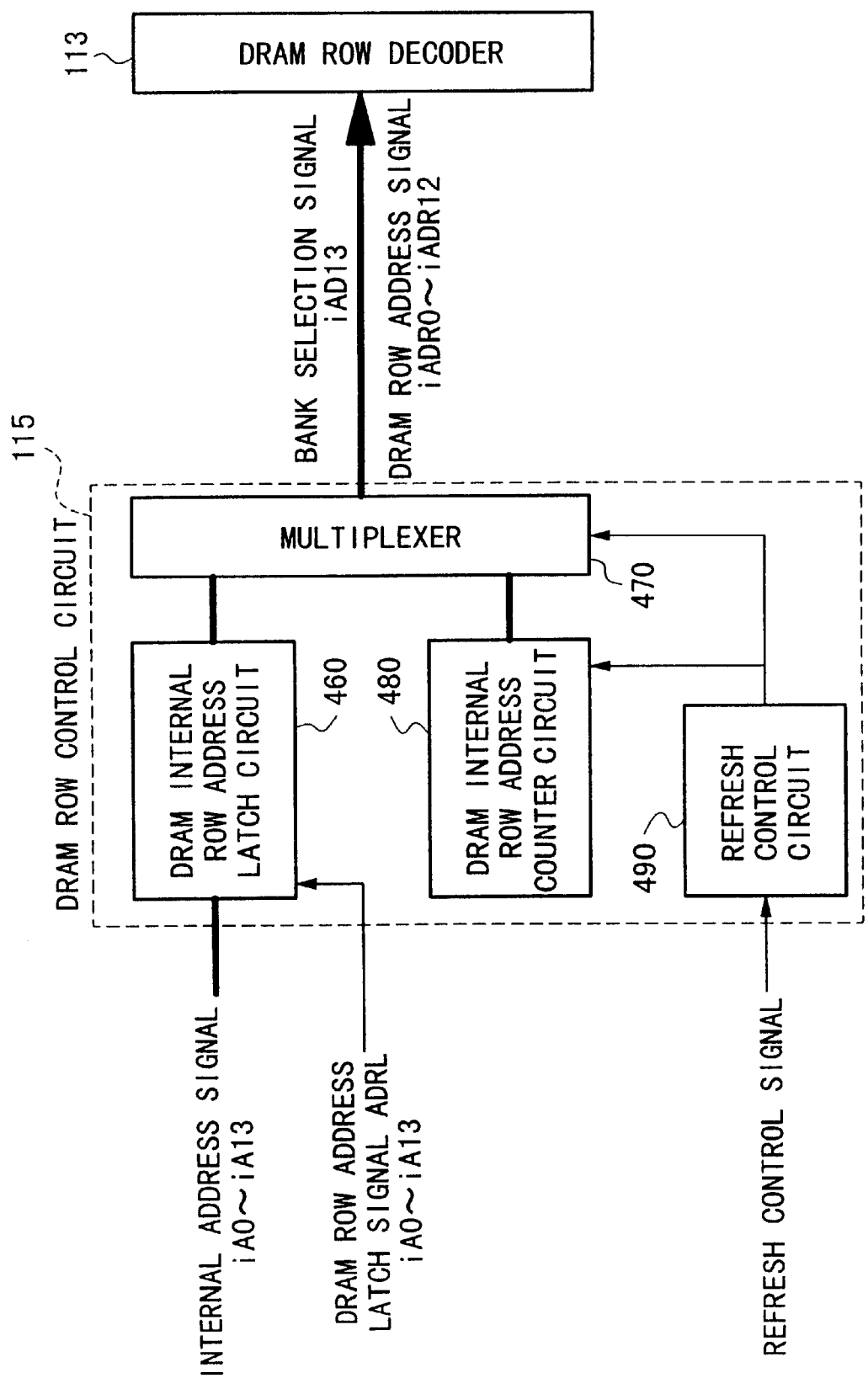

FIG. 45 is a block diagram showing an example of a DRAM row control device.

Figure 46:
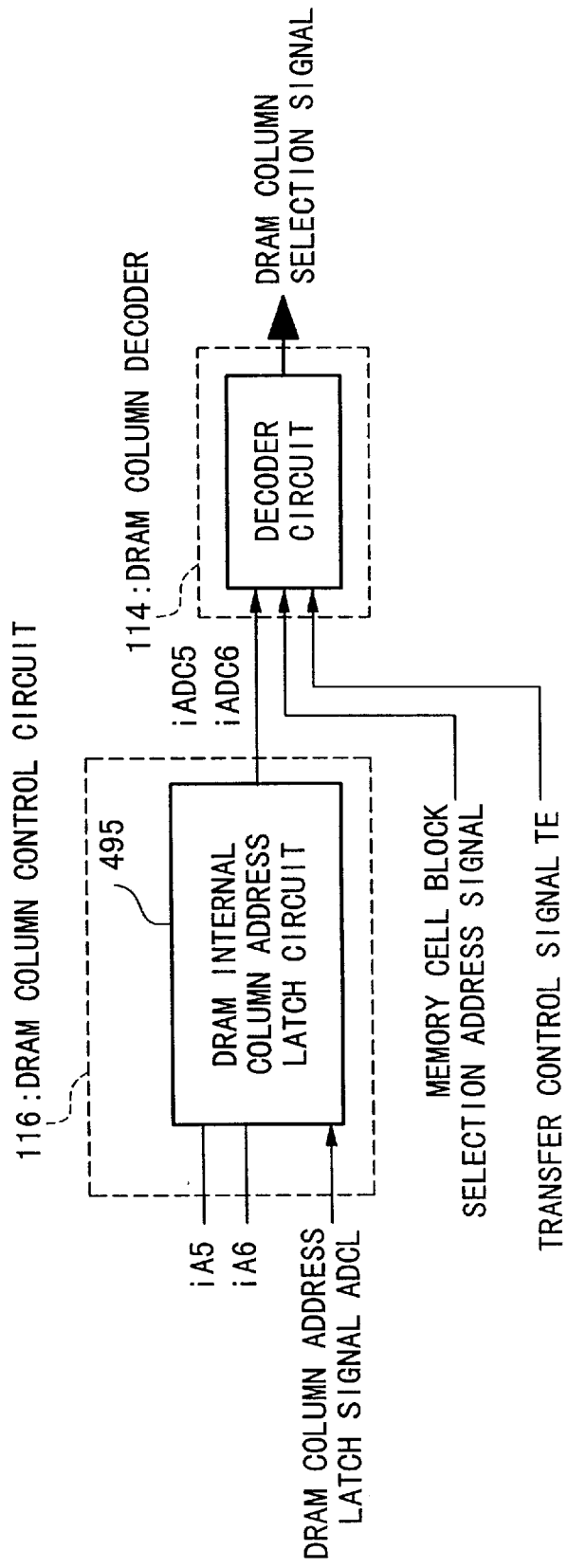

FIG. 46 is a diagram showing one example of a specific configuration of a DRAM column control device and a DRAM column decoder shown in FIG. 40.

Figure 47:
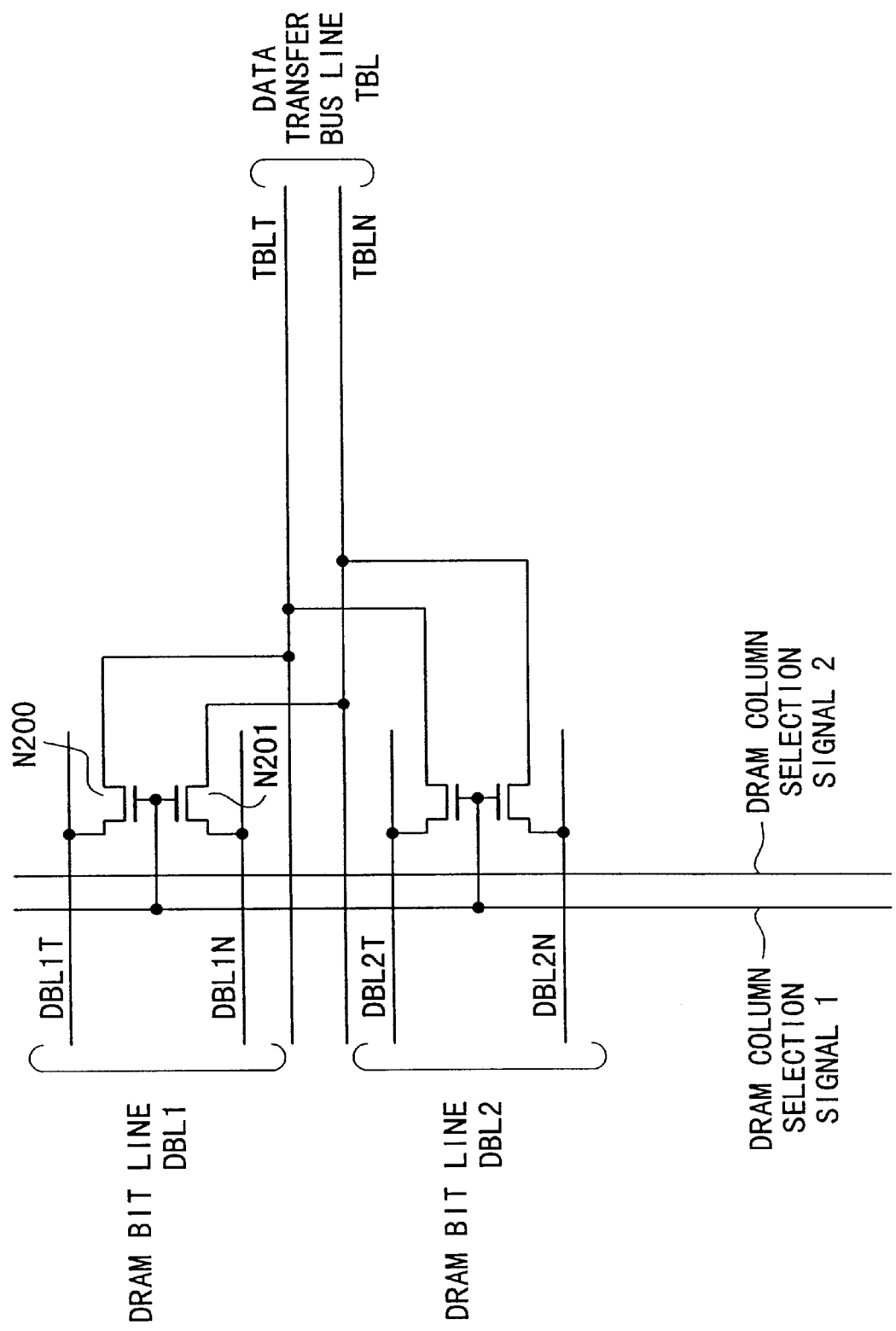

FIG. 47 is a diagram showing one example of a specific circuit configuration of a DRAM bit line selector.

Figure 48:
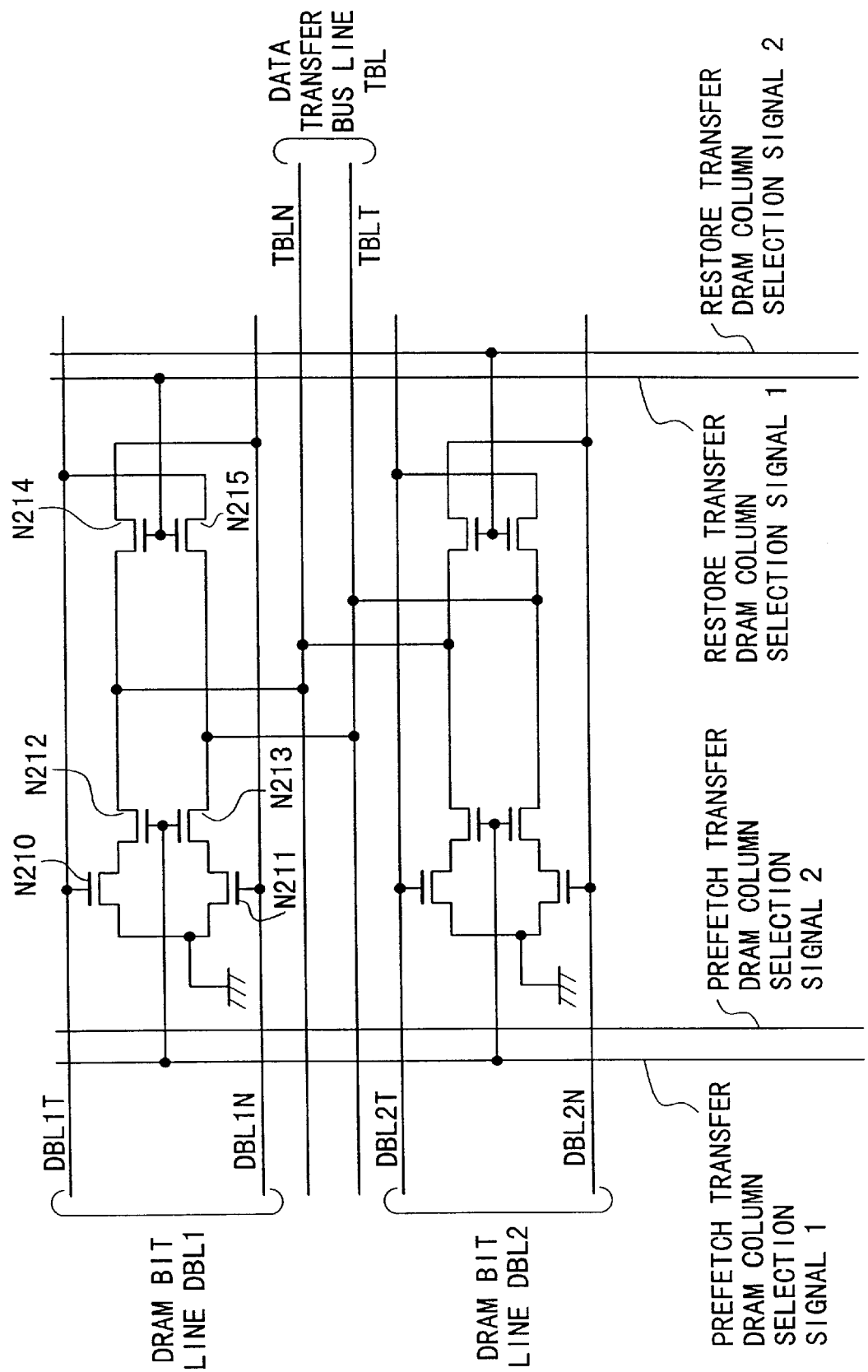

FIG. 48 is a diagram showing one example of a specific circuit configuration of a DRAM bit line selector.

Figure 49:
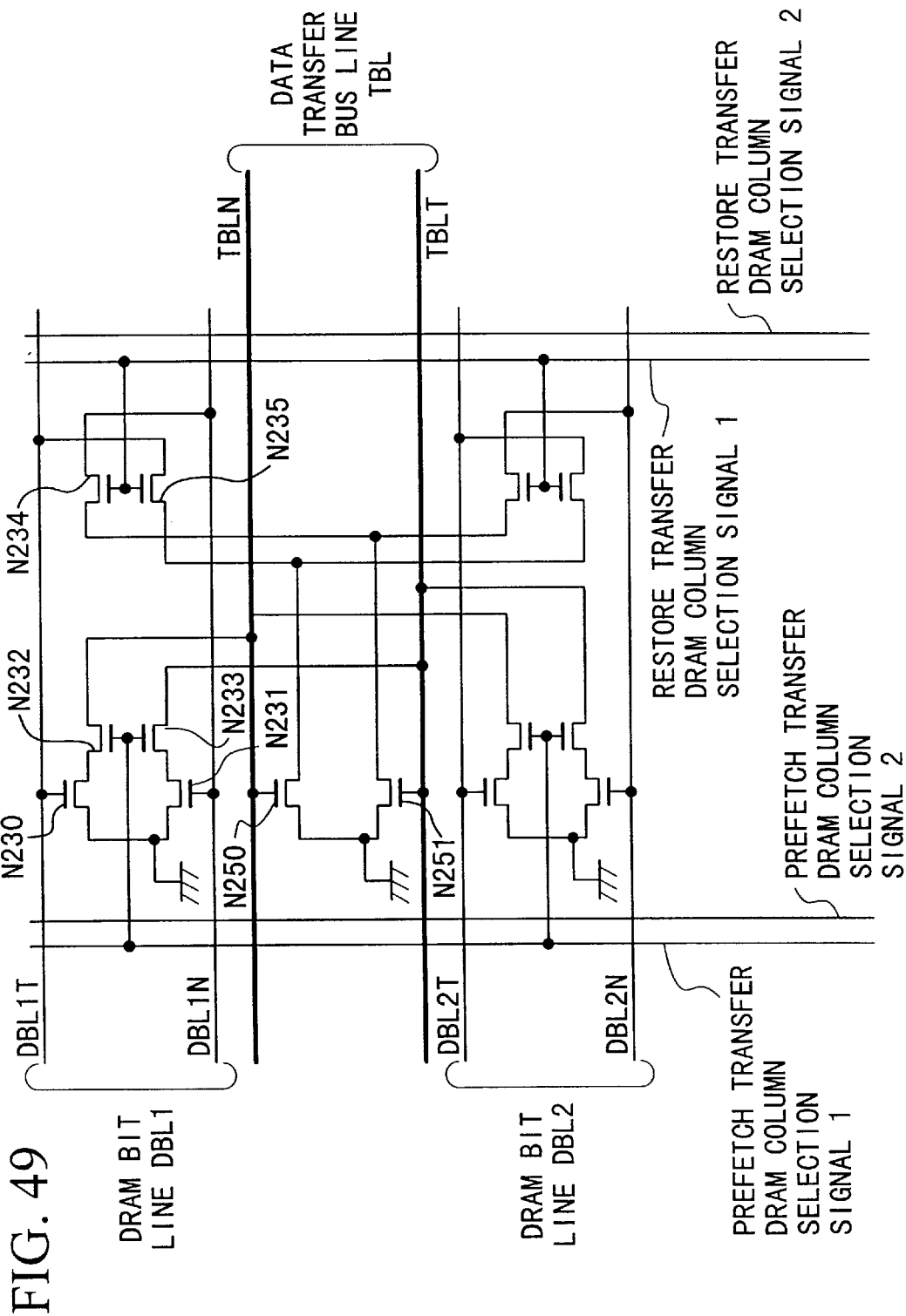

FIG. 49 is a diagram showing one example of a specific circuit configuration of a DRAM bit line selector.

Figure 50:
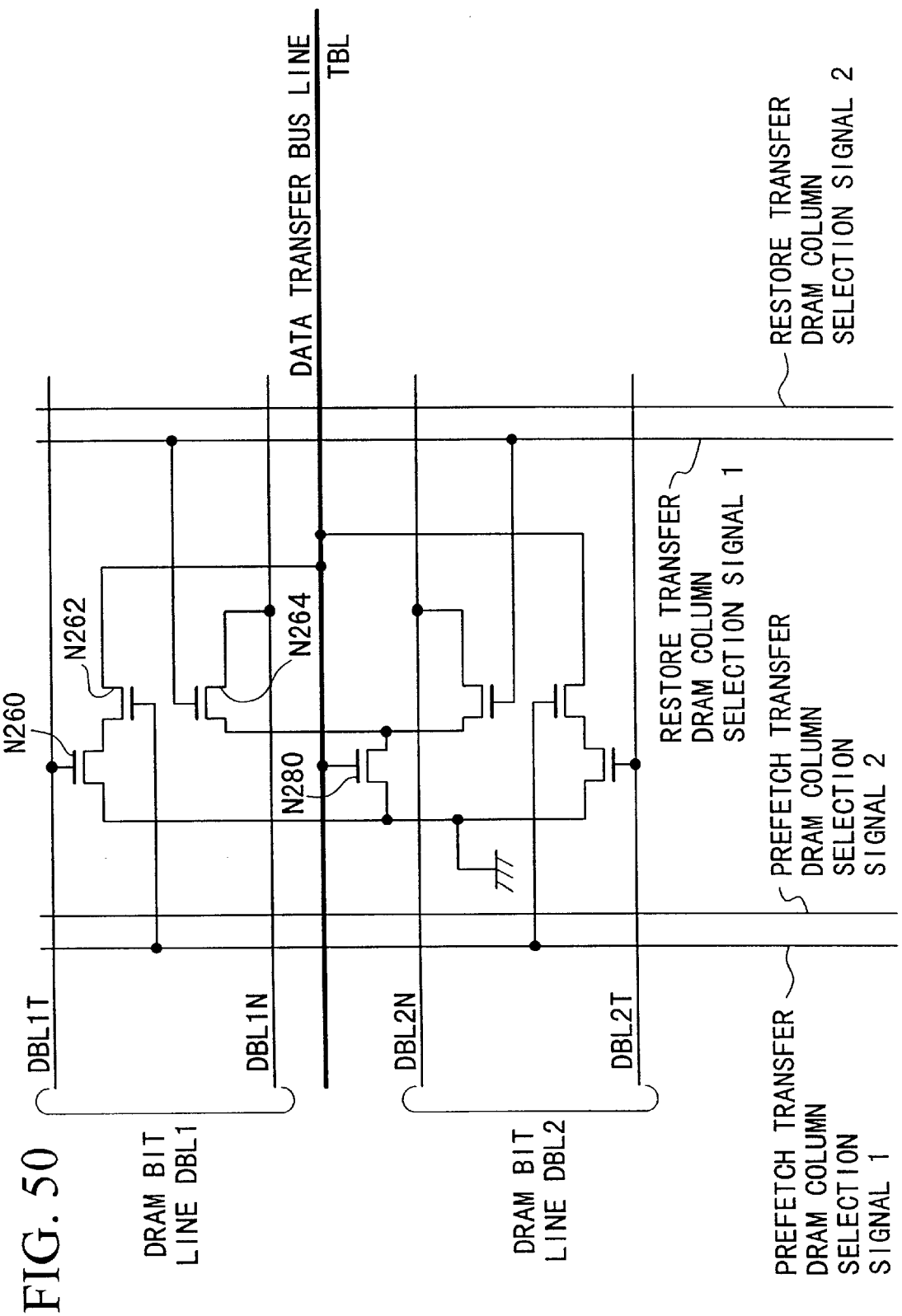
Figure 51:
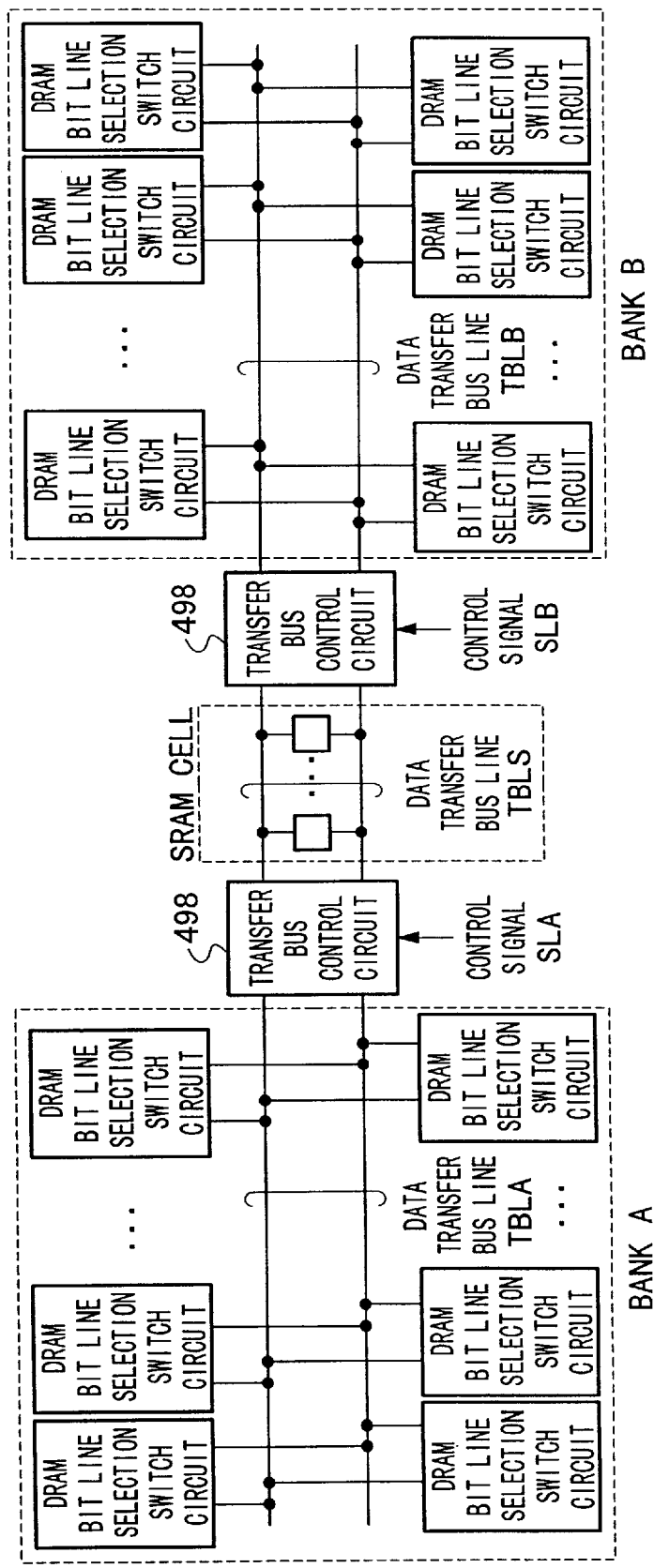

FIG. 50 is a diagram showing one example of a specific circuit configuration of a DRAM bit line selector, FIG. 51 is a structural diagram showing the relation between a pair of data transfer bus lines, and a DRAM bit line selector and SRAM cell, in the array layout shown in FIG. 29.

Figure 52:
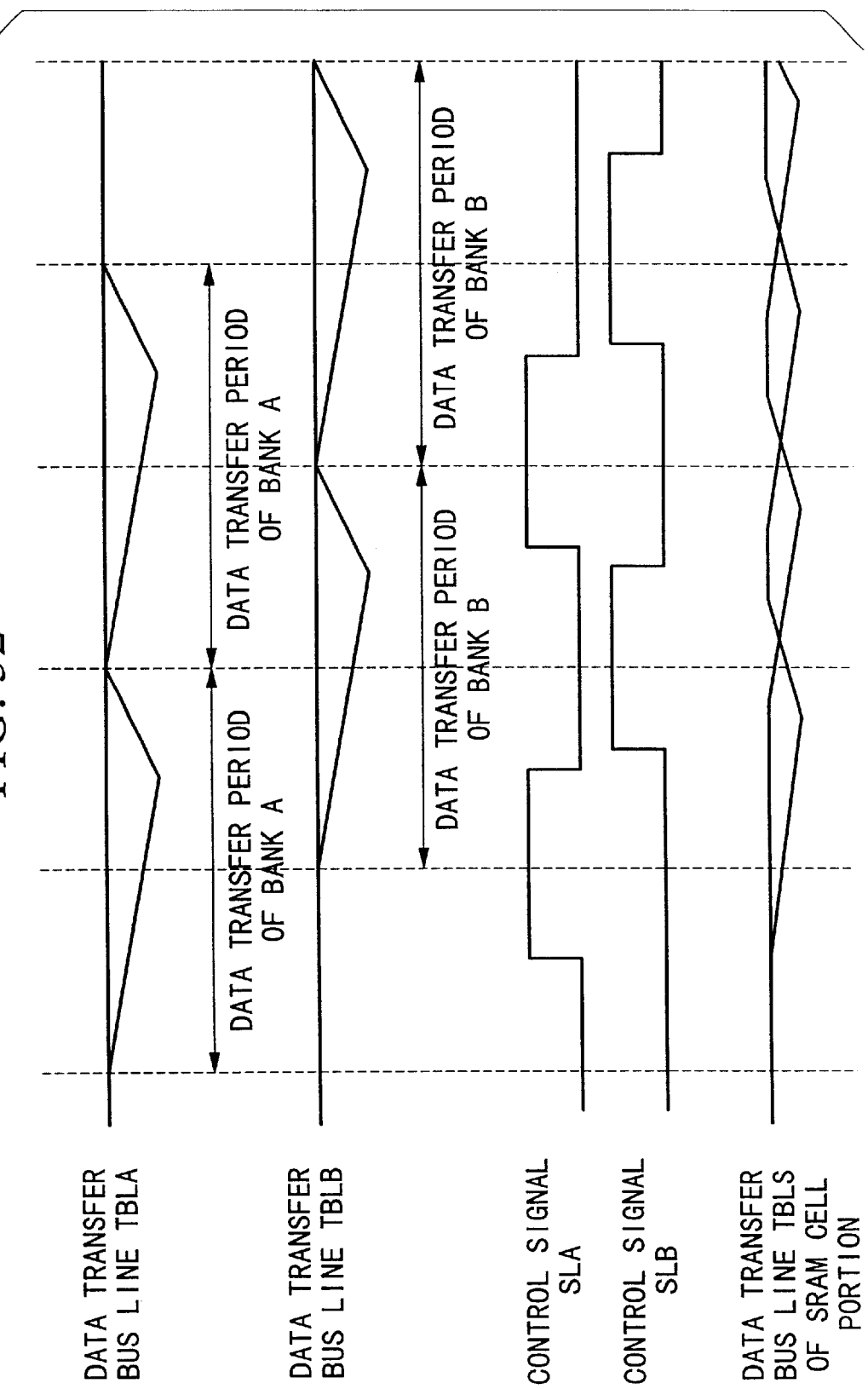

FIG. 52 is a signal wave diagram showing an operation example of respective data transfer bus lines in FIG. 51.

Figure 53:
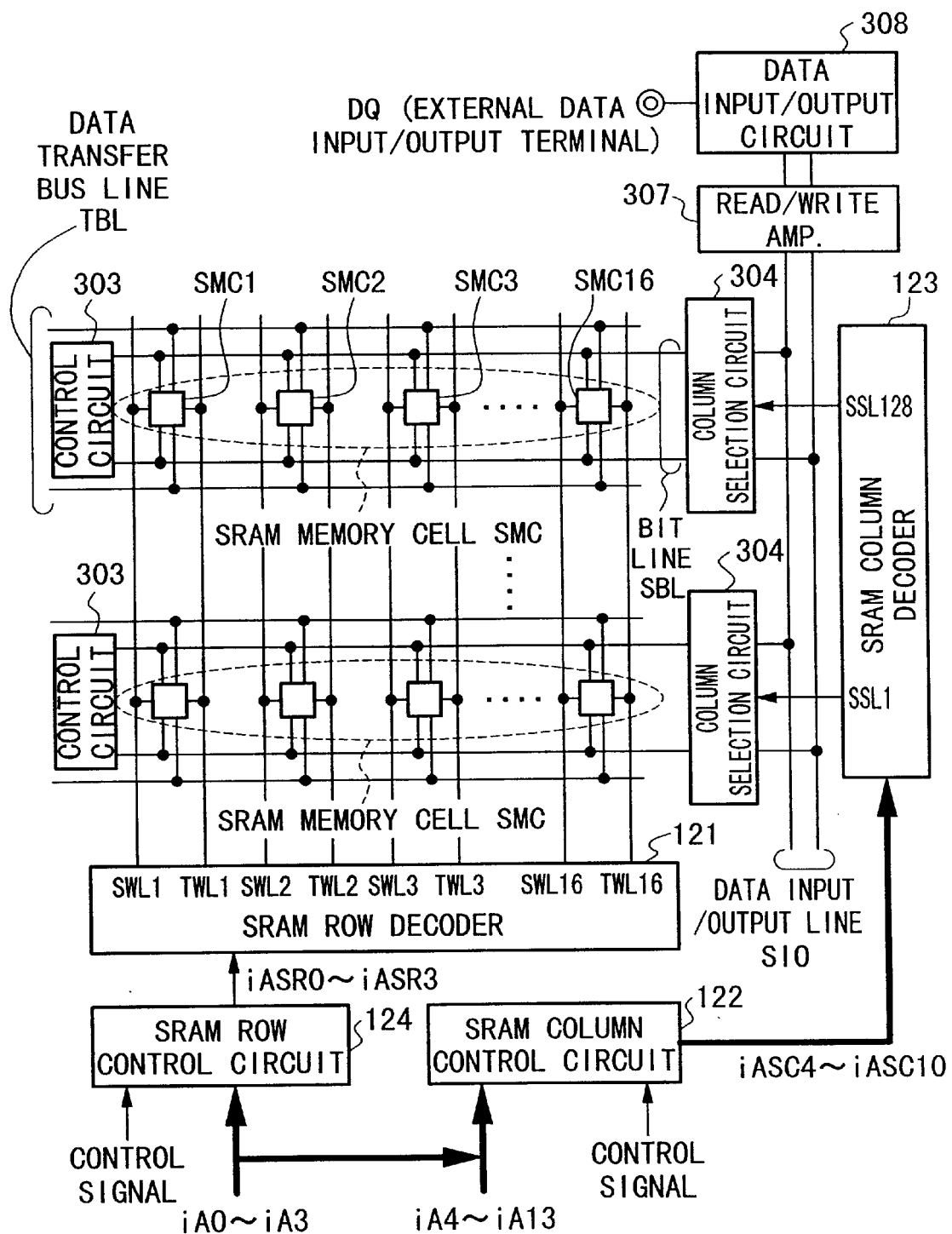

FIG. 53 is a diagram showing one example of a specific configuration between SRAM portions shown in FIG. 1 and data input/output terminals.

Figure 54:
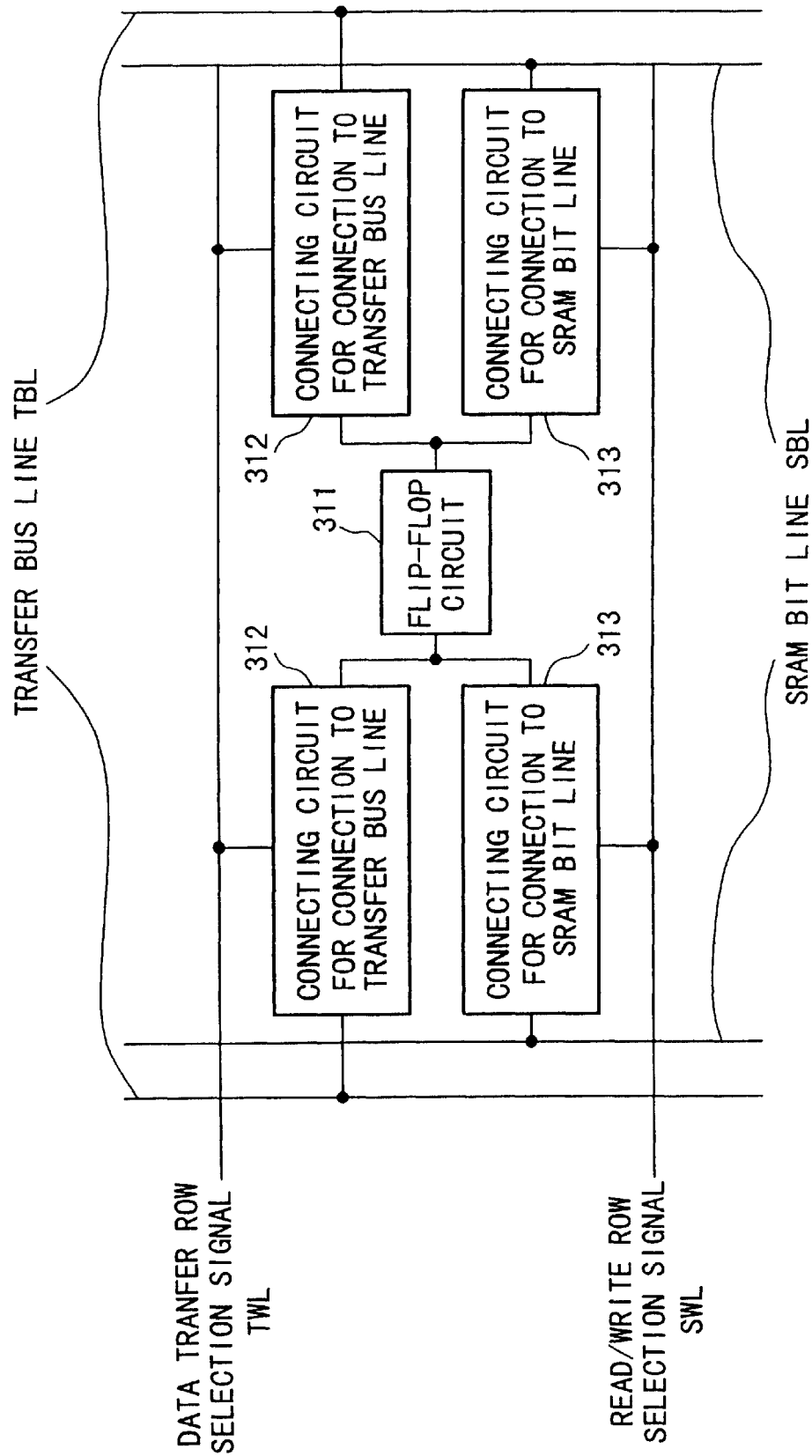

FIG. 54 is a diagram showing one example of a configuration of a SRAM memory cell.

FIGS. 55(A) to 55(D) is a diagram showing a specific circuit example of a flip-flop circuit of the SRAM cell shown in FIG. 54.

Figure 56:
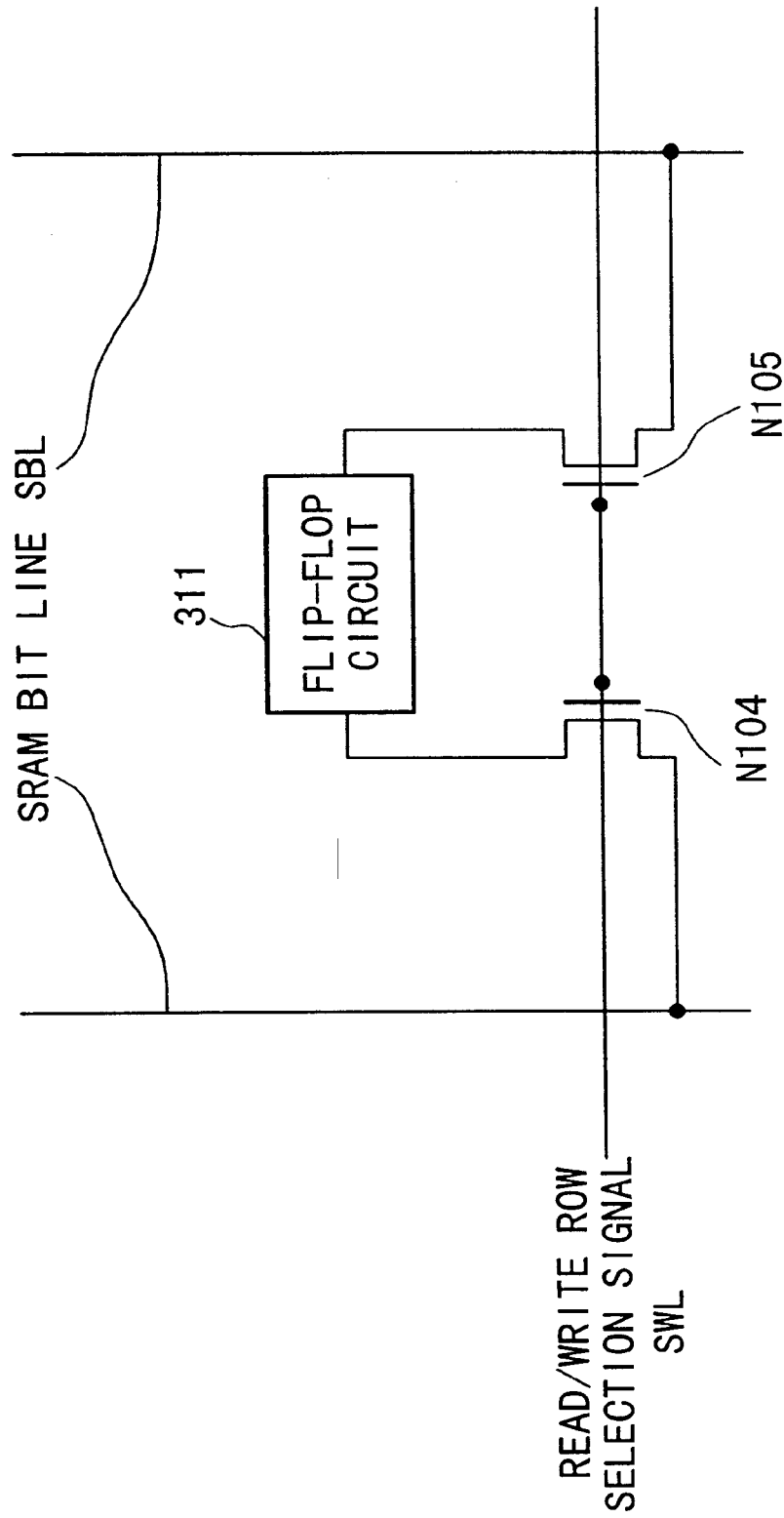

FIG. 56 is a diagram showing a specific circuit example of a connection circuit for connecting SRAM bit lines shown in FIG. 54.

Figure 57:
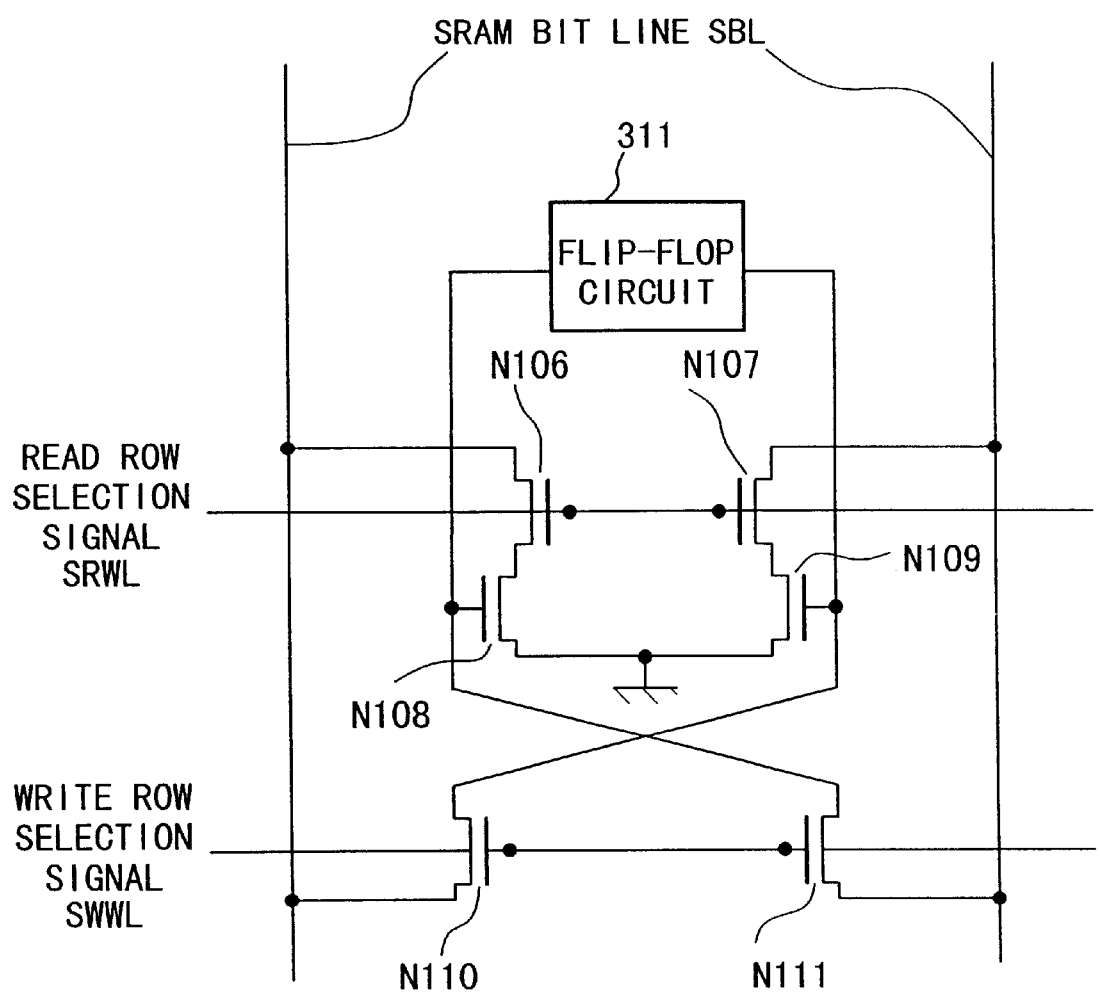
Figure 58:
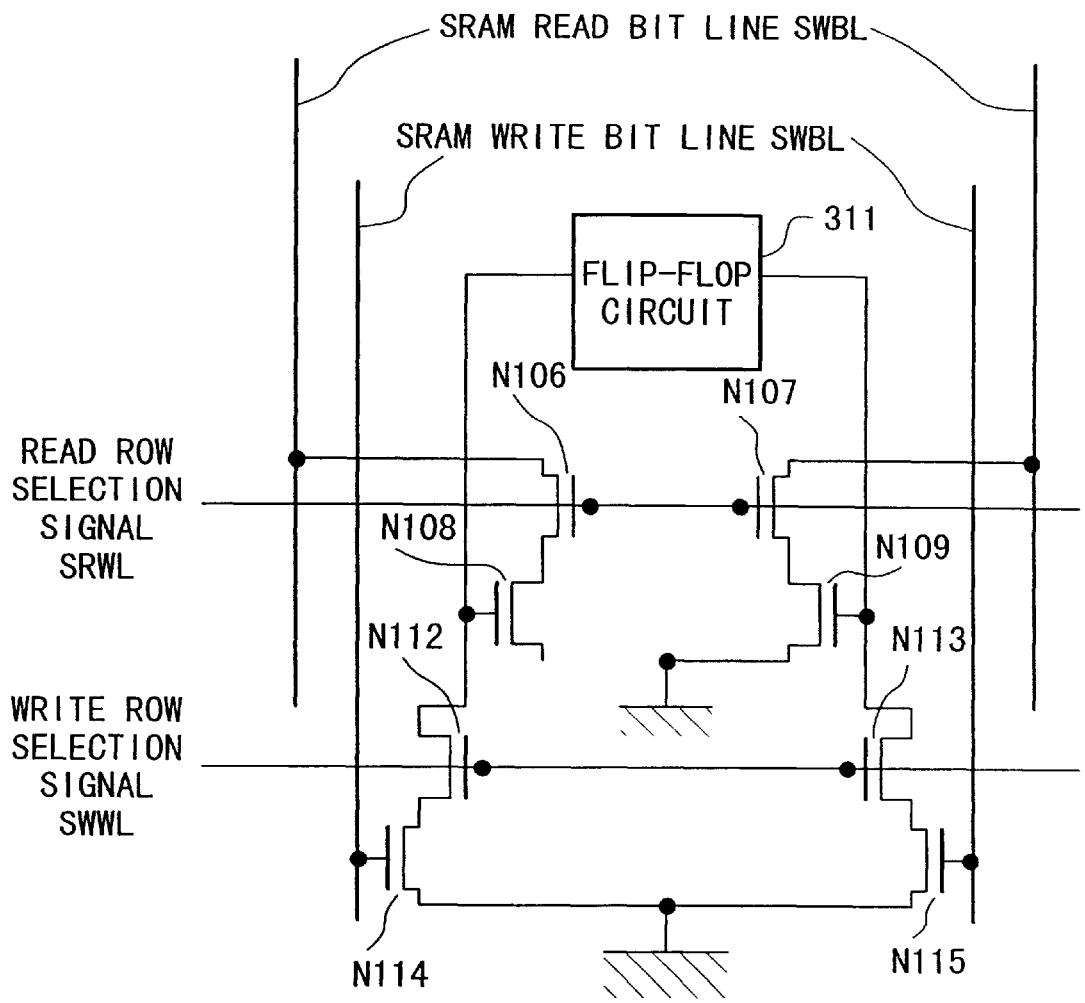

FIG. 57 is a diagram showing a specific circuit example of a connection circuit for connecting SRAM bit lines shown in FIG, 54, FIG. 58 is a diagram showing a specific circuit example of a connection circuit for connecting SRAM bit lines shown in FIG. 54.

Figure 59:
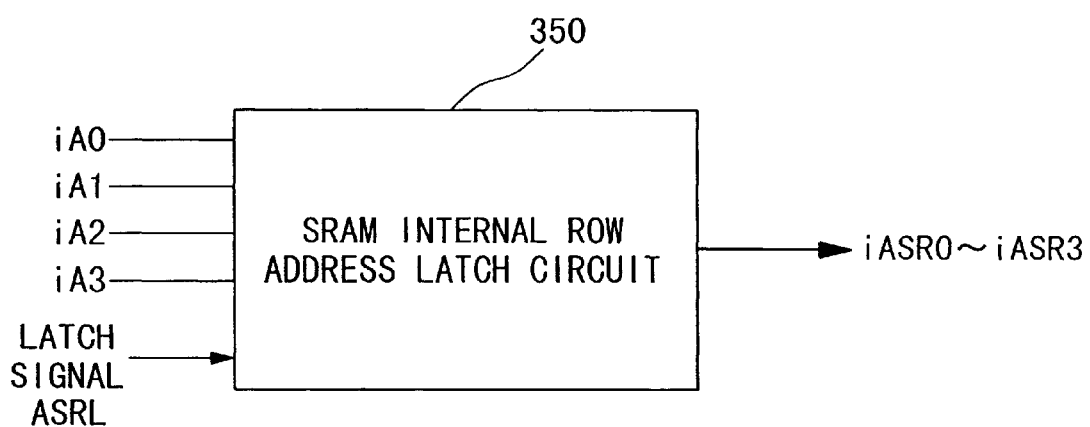

FIG. 59 is a diagram showing one example of a specific circuit configuration of the SRAM row control device shown in FIG. 53.

Figure 60:
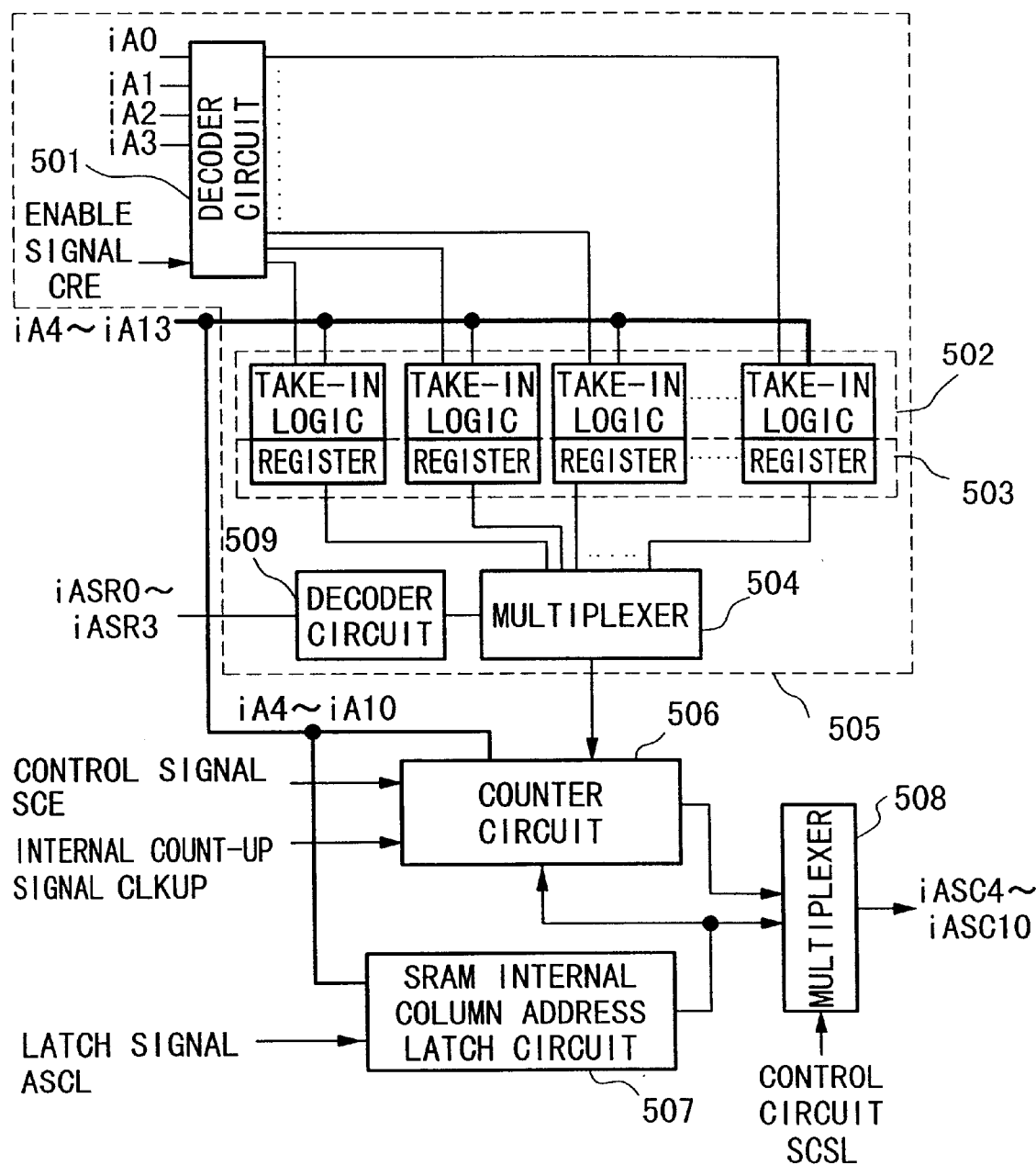

FIG. 60 is a diagram showing one example of a specific circuit configuration of the SRAM column control device shown in FIG. 53.

Figure 61:
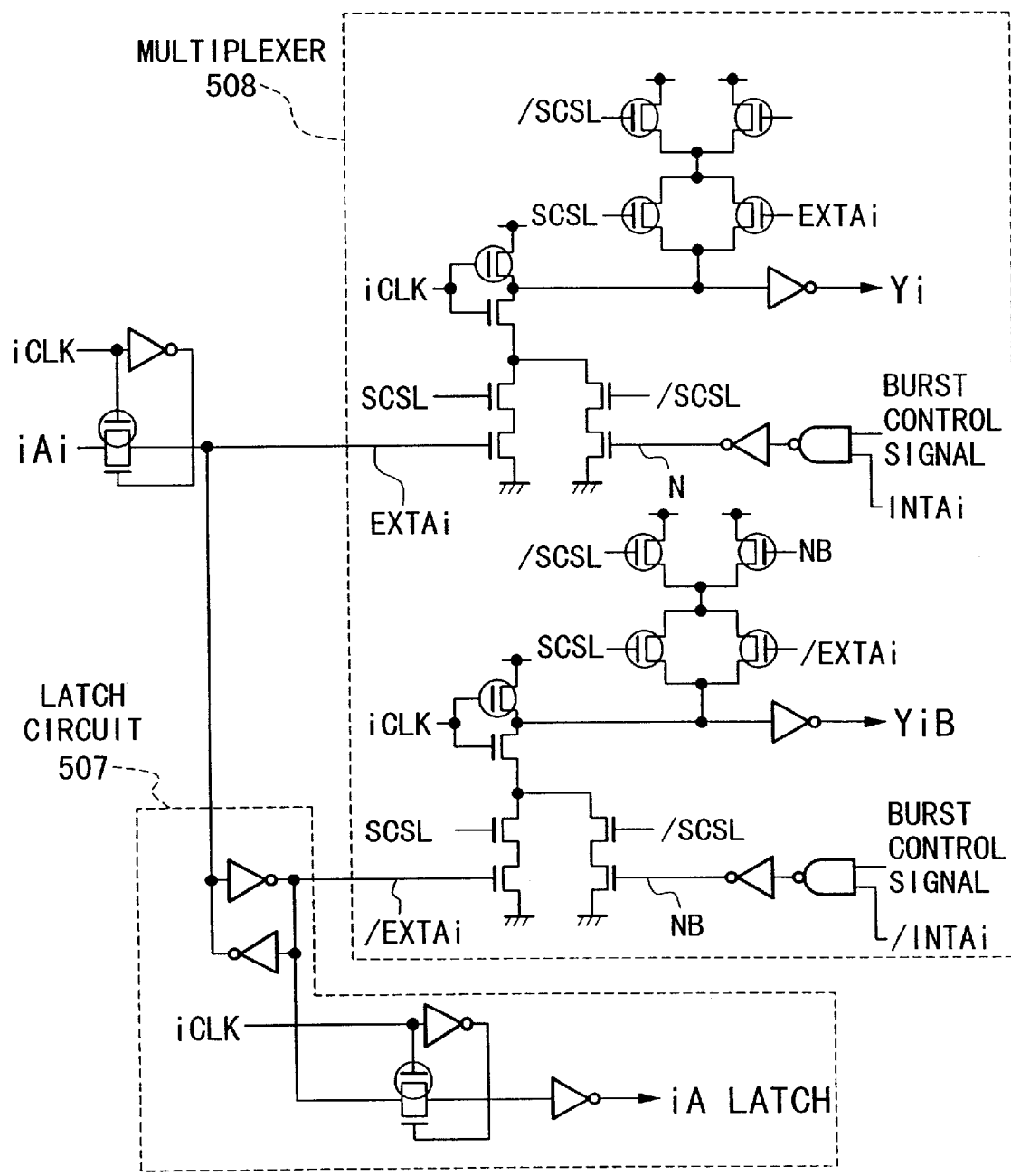

FIG. 61 is a diagram showing one example of a specific circuit of the Multiplexer and latch circuit shown in FIG. 60.

Figure 62:
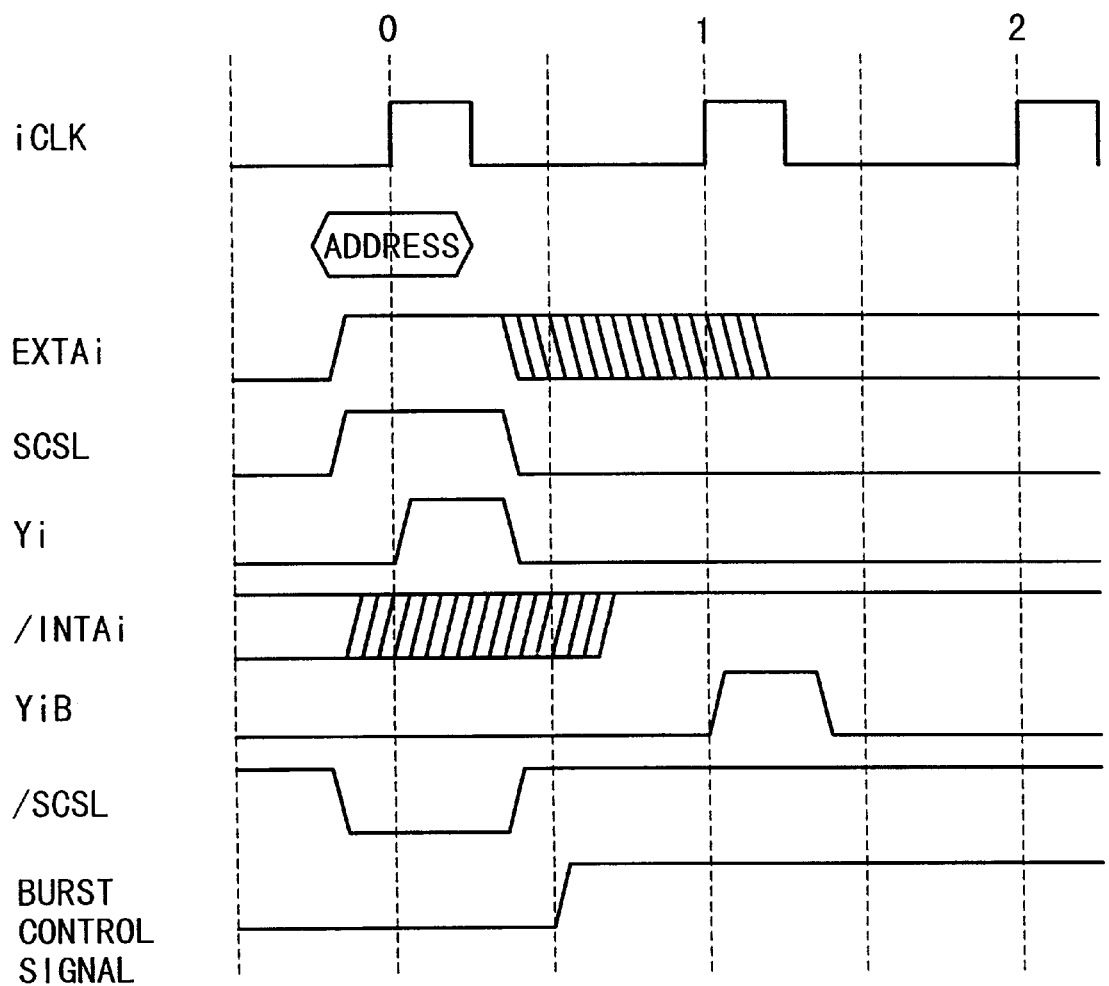

FIG. 62 is a signal wave form diagram showing one example of an internal operation of the multiplexer shown in FIG. 61.

Figure 63:
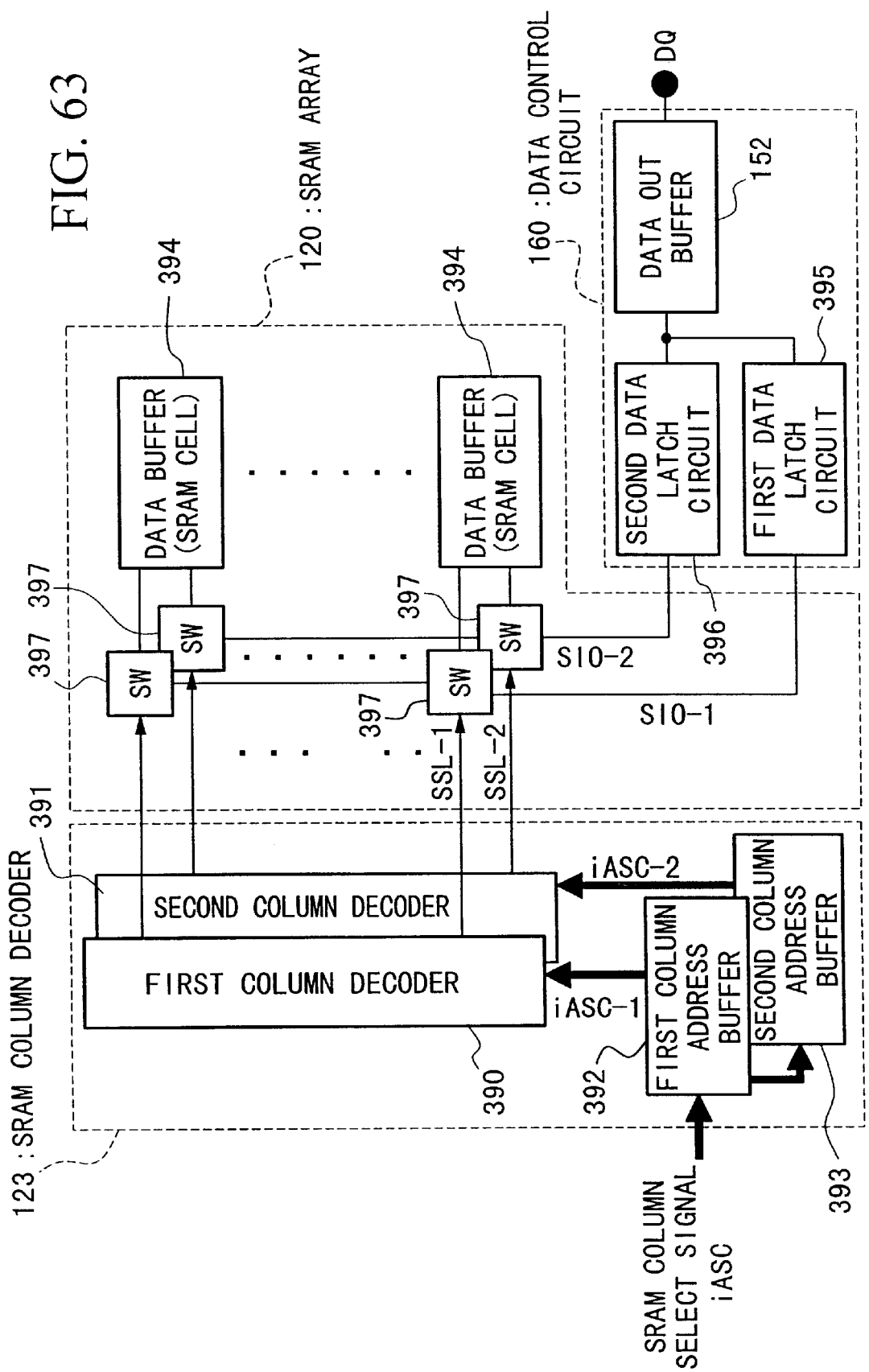

FIG. 63 is a block diagram showing one example of a circuit configuration of the SRAM column decoder, the data control device and the SRAM array shown in FIG. 1.

Figure 64:
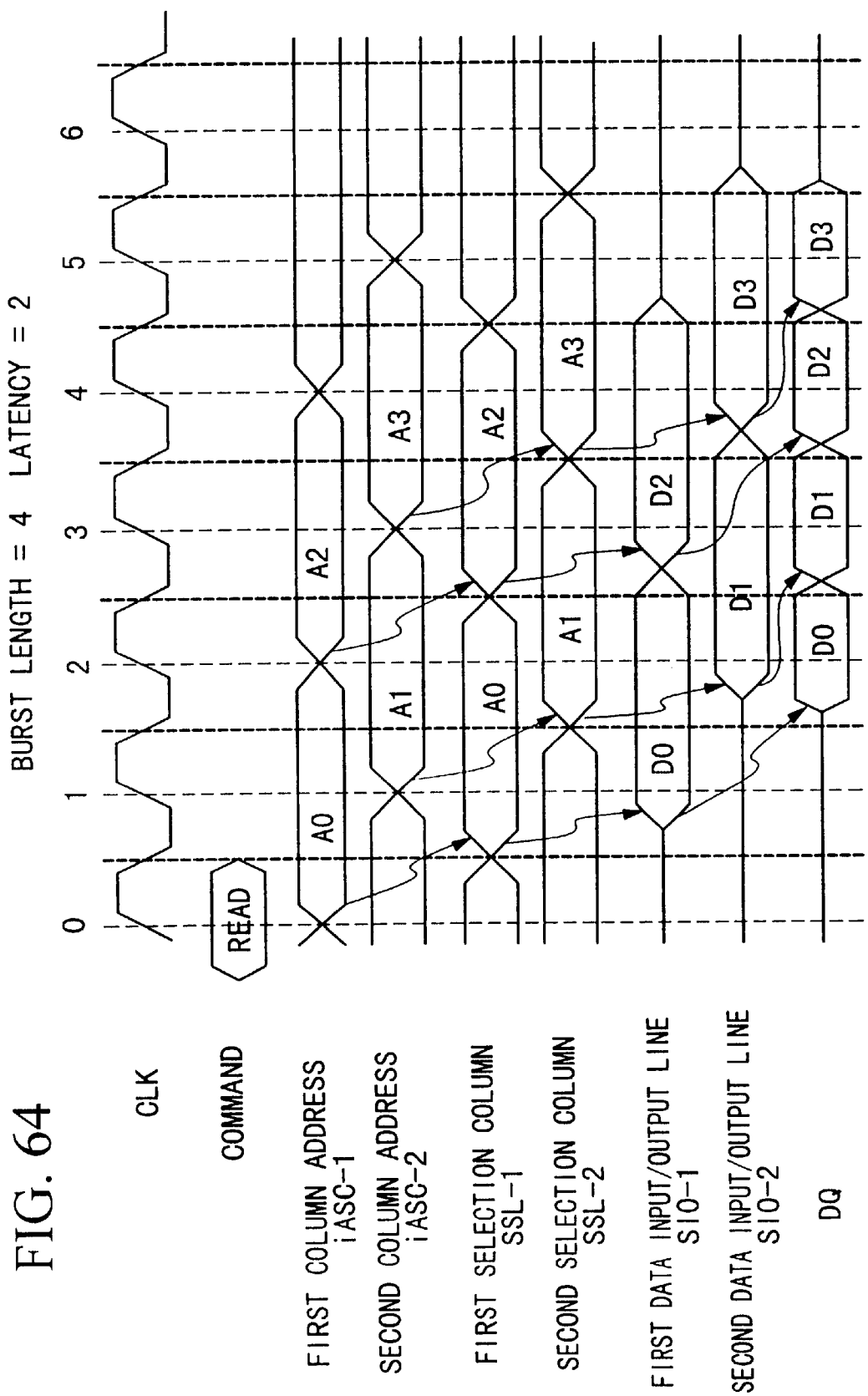

FIG. 64 is a signal wave form diagram showing one example of an internal operation of the SRAM column decoder, the data control device and the SRAM array shown in FIG. 63.

Figure 65:
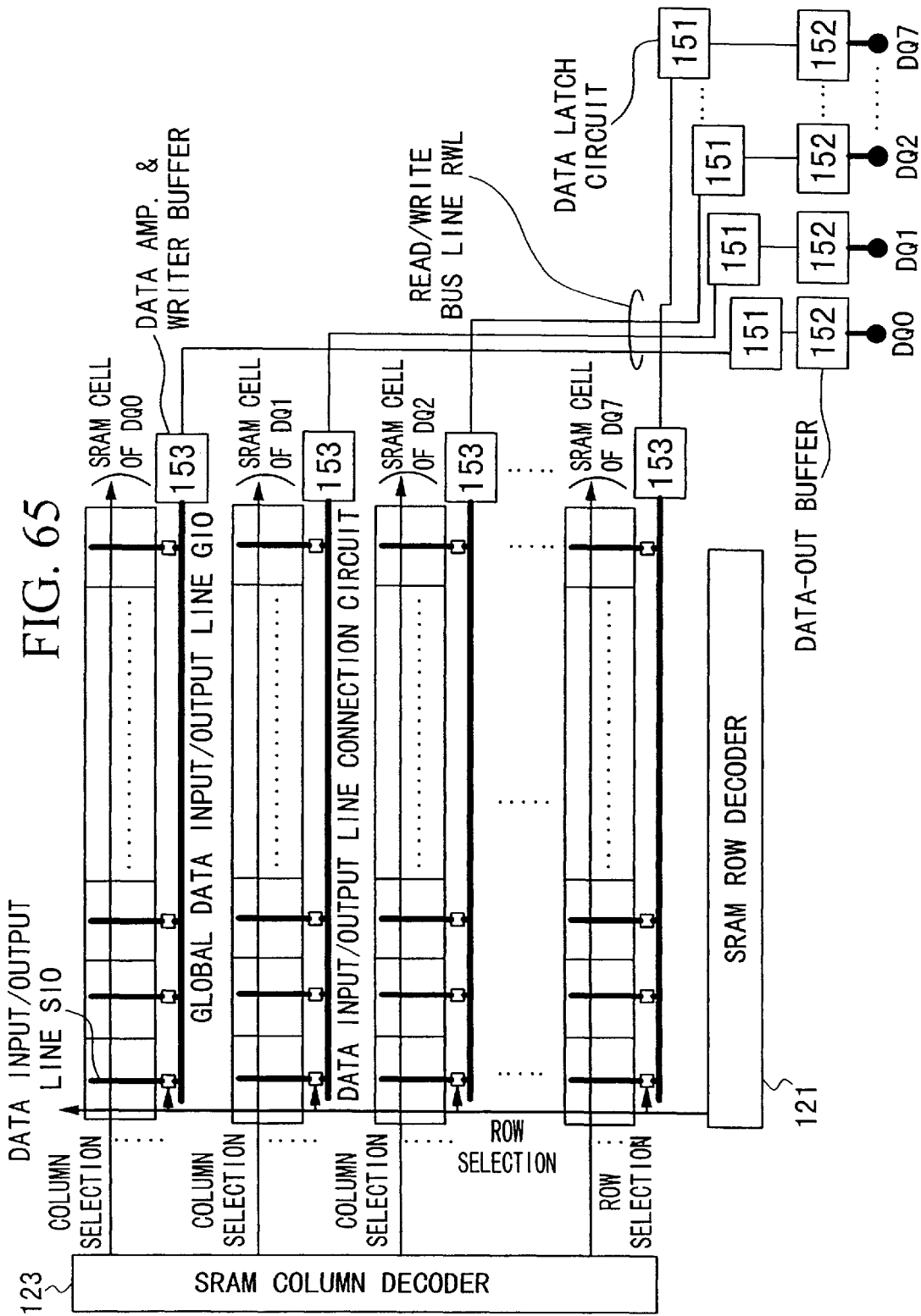

FIG. 65 is a diagram showing a basic configuration for between a SRAM portion and data input/output terminals.

Figure 66:
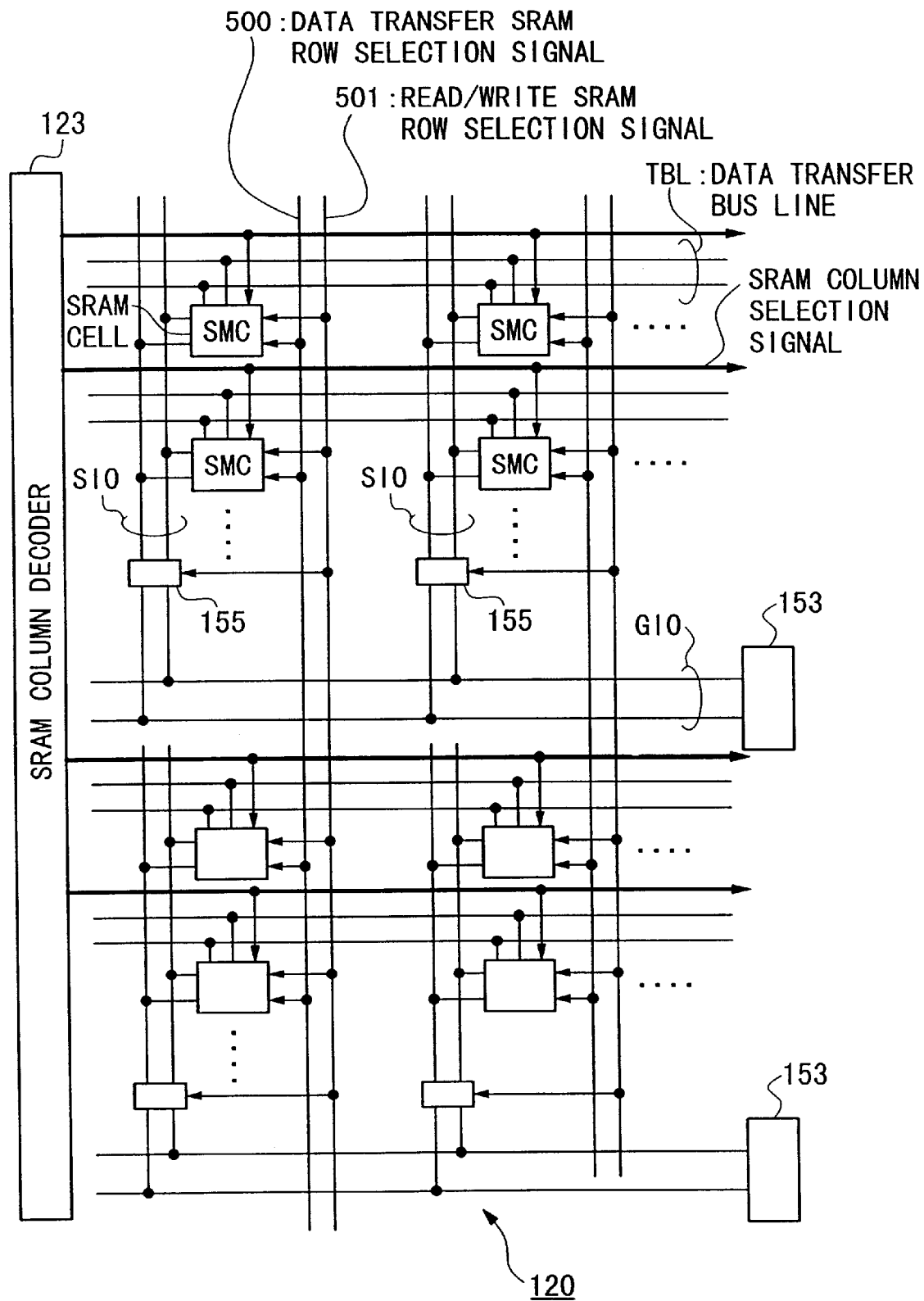

FIG. 66 is a diagram showing a first configuration example of a basic configuration for between a SRAM portion and data input/output terminals.

Figure 67:
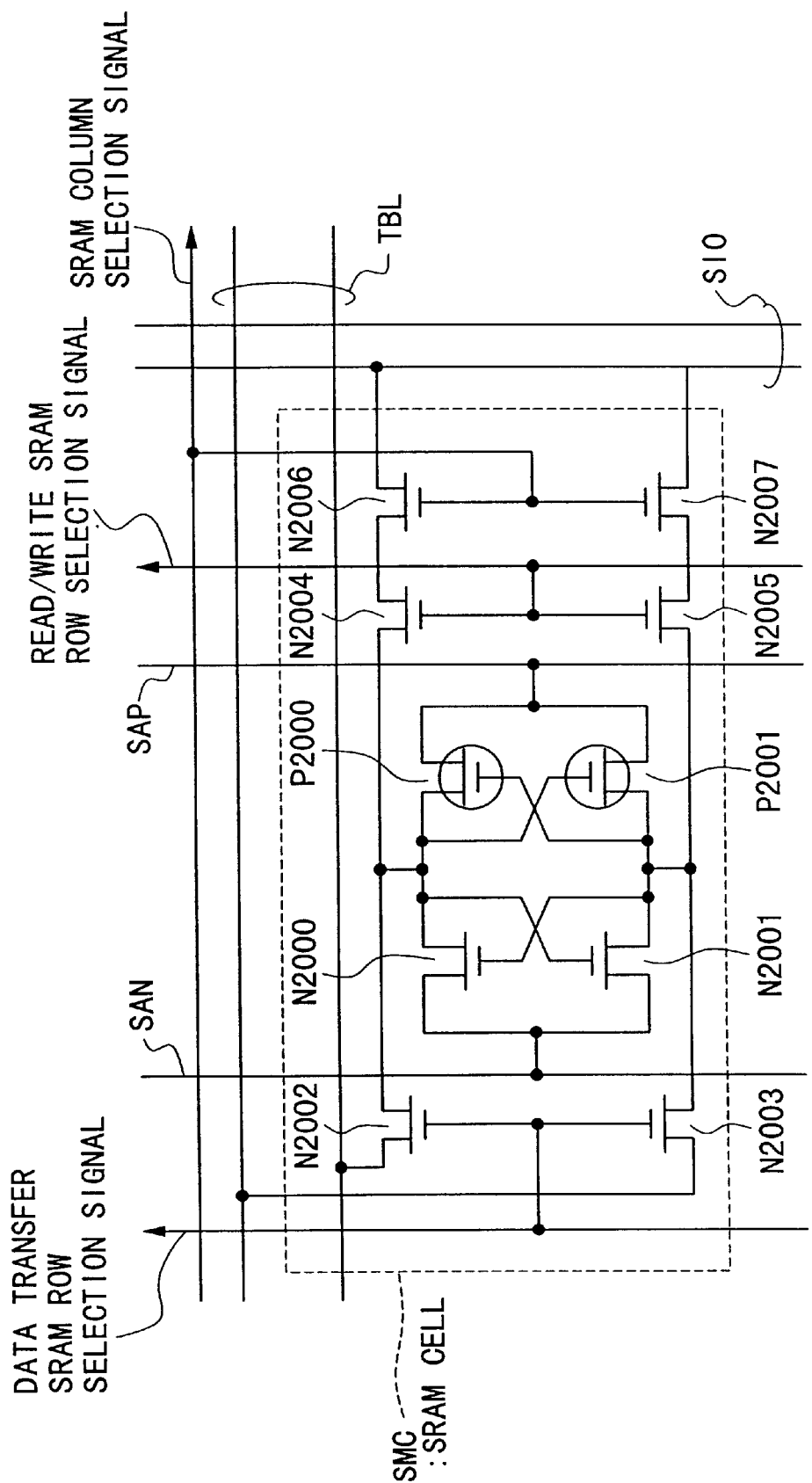

FIG. 67 is a diagram showing a configuration example of a SRAM cell used in the specific configuration for between the SRAM portion and the data input/output terminals shown in FIG. 66.

Figure 68:
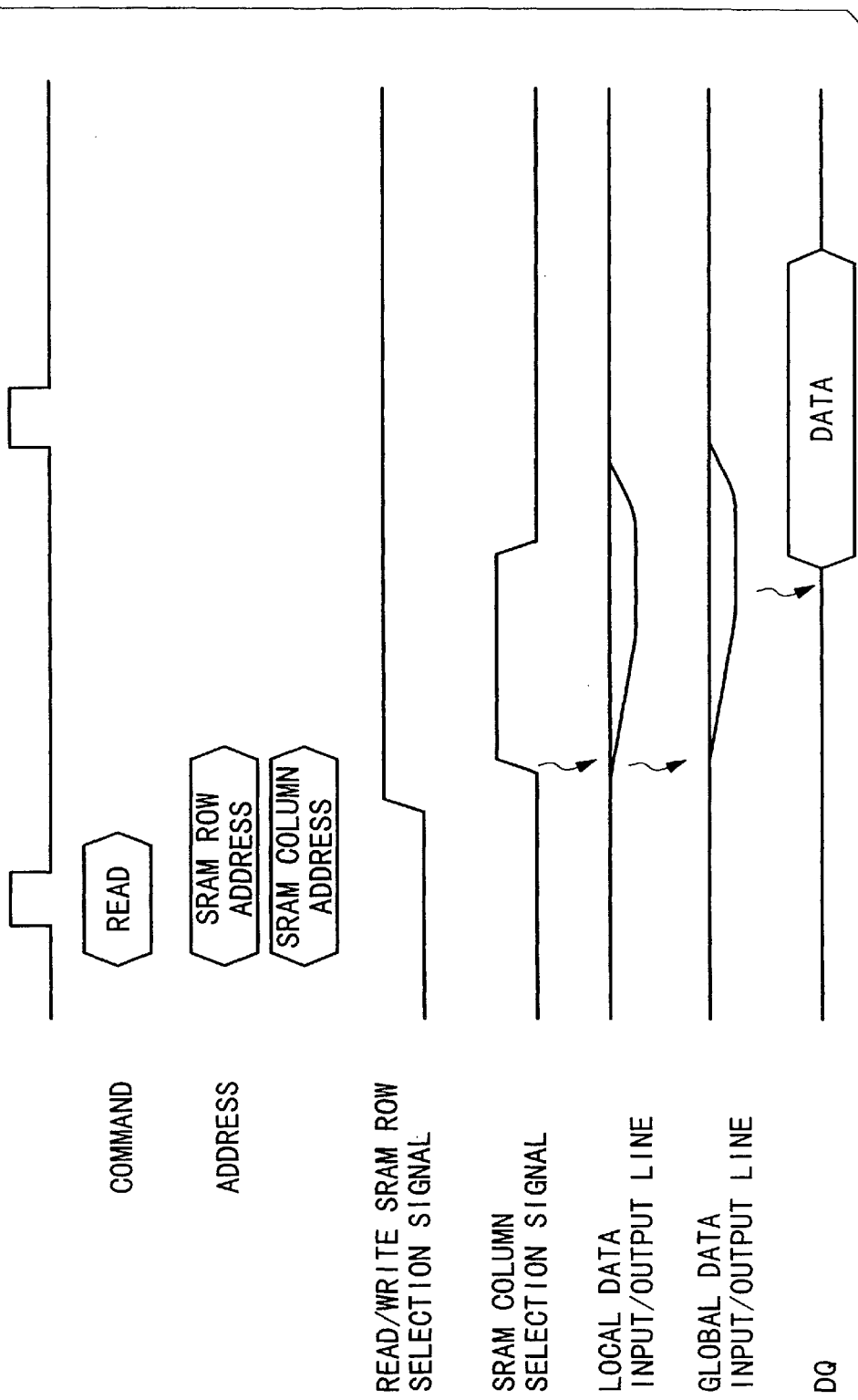

FIG. 68 is a wave form diagram for explaining the operation of a first configuration example for between the SRAM portion and the data input/output terminals shown in FIG. 66.

Figure 69:
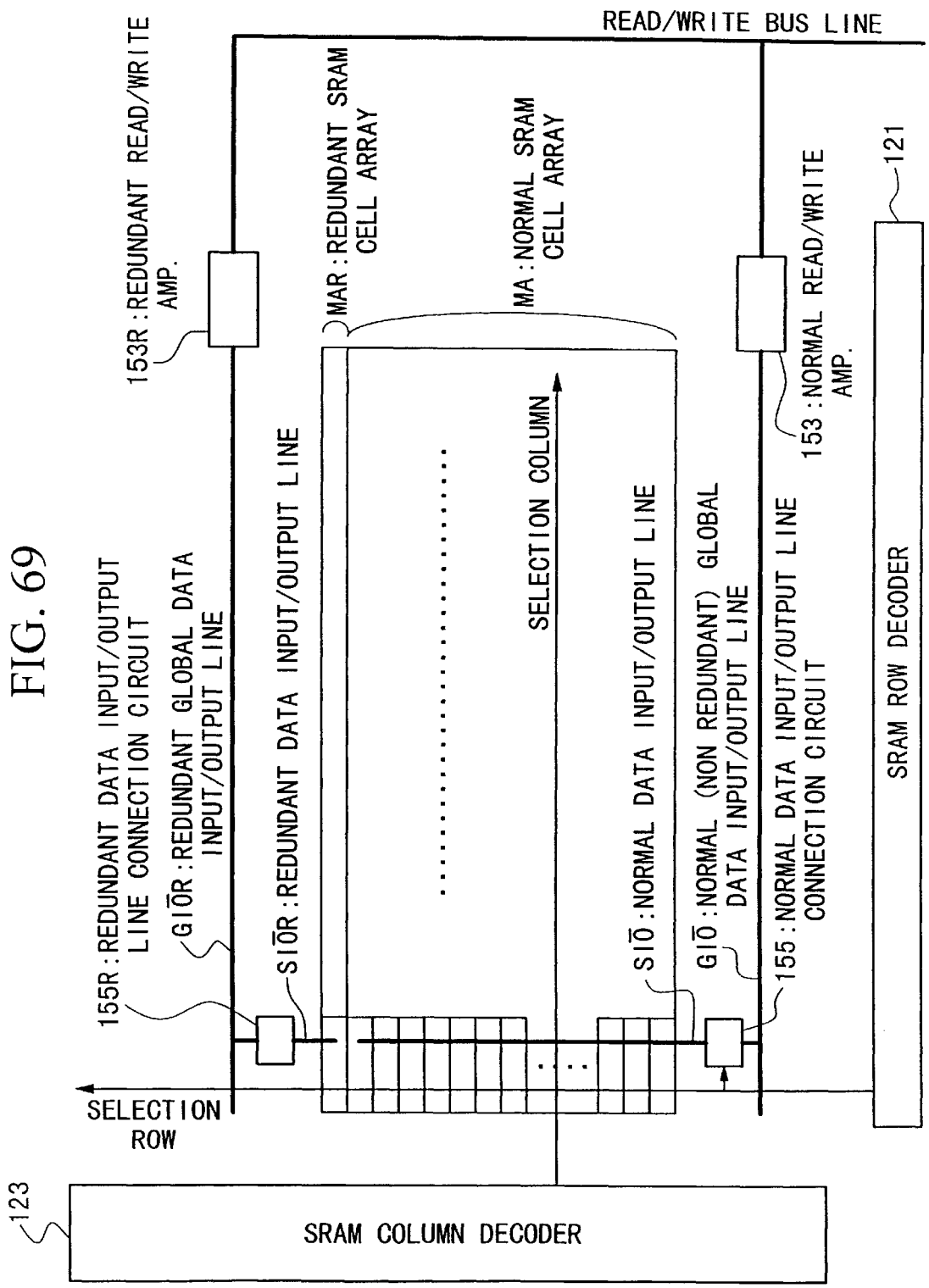

FIG. 69 is a diagram showing a first configuration example for the case where a redundant cell column is provided in the SRAM array portion.

Figure 70:
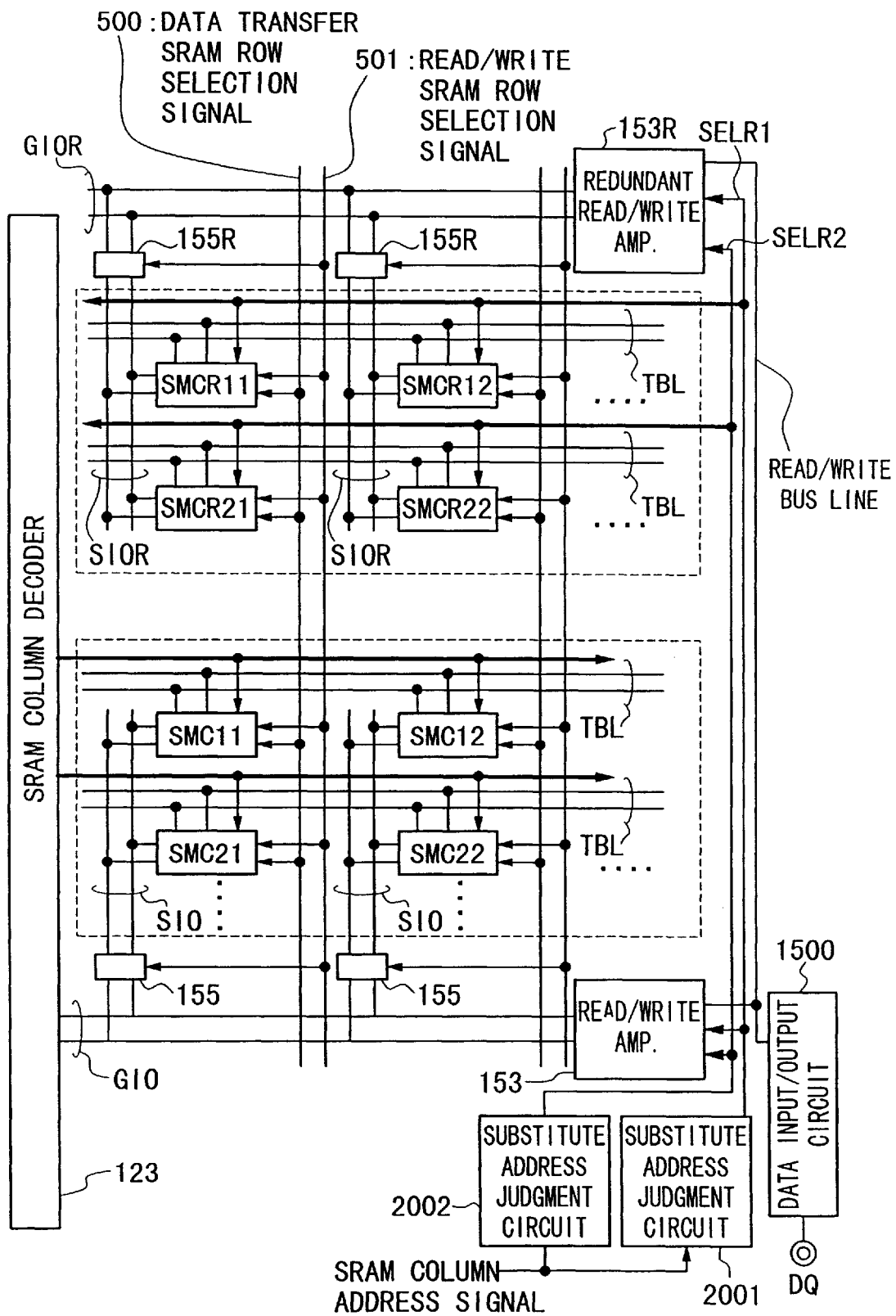

FIG. 70 is a diagram showing details of the first configuration example shown in FIG. 69.

Figure 71:
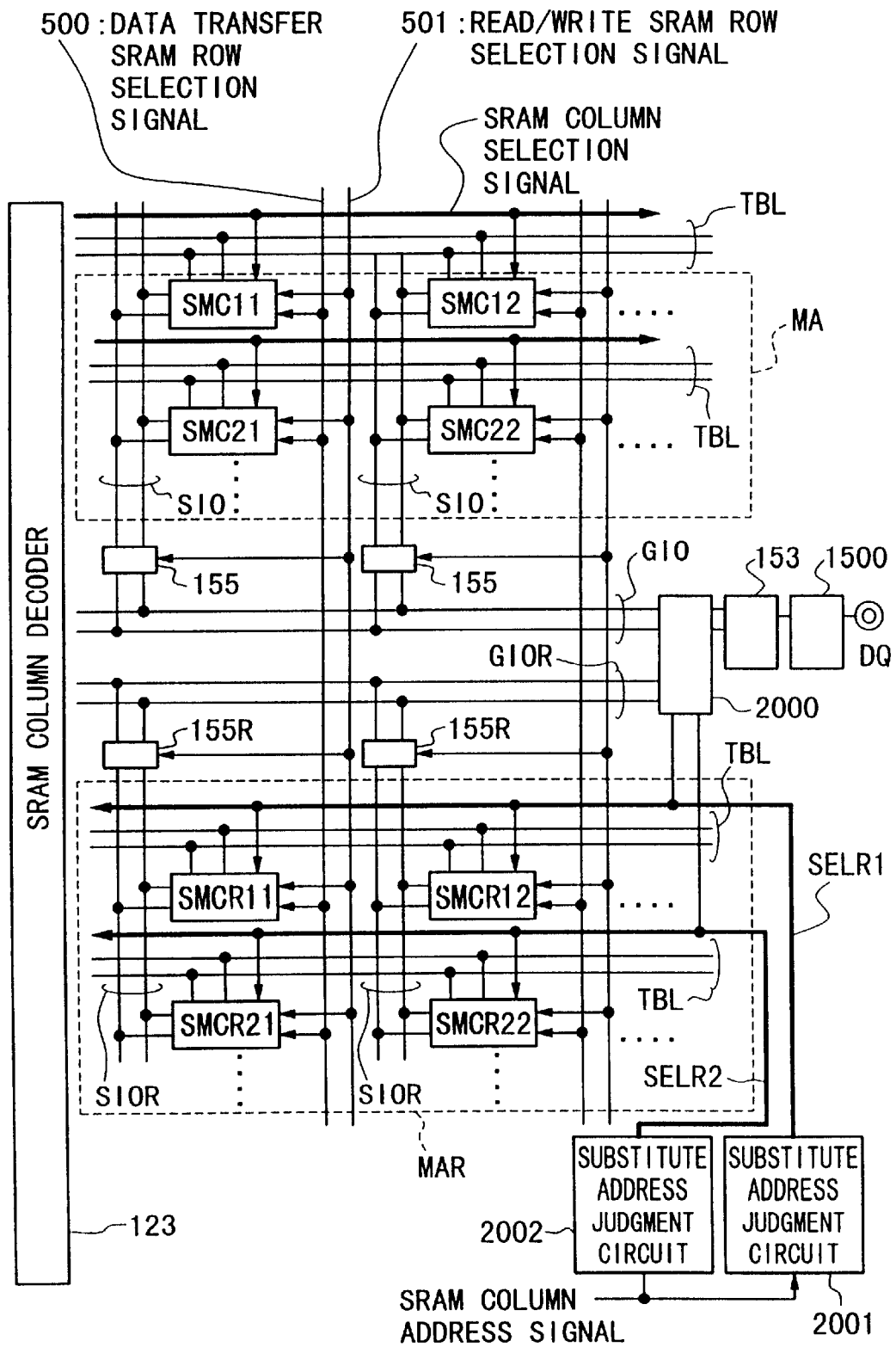

FIG. 71 is a diagram showing details of a second configuration example for the case where a redundant cell column is provided in the SRAM array portion.

Figure 72:
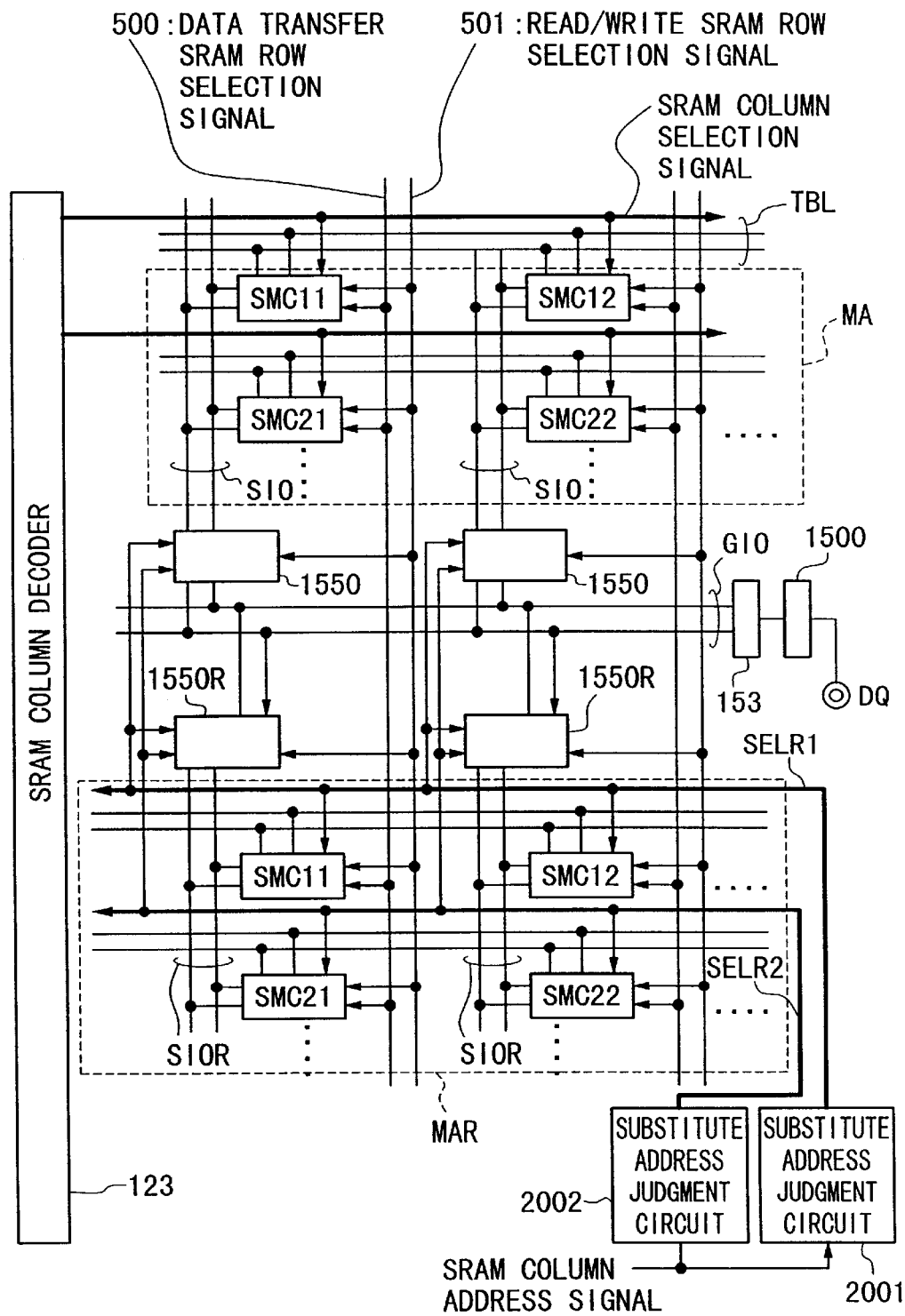

FIG. 72 is a diagram showing details of a third configuration example for the case where a redundant cell column is provided in the SRAM array portion.

Figure 73:
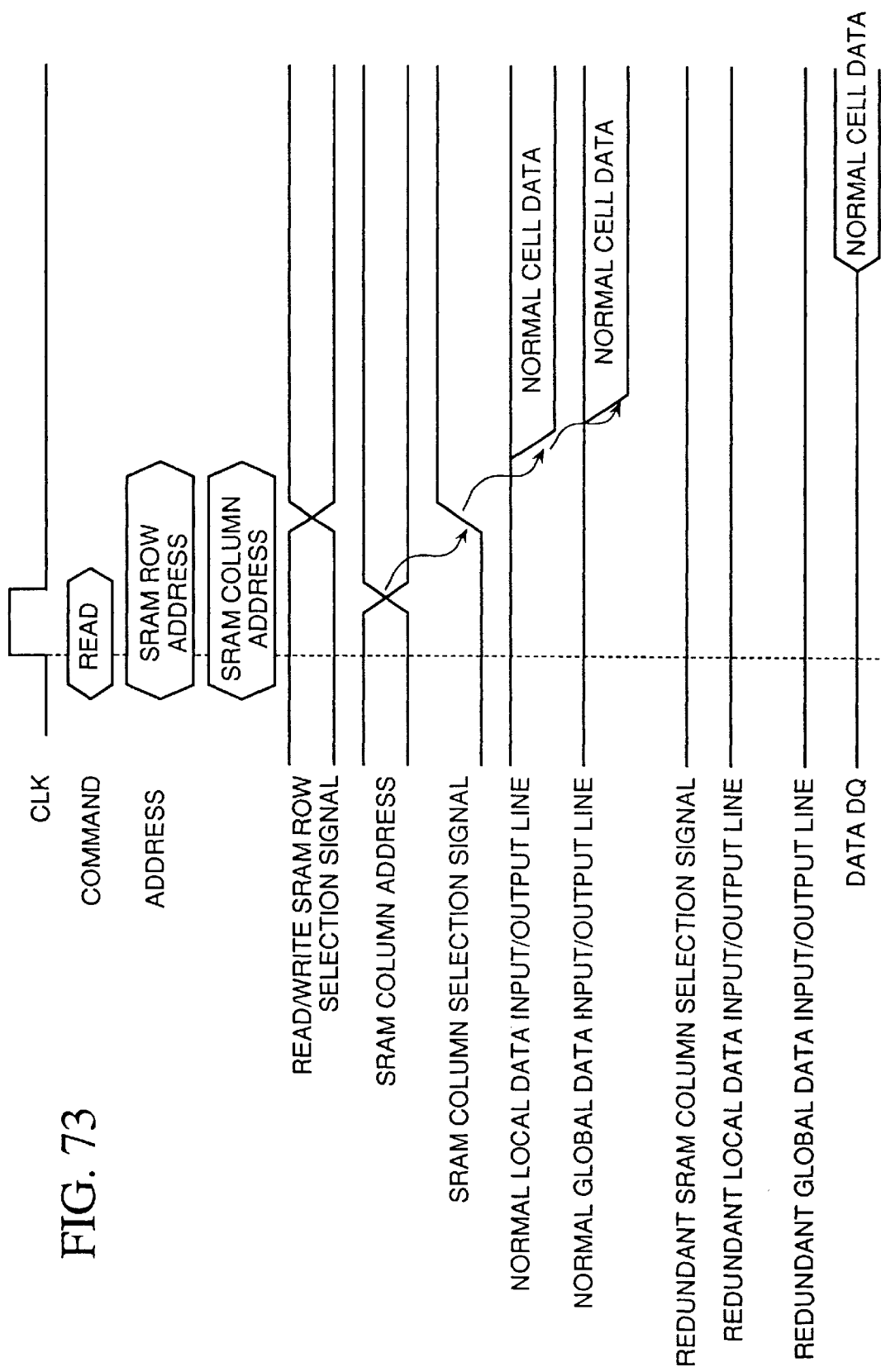

FIG. 73 is a wave form diagram for explaining the operation (normal cell read operation) of the first configuration example for the case where the redundant cell column is provided in the SRAM array portion shown in FIG. 70.

Figure 74:
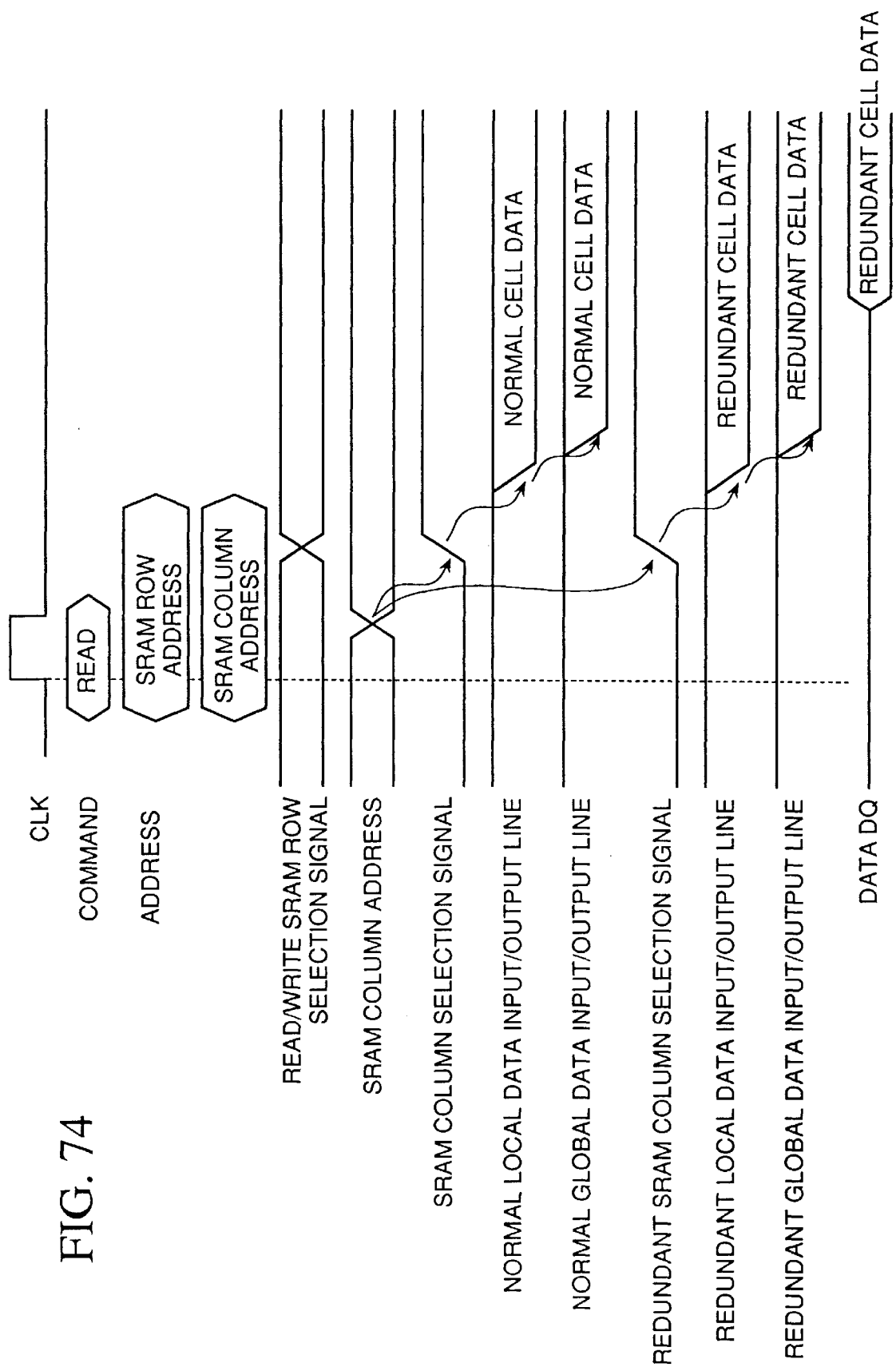

FIG. 74 is a wave form diagram for explaining the operation (redundant cell read operation) of the first configuration example for the case where the redundant cell column is provided in the SRAM away portion shown in FIG. 70.

Figure 75:
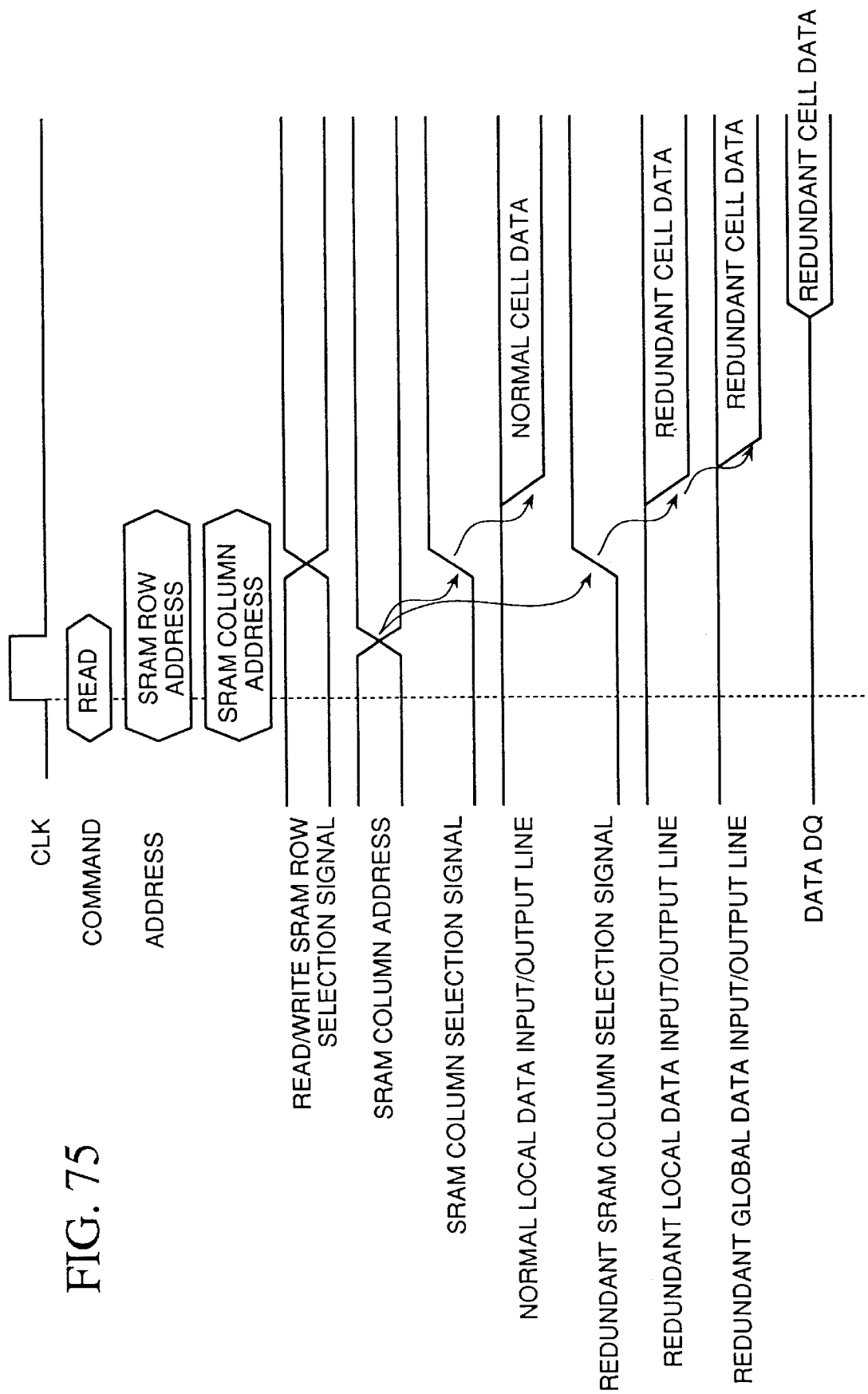

FIG. 75 is a wave form diagram for explaining the operation (redundant cell read operation) of the third configuration example for the case where the redundant cell column is provided in the SRAM array portion shown in FIG. 72.

Figure 76:
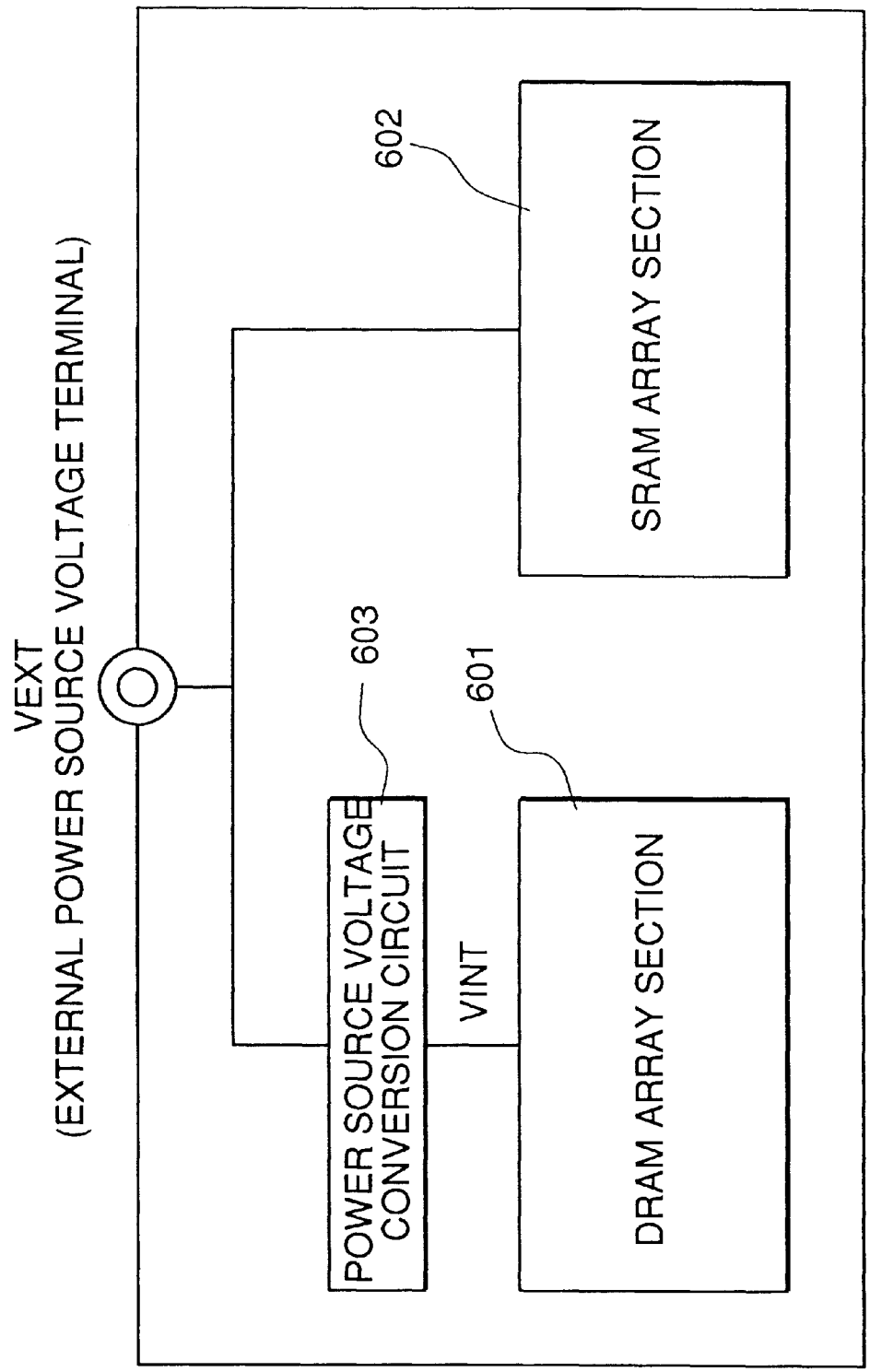

FIG. 76 is a diagram showing one example of a configuration of a power source voltage supplied to the DRAM array portion and the SRAM array portion.

Figure 77:
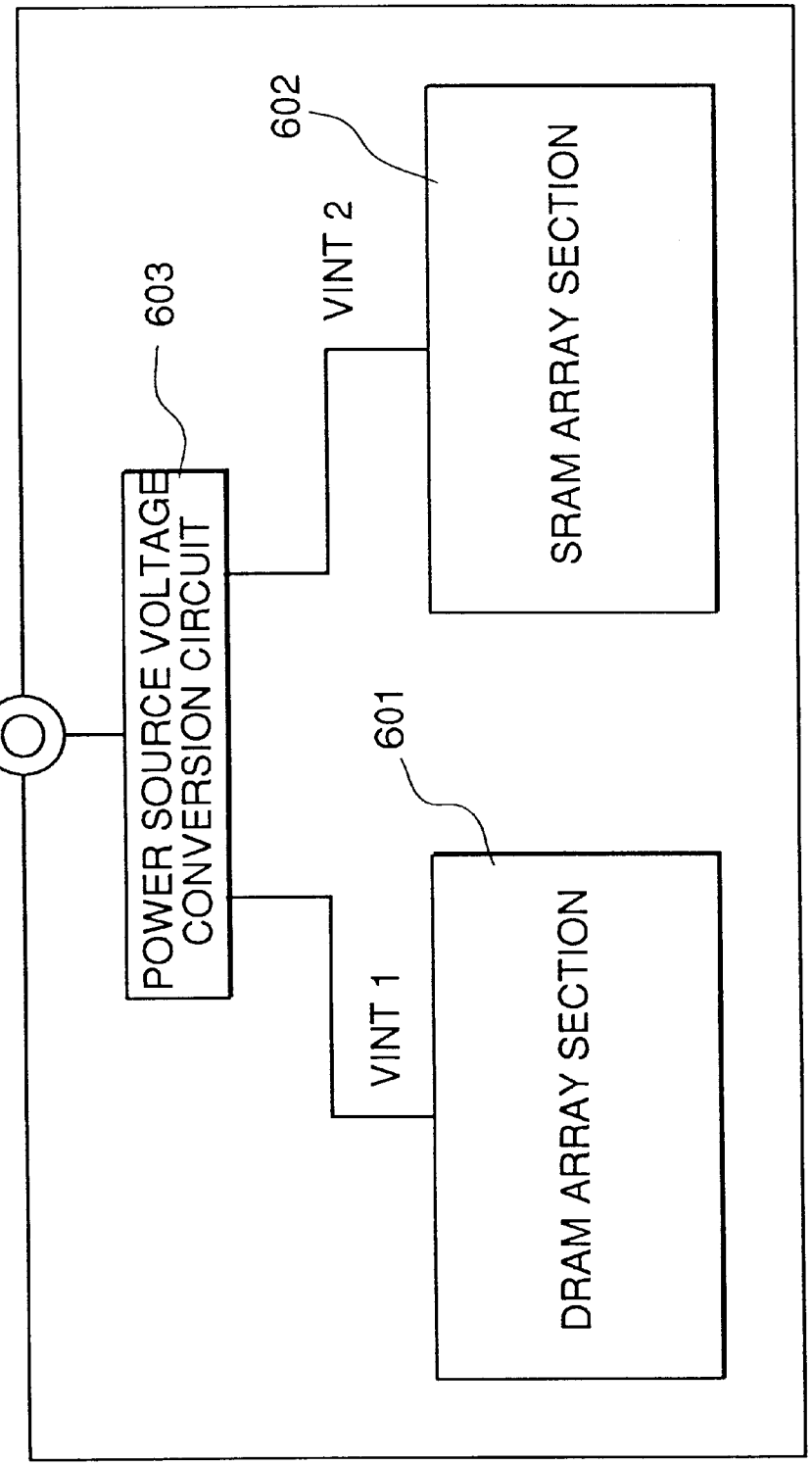

FIG. 77 is a diagram showing one example of a configuration of a power source voltage supplied to the DRAM array portion and the SRAM array portion.

Figure 78:
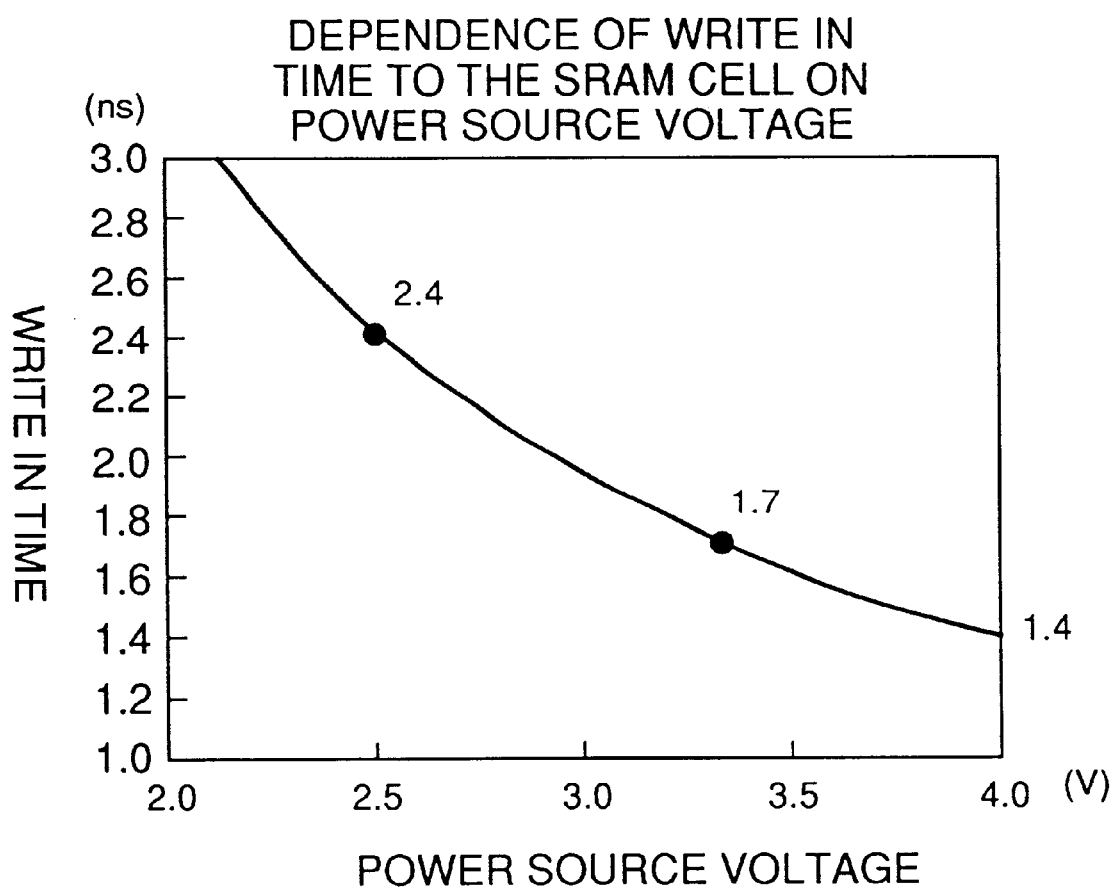

FIG. 78 is a diagram showing simulation results of power source voltage dependence at the time of writing in to the SRAM cell.

Figure 79:
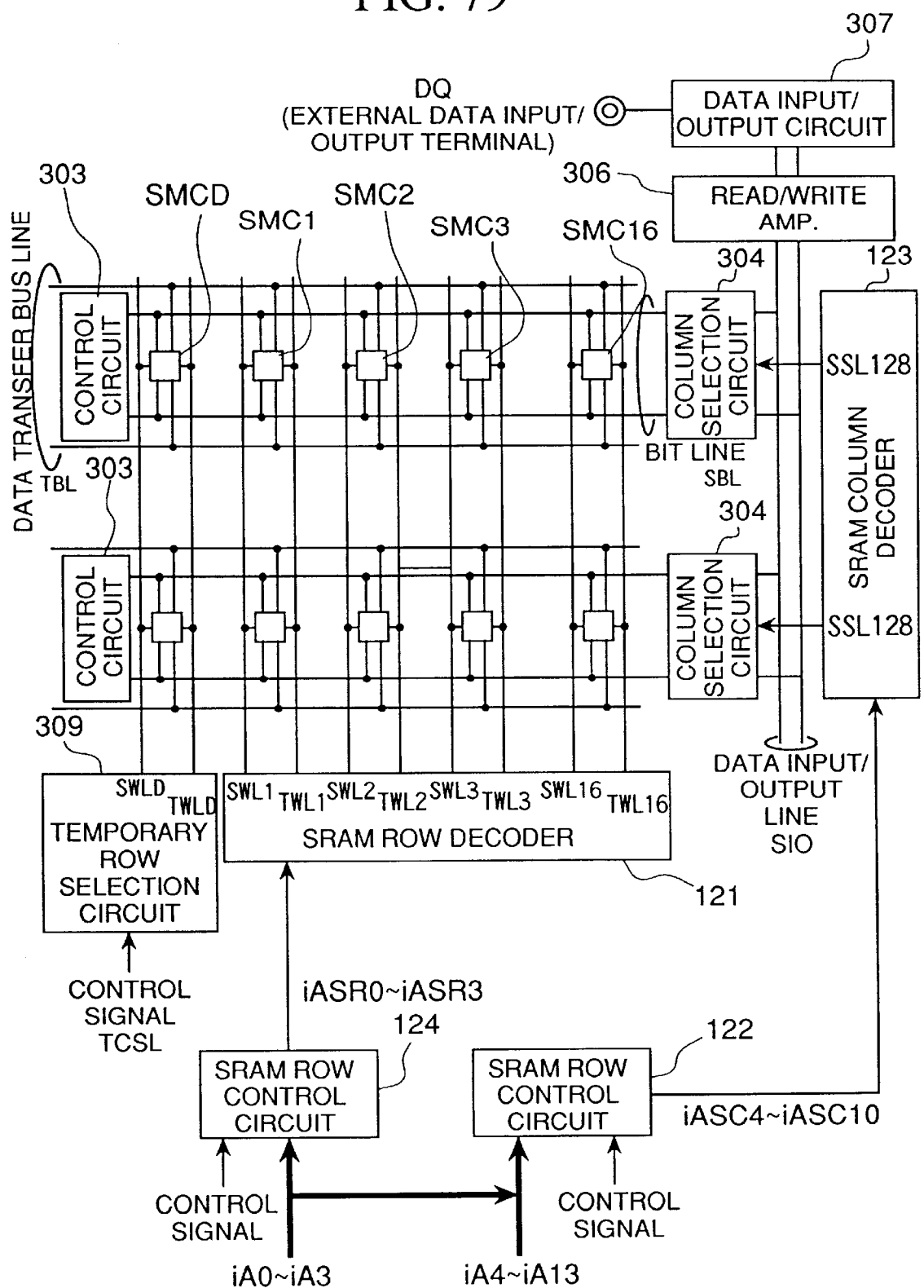

FIG. 79 is a diagram showing one example of a specific configuration of a SRAM array portion for realizing a temporary cell transfer function.

Figure 80:
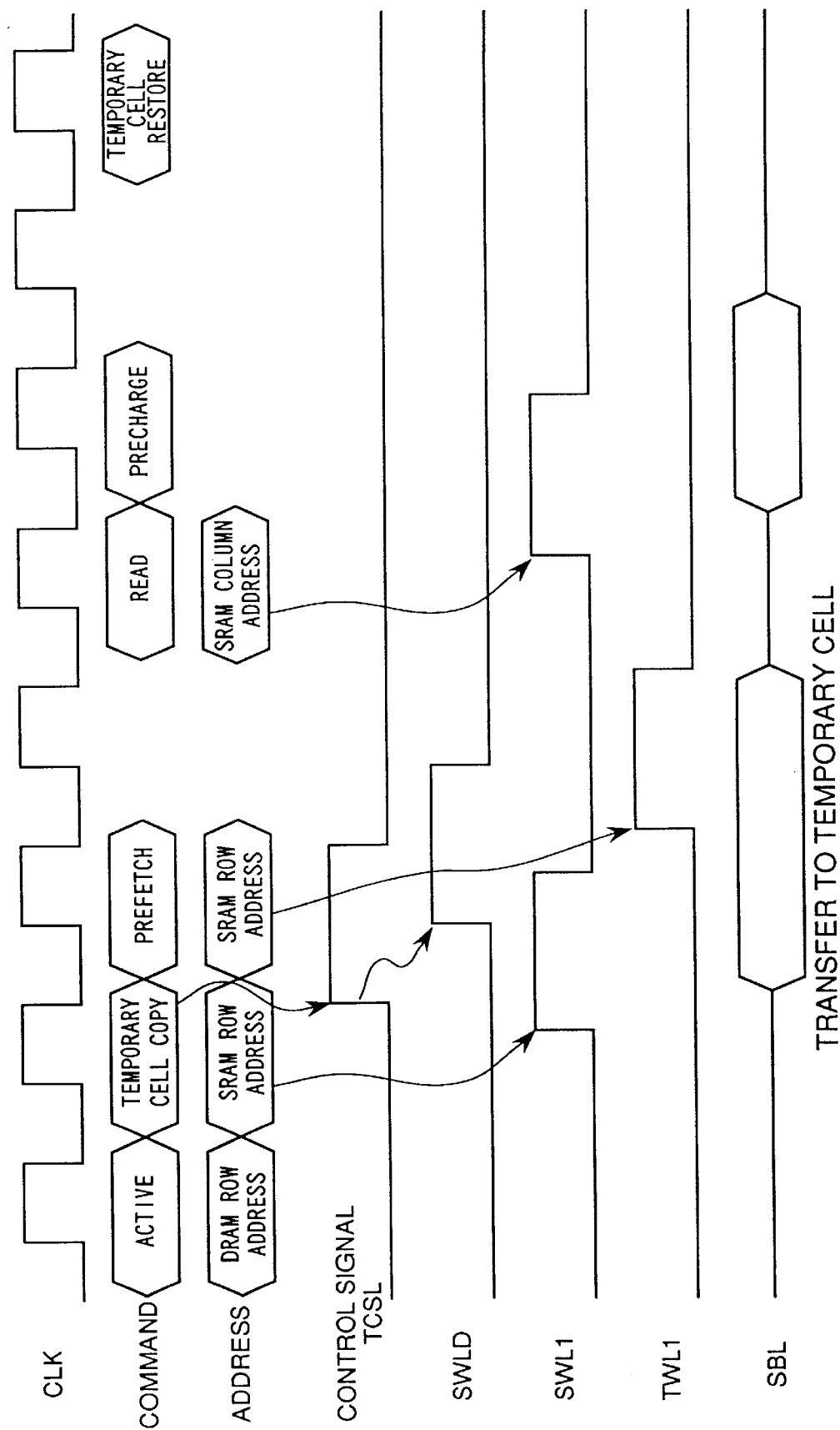

FIG. 80 is a signal wave form diagram showing one example of an internal operation of an interior for the case where in FIG. 79, a temporary cell transfer is made and data of the SRAM cell is read.

Figure 81:
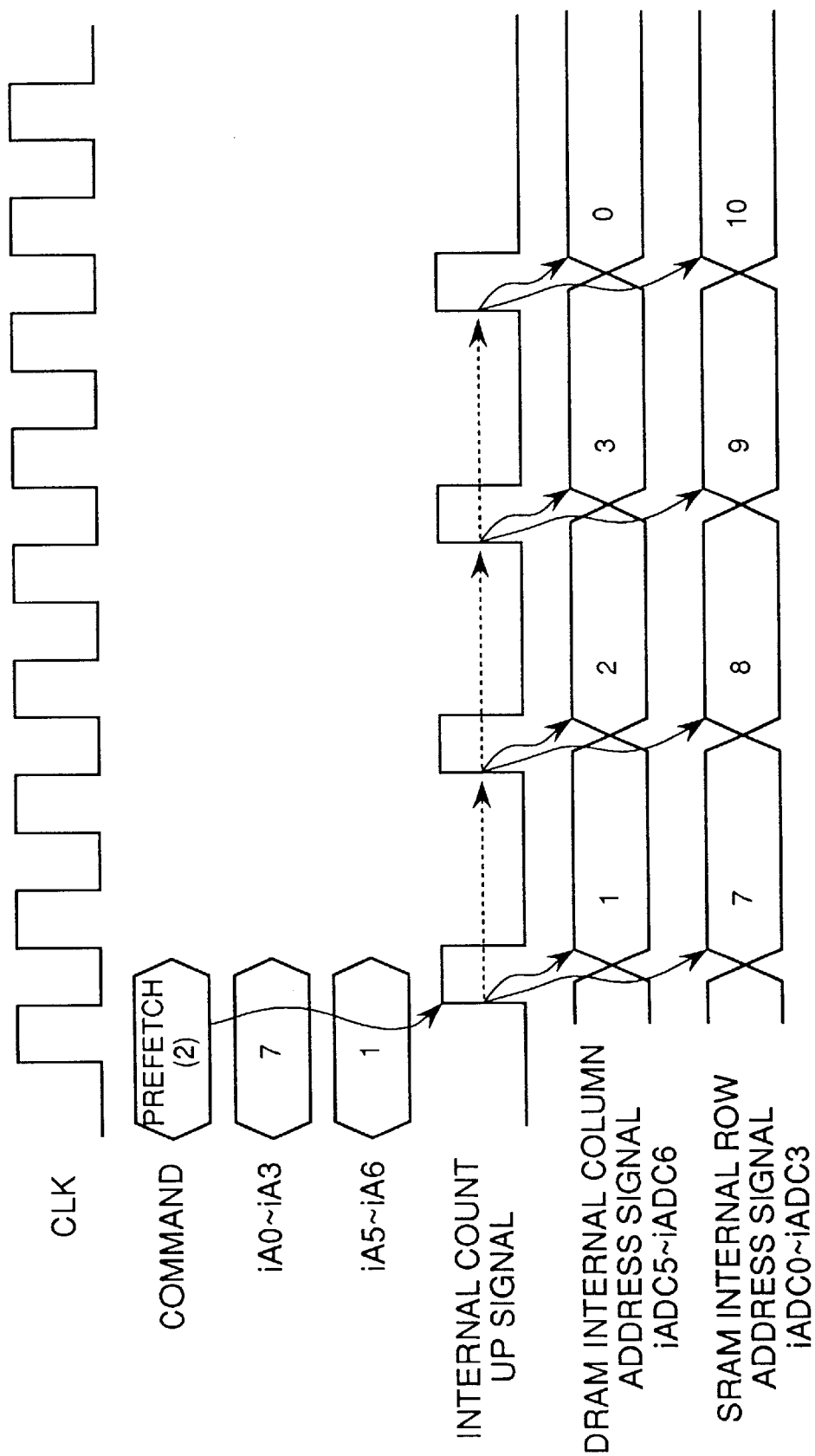

FIG. 81 is a signal wave form diagram showing one example of an internal operation of an auto continuous prefetch transfer function.

Figure 82:
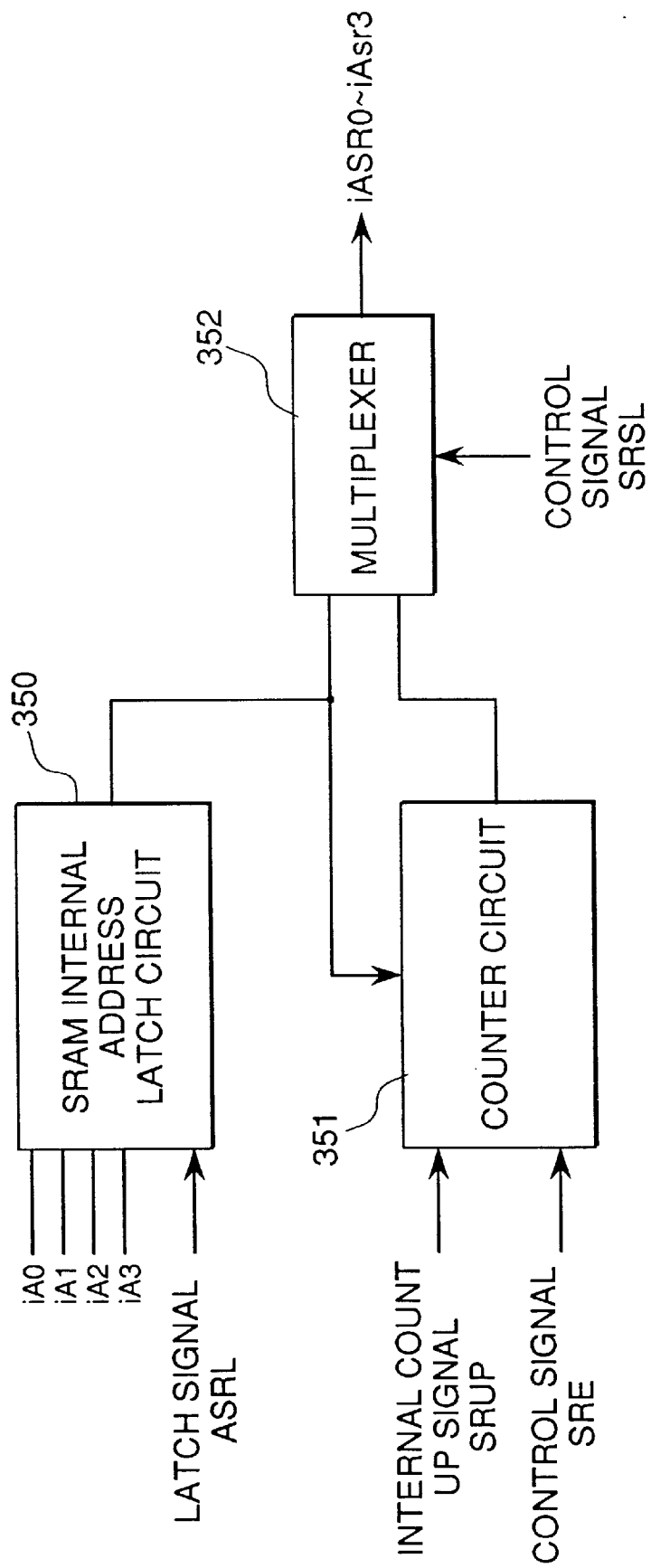

FIG. 82 is a diagram showing one example of a basic configuration of a SRAM row control device for realizing a multiple row continuous read/write function.

Figure 83:
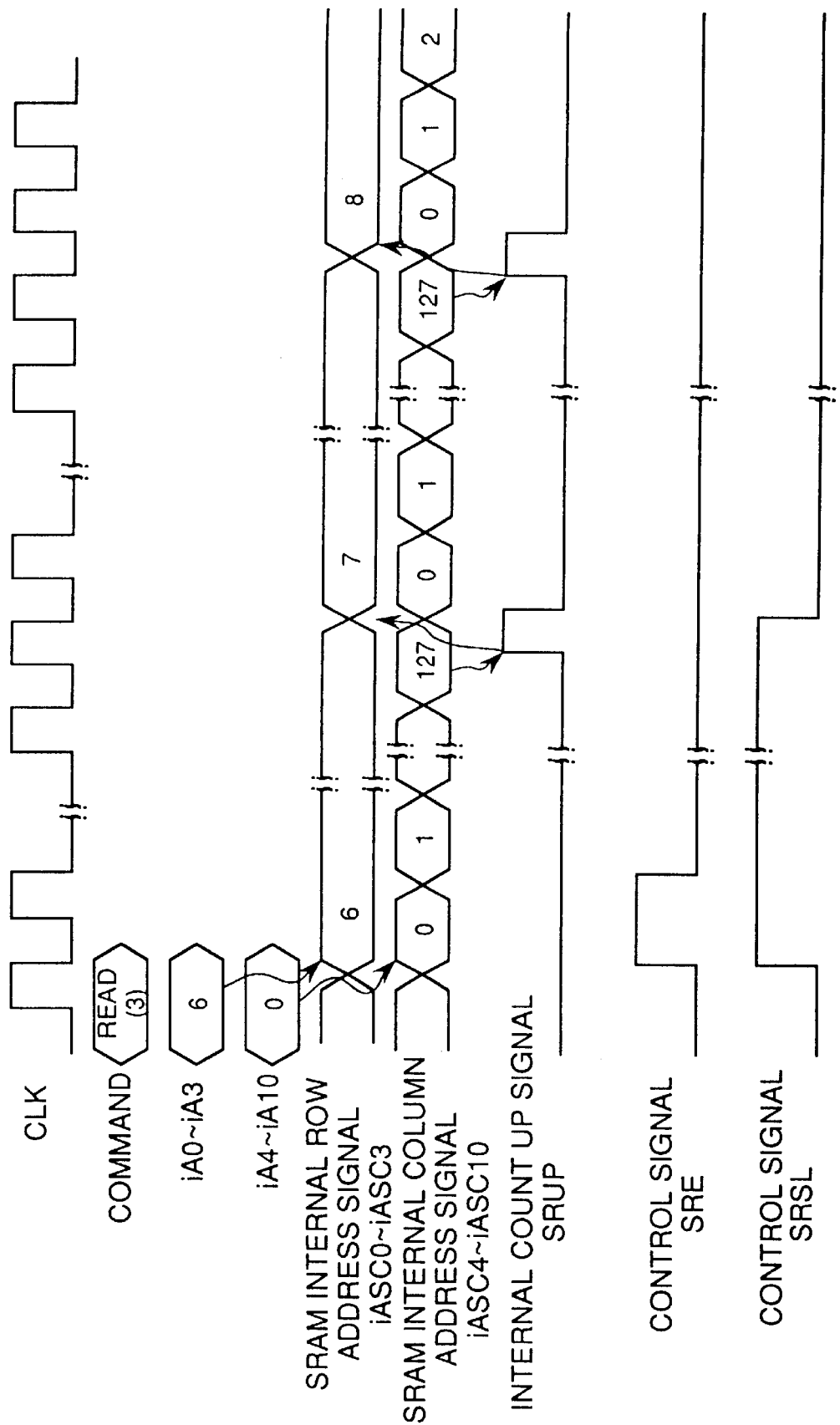

FIG. 83 is a signal wave form diagram showing one example of an internal operation of a read function, of the multiple row continuous read/write function.

FIG. 84 is a diagram showing a real time mode setting function correspondence table for a read (3)/write (3) command and respective input terminal conditions.

Figure 85:
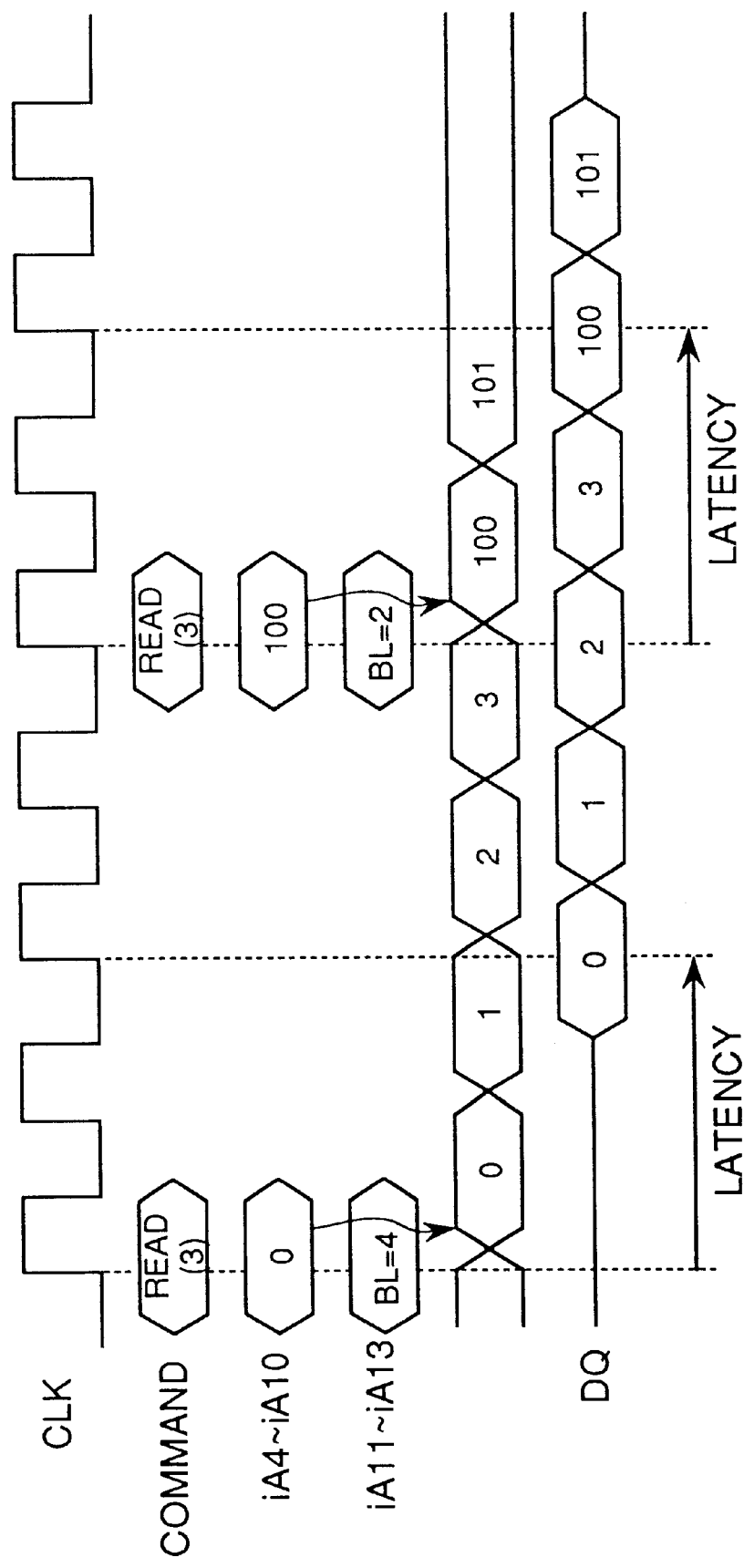

FIG. 85 is a signal wave form diagram showing one example of an internal operation of the real time mode setting function.

Figure 86:
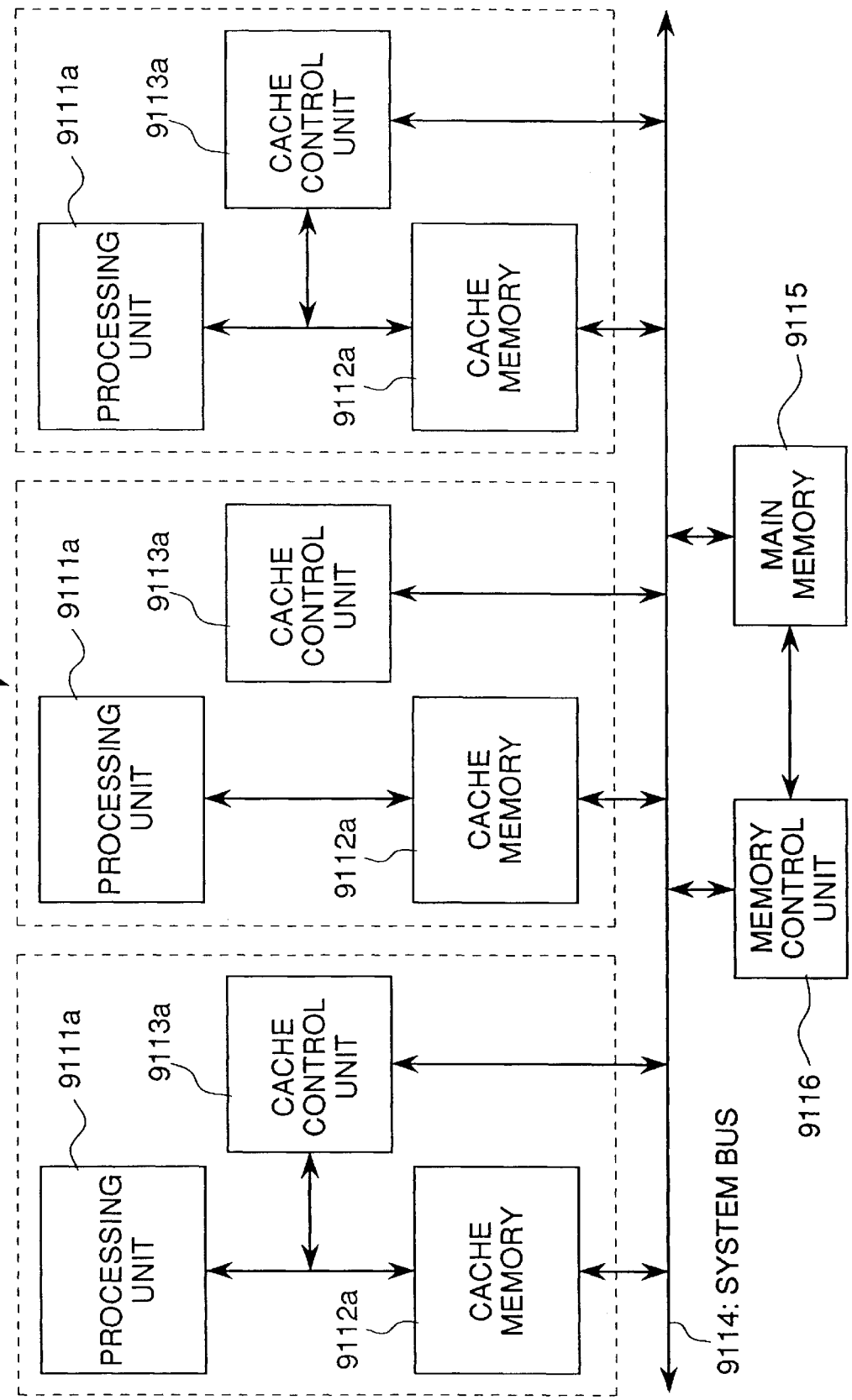

FIG. 86 is a block diagram schematically showing the configuration of a memory system having a plurality of processing units.

DETAILED DESCRIPTION OF THE INVENTION

As follows is a description of embodiments of the invention with reference to the drawings.

(1) Basic Components

Hereunder is a description of basic components of one embodiment of the present invention.

The semiconductor integrated circuit device according to the present invention includes a semiconductor memory device and a controller for the semiconductor memory device. The semiconductor memory device has a main storage portion and an auxiliary storage portion, and is constructed so that two way data transfer is possible between the main storage portion and the auxiliary storage portion. Furthermore, the auxiliary storage portion comprises a plurality of storage cell groups. The respective storage cell groups of the auxiliary storage portion are able to function as respective independent caches. Moreover, in the semiconductor memory device of the present invention, it is also possible to have the number of control terminals and address terminals, the same number as the number necessary for controlling the main storage portion.

Hereunder the description will mainly center on an embodiment of a semiconductor memory device having a 64M bit DRAM array as a main storage portion, and having a synchronous interface of a x8 bit 2 byte configuration having a 16K bit SRAM array as an auxiliary storage portion. However the present invention is not limited to this configuration.

(2) Block Diagram

FIG. 1 is a block diagram schematically showing the overall configuration of a semiconductor memory device according to one embodiment of the present invention. In FIG. 1, a semiconductor memory device 100 has a DRAM portion 101 as a main storage portion, a SRAM portion 102 as an auxiliary storage portion, and a two-way data transfer circuit 103 for performing data transfer between the DRAM portion 101 and the SRAM portion 102.

The DRAM portion 101 has; a DRAM array 110 provided with a plurality of dynamic type memory cells arranged in matrix form comprising rows and columns, a DRAM row control device 115 for outputting DRAM row selection signals and a bank selection signal from internal address signals iA0~iA13, a DRAM row decoder 113 for receiving DRAM row selection signals iADR0~iADR12 and a bank selection signal iAD13, and selecting corresponding rows of the DRAM array 110, a DRAM column control device 116 for outputting DRAM column selection signals from internal address signals iA5 and iA6, and a DRAM column decoder 114 for receiving DRAM column selection signals iADC5 and iADC6 and selecting a corresponding column.

Furthermore, the DRAM array 110 incorporates a memory cell portion 111, and a sense amplifier 112 for detecting data held in a selected DRAM cell and amplifying this. Moreover, the DRAM array 110 is divided into a plurality of blocks referred to as banks. With the present embodiment, this is divided into two banks namely bank A and bank B, which are selected by the bank selection signal iAD13.

The SRAM portion 102 has; a SRAM array 120 provided with a plurality of static type memory cells arranged in matrix form comprising rows and columns, a SRAM row control device 124 for generating SRAM row control signals from internal address signals iA0~iA3, a SRAM row decoder 121 for receiving SCRAM row selection signals iASR0~iASR3 and performing selection of divided SRAM cell groups (with the present embodiment, cell groups divided for each row), a SRAM column control device 122 for generating SRAM column selection signals from internal address signals iA0~iA3 and iA4~iA13, and a SRAM row decoder 123 for performing column selection by means of the SRAM column selection signals iASC4~iASC10. Moreover, there is an operation control device 150 for receiving external input signals and controlling the operation in the semiconductor memory device, and a data control device 160 for controlling data input/output from and to the external portion.

Here with the present embodiment, a DRAM is used in the main storage portion and a SRAM is used in the auxiliary storage portion, however the present invention is not limited to this. For the main storage portion, instead of a DRAM, another memory such as a SRAM a mask ROM, a PROM, an EPROM, an EEPROM, a flash EEPROM, or a ferroelectric memory may be used. The memory constituting the main memory device is preferably constructed so that the types and unique functions thereof can be effectively used. For example, in the case where a DRAM is used in the main storage portion, a general purpose DRAM, an EDODRAM, a synchronous DRAM, a synchronous GRAM, a burst EDODRAM, a DDR synchronous DRAM, a DDR synchronous GRAM, an SLDRAM, a Rambus DRAM or the like are appropriately used. Moreover, for the auxiliary storage portion, rather than the memory used for the main storage portion, another memory may be used provided this is a random access memory capable of high speed access. In the case where the main storage portion comprises a flash EEPROM, then preferably the memory capacity of the auxiliary storage portion is constructed with more than half of the capacity of one deleted sector unit of the flash EEPROM.

(3) System

With the semiconductor memory device according to the present invention, by having the SRAM column control device 122 described later in detail, modification of the SRAM row control mode in SRAM cell group units becomes possible. This function enables setting of lap type (described later), burst length, or latency or the like (hereunder referred to a data input/output format) for each SRAM cell group unit. If set beforehand, then at the time where selection of each SRAM cell group has been made, data input/output format is automatically determined in the internal portion of the semiconductor memory device. Therefore, data control from outside of the semiconductor memory device for switching the data input/output format, or data processing control outside of the semiconductor memory device becomes unnecessary.

Figure 2:
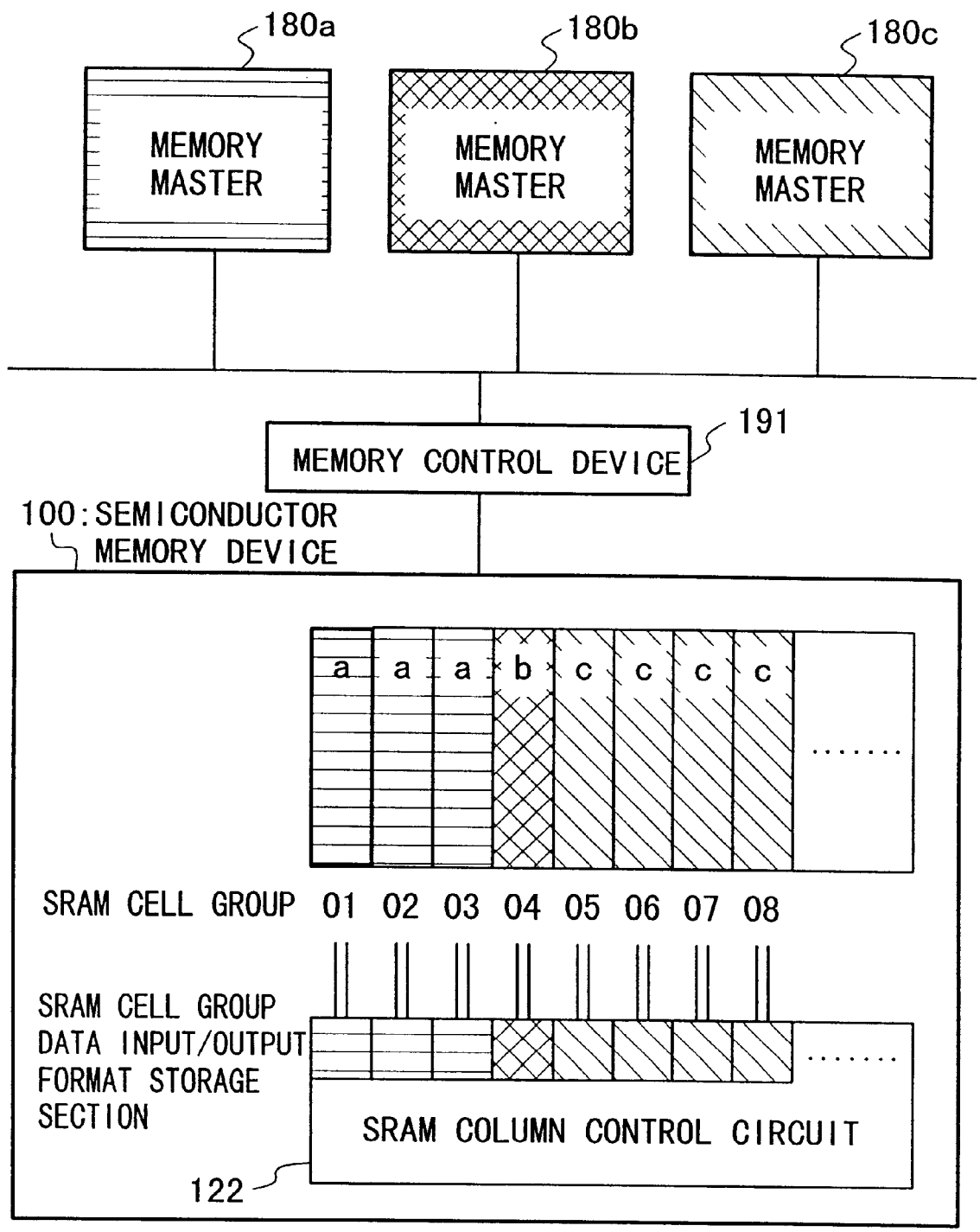
FIG. 2 block diagram of a memory system having the semiconductor memory device shown FIG. 1, and a plurality of memory master for performing access request with respect to the semiconductor memory device.

A semiconductor memory device having these functions of the present invention, has the function in that in the case where a plurality of access requests are received, the allotment or designation and re-designation in SRAM cell group units are received for each of the respective access requests. FIG. 2 shows a memory system which has a plurality of memory masters for performing access requests with respect to the semiconductor memory device 100 shown in FIG. 1. In FIG. 2, SRAM cell groups 01, 02 and 03 are designated for access requests from a memory master 180a, a SRAM cell group 04 is designated for access requests from a memory master 180b, and SRAM cell groups 05, 06, 07 and 08 are designated for access requests from a memory master 180c. Designation of the SRAM cell groups for these access requests is variable, and modification is possible at any time.

Figure 3:
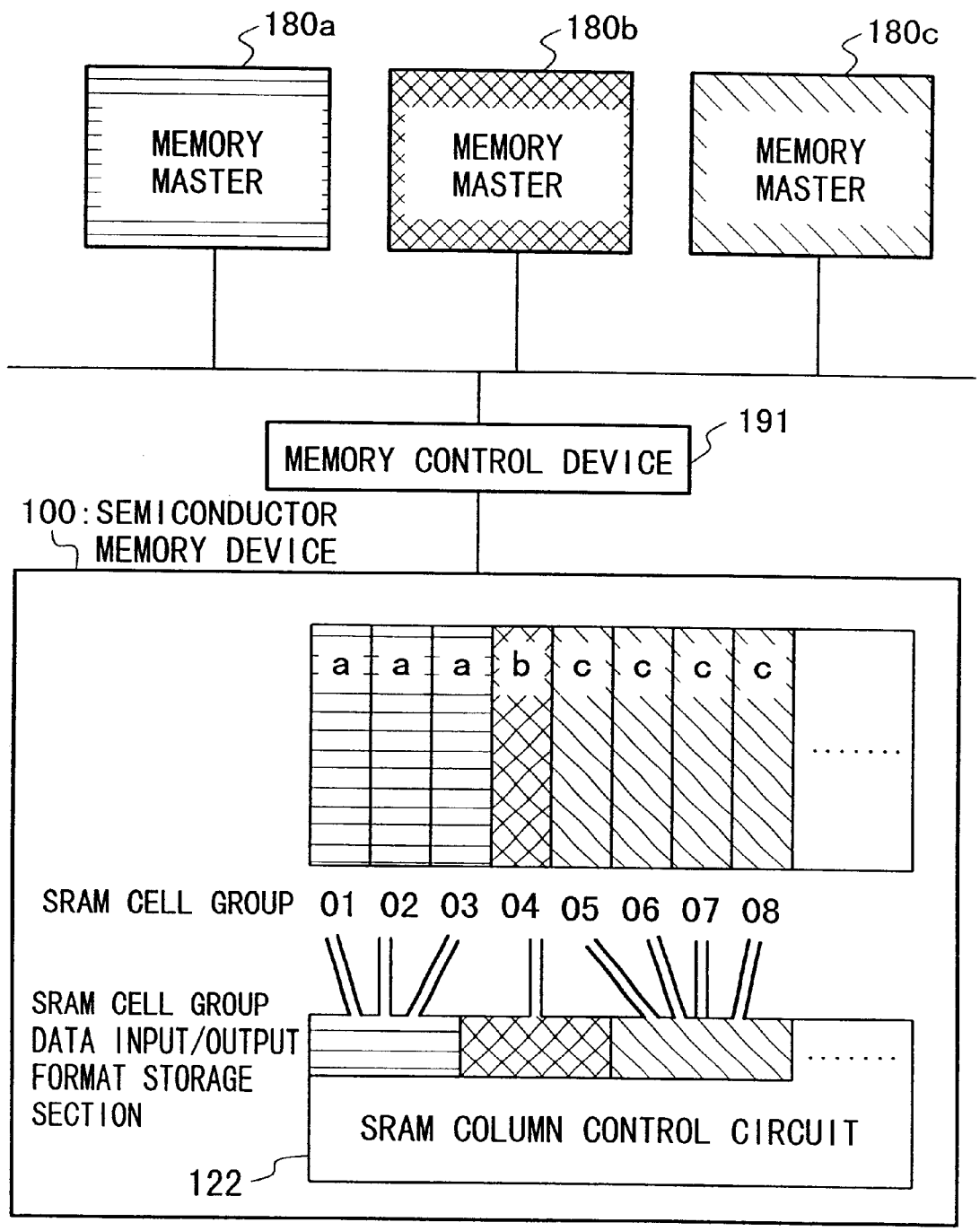
FIG. 3 is block diagram of a memory system having the semiconductor memory device shown in FIG. 1, and a plurality of memory master for performing access request with respect to the semiconductor memory device.

Furthermore, also in the case where the data input/output format for requesting the memory master 180a with respect to the semiconductor memory device 100 in FIG 2, and the data input/output format for requesting the memory master 180b are different, it is possible to continue with the data input/output with respect to the memory master 180a, and the data input/output with respect to the memory master 180b without the requirement for inputting some special control signal. In order to make this operation possible, data input/output format storage portions are provided in the SRAM column control device 122 inside the semiconductor memory device 100. Furthermore, the data input/output format storage portions, as shown in FIG. 2, may have a one-to-one correspondence with the SRAM cell groups, while as shown in FIG. 3, these may correspond to a plurality of SRAM cell groups.

(4) Pin Arrangement

FIG. 4 is a diagram showing one example of pin arrangement for a package of a semiconductor memory device according to the present invention. FIG. 4 is for a semiconductor memory device having a 64M bit DRAM array, and a 2 bank synchronous interface of x8 bit configuration having a 16K bit SRAM array, housed in a 0.8 mm lead pitch, 54 pin 400 mil x 875 mil TOSP type 2 plastic package. The configuration of the pins (pin number/pin arrangement) is the same as for a standard 64M bit synchronous DRAM. Moreover, even with other bit configurations, the pin number and pin arrangement is the same as for the synchronous DRAM of the respective configurations.

The signal definitions for each pin are described below.

CLK: Clock signal CLK is a standard clock signal, being a standard signal for all of the other input/output signals. That is to say, this determines take in timing of other input signals, and output signal timing. With each of the external input signals, the setup/hold time is assigned with the rising edge of the clock as a reference.

CKE: Clock enable signal CKE decides if the next clock signal is to be valid or invalid. In the case where the CKE signal is HIGH at the time of the CLK rising edge, then the next input CLK signal is made valid, while in the case where the CKE signal is LOW at the time of the clock rising edge, the next input CLK signal is made invalid.

/CS: Chip selection signal /CS decides whether external input signals /RAS signal, /CAS signal, and /WE signal are to be received or not received. In the case where the /CS signal is LOW at the time of the clock rising edge, the /RAS signal, the /CAS signal, and the /WE signal which are input at the same timing are taken in to the operational control device, while in the case where the /CS signal is HIGH at the time of the CLK rising edge, the /RAS signal, the /CAS signal, and the /WE signal which are input at the same timing are ignored.

/RAS, /CAS, /WE: Respective control signals /RAS, /CAS, /WE are signals for deciding the operation of the semiconductor memory device by being combined together.

A0~A13: Address signals A0~A13 are taken in to the address control device in response to the clock signals, and transferred to the DRAM row decoder, the DRAM column decoder, the SRAM row decoder, and the SRAM column decoder, for use in selection of the respective DRAM portion cells and SRAM portion cells. Furthermore, these are taken in to a later described mode register in response to an internal command signal, and used in the setting of the data input/output format for the internal operation. Moreover, these are also similarly used in the setting of a SRAM column control device. Furthermore, the address signal A13 may be a bank selection signal for a DRAM cell array.

DQM; Data mask signal DQM is a signal for making the data input and output invalid (masked) in byte units.

DQ0~DQ7: Data signals DQ0~DQ7 are signals for input/output data.

(5) Basic Operation

Hereunder is a description of the basic operation of the semiconductor memory device according to the present invention. The commands and data numbers and the like shown here are strictly those for illustrating one embodiment, and other combinations are also optionally possible.

FIG. 5 shows one example of conditions for various commands and external input control signals for determining operating functions of the semiconductor memory device according to the present invention. However, the combination of conditions of the various commands and external input control signals for determining the operating functions of the semiconductor memory device may be in any combination.

In FIG. 5 is shown the condition of the respective input control signals at the rising edge of the standard clock signal CLK, and the operations determined at that time. Standard symbol "H" shows a logic high level, standard symbol "L" shows a logic low level while "x" shows an optional level. Moreover, n~1 of the input control signal CKE in FIG. 5 shows the condition of input control signals CKE in the previous period of a standard clock being observed. This indicates that the CKE described for later mentioned respective commands is CKE n−1.

Next is a description of the respective commands shown in FIG. 5 in order.

1. "Read Command"

The read command is a command for performing an operation for reading out data from a SRAM cell. As shown in FIG. 6, the condition of the respective input control signals at the rising edge of the external clock signal is, CKE=H, /CS=L, /RAS=H, /CAS=L, and /WE=H. At the time of input of this command, A0~A3 is taken in as the selection address for tho SRAM row, and A4~A10 is taken in as the selection address for the SRAM column. Moreover, the data for output is output to DQ0~DQ7 with a delay of latency from after this command input. However, in the case where DQM=H in the clock which is set for this command, the DQ0~DQ7 data output is masked and is not output to the outside.

FIG. 24 shows the flow of address signals and data for the internal operation according to this command. The SRAM cells are selected by the row selection of the SRAM row decoder due to the internal address signals iA0~iA3, and the column selection of the SRAM column decoder due to the SRAM column selection signals iASC4~iASC10 produced from the internal address signals iA0~A3 and iA4~iA13. The data of the selected SRAM cells is output to the outside through a data amplifier in a assigned data input/output format.

2. "Write Command"

The write command is a command for performing an operation for writing in data to a SRAM cell. As shown in FIG. 7, the condition of the respective input control signals at the rising edge of the external clock signal is, CKE=H, /CS=L, /RAS=H, /CAS=/WE=L. At the time of input of this command input, the A0~A3 is taken in as the selection address for the SRAM row, and A4~A10 is taken in as the selection address for the SRAM column. The data to be written in takes in the DQ0~DQ7 data with a delay of latency from after this command input. However, in the case where DQM=H in the clock for performing take in of DQ0~DQ7 data, the DQ0~DQ7 data is masked and is not taken in to the inside.

FIG. 25 shows the flow of address signals and data for the internal operation according to this command. The SRAM row decoder performs row selection based on the SRAM row selection signals iASR0-iASR3 produced from iA0~iA3, while the SRAM column decoder performs column selection based on the SRAM column selection signals iASC4~iASC10 produced from iA0~iA3 and iA4~iA13, and the SRAM cell is selected using this row selection and column selection. The write in data taken in to the selected SRAM cell from the DQ0~DQ7 data is written in via the write buffer.

As shown in FIG. 24 and the FIG. 25, with the operation of the read command and write command, reading in and writing out with respect to the SRAM portion is performed with absolutely no relationship to the DRAM portion and the data transfer portion. Consequently, even if a data transfer operation for the DRAM portion and SRAM cell groups other than the row of the SRAM selected for data input and output, or an operation inside the DRAM portion are still being performed, the operations by these commands can be executed unrelated to this. Furthermore conversely, even if operations by the read command or the write command are being performed, data transfer for the DRAM portion and cell groups other than the row of the SRAM selected for data input/output, or input of DRAM portion internal commands for operations are possible.

"Prefetch Command"

The prefetch command is a command for performing data transfer from the DRAM cell group to the SRAM cell group. As shown in FIG. 8, the condition of the respective input control signals at the rising edge of the external clock signal are, CKE=H, /CS=L /RAS=/CAS=H, and /WE=L. Moreover A10=L and A9=L. At the time of this command input, A1~A3 are taken in as the selection address for the SRAM row, A5 and A6 are taken in as the selection address for the DRAM column, and A13 is taken in as the selection address for the bank of the DRAM array.

FIG. 26 shows the flow of address signals and data for the internal operation according to this command. Of the DRAM cell group which is already selected by a later described active command, the one for a bank assigned by iA13 is selected. Here bank A is selected. A bit line of the DRAM cell group assigned by iA5 and iA6 is selected. The data of the bit line is amplified by a sense amplifier at the time of an active command, and the data of the selected bit line is transmitted to a data transfer bus line via a data transfer circuit. The cells on the row of the SRAM selected by iA0~iA3, stop the holding of the previous data, take in the data of the data transfer bus line, and then perform holding of the transferred data. The output from the sense amplifier to the data transfer line through the data transfer circuit stops after data transfer. With the present embodiment, the number of data transferred at one time by this command is 128×8.

4. "Prefetch Command Accompanying Auto Precharge"

This command is a command for performing data transfer from a DRAM cell group to a SRAM cell group, and a command for automatically performing precharge of a DRAM portion after data transfer. As shown in FIG. 9, the condition of the respective input control signals at the rising edge of the external clock signal are, CKE=H, /CS=L, /RAS=/CAS=H, and /WE=L. Moreover A10=H and A9=L.

As with the beforementioned prefetch command, at the time of this command input, A01~A3 are taken in as the selection address for the SRAM row, A5 and A6 are taken in as the selection address for the DRAM column, and A13 is taken in as the selection address for the bank of the DRAM array.

The flow of address signals and data for the internal operation according to this command are shown below. Of the DRAM cell group which is already selected by a later described active command, the one for a bank assigned by iA13 is selected. A bit line of the DRAM cell group assigned by iA5 and iA6 is selected. The data of the bit line is amplified by a sense amplifier at the time of an active command, and the data of the selected bit line is transmitted to a data transfer bus line. The cells on the row of the SRAM selected by iA0~iA3, stop the holding of the previous data, take in the data of the data transfer bus line, and then perform holding of the transferred data. The output from the sense amplifier to the data transfer line through the data transfer circuit stops after data transfer. Subsequently, after a predetermined time the word line is made the non-selective condition and an internal operation (balancing of the potentials of the bit line and the sense amplifier) is performed as explained under the heading of a later described precharge command. After a predetermined time from input of this command, the DRAM automatically becomes a precharge (non selected) condition.

5. "Restore Command"

This command is for performing data transfer from a SRAM cell group to a DRAM cell group. This command, as shown in FIG. 10 is a continuous input command spanning the external clock signals CLK1 and CLK2. As shown in FIG. 10, the condition of the respective input control signals at the rising edge of the external clock signal are, CKE=H, /CS=L, /RAS=/CAS=H, and /WE=L. Moreover A10=L and A9=H.

At the rising edge of the first external clock signal CLK1, A0~A3 are taken in as the selection addresses for the SRAM row, and A5 and A6 are taken in as the selection addresses for the DRAM column, and at the rising edge of the next clock CLK2, A0~A12 are taken in as the selection addresses for the DRAM row being the transfer destination. Moreover, at the rising edges of CLK1 and CLK2, A13 is taken in as the selection address for the bank of the DRAM array. The respectively input A13 addresses at CLK1 and CLK2 must be the same.

FIG. 27 shows the flow of address signals and data for the internal operation according to this command. The internal address signals i1A0~i1A12 shown here are internal address data for at the time of the first clock CLK1, while the internal address signals i2A0~i2A12 are internal address data for at the time of the next clock CLK2. The data for the same internal address signal lines is shown divided for each clock. The data for the SRAM cell group selected by i1A0~i1A3 produced from the address at the time of the first clock CLK1 is transmitted to the data transfer bus line of the bank selected by iA13. The data in the subsequent data transfer bus lines is transferred to the bit line of the DRAM selected by i1A5 and i1A6.

Then after this, selection of the word line of the DRAM is made by iA13 and i2A0~i2A12 produced from the address at the time of the next clock CLK2, and the cell group on the selected word line is output to the bit line corresponding to the respectively held data. The sense amplifier corresponding to the bit line of each DRAM detects the data of the DRAM cell group output to the bit line and amplifies this. However, the sense amplifier corresponding to the bit line selected by the abovementioned i1A5 and i1A6 detects the write in data transmitted from the data transfer bus line and amplifies this. The data output through the data transfer bus line to the bit line of the DRAM stops after a rise of the word line. With the present embodiment, the number of data transferred at once with this command is 128×8.

6. "Restore Command Accompanying Auto Precharge"

This command is a command for performing data transfer from a SRAM cell group to a DRAM cell group, and a command for automatically performing precharge of a DRAM portion after data transfer. As shown in FIG. 11, the condition of the respective input control signals at the rising edges of external clock signal CLK1 and CLK2 are, CKE= H, /CS=, /RAS=/CAS=H, and /WE=L. Moreover A10=H and A9=H.

At the rising edge of the first external clock signal CLK1, A0~A3 are taken in as the selection addresses for the SRAM row, and A5 and A6 are taken in as the selection addresses for the DRAM column, and at the rising edge of the next clock CLK2, A0~A12 are taken in as the selection addresses for the DRAM row being the transfer destination. Moreover, at the rising edges of CLK1 and CLK2, A13 is taken in as the selection address for the bank of the DRAM array. This A13 address must not be different for CLK1 and CLK2.

The flow of the address signal and data for the internal operation due to this command is shown below. The data for the SRAM cell group selected by i1A0~i1A3 produced from the address at the time of the first clock CLK1, is transmitted to the data transfer bus line of the bank selected by iA13. Then the data of the data transfer bus line is transferred to the bit line of the DRAM selected by i1A5 and i1A6. After this, selection of the word line of the DRAM is made by iA13 and i2A0~i2A12 produced from the address at the time of the next clock CLK2, and the cell group on the selected word line is output to the bit line corresponding to the respectively held data.

The sense amplifier corresponding to the respective bit lines of each DRAM detects the data of the DRAM cell group output to the bit line and amplifies this. However, the sense amplifier corresponding to the bit line selected by the above mentioned i1A5 and i1A6 detects the write in data transferred from the data transfer bus line and amplifies this. The data output through the data transfer bus line to the bit line of the DRAM stops after a rise of the word line. Subsequently, after a predetermined time lapse the word line is made the non-selective condition and an internal operation (balancing of the potentials of the bit line and the sense amplifier) as shown by a later described precharge command is performed. After a predetermined time from input of this command, the DRAM automatically becomes a precharge (non selected) condition.

7. "Active Command"

This command is a command for performing activation of the bank selected by the DRAM array. As shown in FIG. 12, the condition of the respective input control signals at the rising edge of the external clock signal are, CKE=H, /CS=/ RAS=L, and /CAS=/WE=H. At the time of this command input, A13 is taken in as the bank selection address for the DRAM, and A0~A12 are taken in as the selection address for the DRAM row.

FIG. 28 shows the flow of address signals and data for the internal operation according to this command. In the bank selected by iA13, selection of the word line of the DRAM is made by iA0~iA12. The DRAM cell group on the selected word line is output to the bit line which connects the respectively held data, and the sense amplifier corresponding to each bit line detects the data of the DRAM cell group output to the bit line and amplifies this. With the present embodiment, the number of data amplified at once with this command is 512×8.

In the case where it is desired to perform another word line selection with respect to the already activated bank, it is necessary to perform precharge for that bank once, and input the active command afresh from after reaching the precharge condition. This command corresponds to that for when the /RAS signal of the normal DRAM is LOW.

8. "Precharge Command"

This command is a command for performing precharge (deactivation) of the bank selected by the DRAM array. As shown in FIG. 13, the condition of the respective input control signals at the rising edge of the external clock signal are, CKE=H, /CS=/RAS=L, /CAS=H and /WE=H. At the time of this command input, in the case where A10=L, and A13=valid data, precharging of the bank assigned by the data of A13 (non-selection) is performed. The bank selected here is one which is selected at the time of the active command input prior to this command. In the case where the active command is not input prior to input of this command, then there is no effect with respect to the bank assigned by this command.

The flow of address signals and data for the internal operation according to this command is shown hereunder. The word line of the activated DRAM of the bank selected by iA13, is made the non-selective condition, and balancing of the potentials of the bit lines and the sense amplifier is performed. After completion of the operation of this command, the selected bank becomes a waiting condition for the input of the next active command. This command corresponds to that for when the /RAS signal of the normal DRAM is HIGH.

9. "Overall Bank Precharge Command"

This command is a command for performing precharge (deactivation) of all the banks of the DRAM array. By this, the DRAM portion can be set to the precharge condition, and the active condition of all banks can be terminated. As shown in FIG. 14, the condition of the respective input control signals at the rising edge of the external clock signal are, CKE=H, /CS=/RAS=L, /CAS=H and /WE=H. Moreover, A10=H.

The flow of address signals and data for the internal operation according to this command is shown hereunder. The word lines of the selected DRAM are all made the non-selective condition, and balancing of the potentials of the bit lines and the sense amplifier is performed. After completion of the operation of this command, all the banks becomes a waiting condition for the input of the next active command. This command corresponds to that for when the /RAS signal of the normal DRAM is HIGH.

10. "CBR Refresh Command"

This command is a command for performing refresh of the DRAM portion cell data. Address signals required for refresh, are automatically generated inside. As shown in FIG. 15, the condition of the respective input control signals at the rising edge of the external clock signal are, CKE=H, /CS=/RAS=/CAS=L and /WE=H.

The flow of address signals and data for the internal operation according to this command is shown hereunder. iA0~iA12 and iA13 are automatically generated inside. The bank is selected by the internally generated iA13, and selection of the word line of the DRAM is made by the similarly generated iA0~iA12, and the DRAM cell group on the selected word line is output to the bit line corresponding to the respectively held data. The sense amplifier corresponding to each bit line detects the data of the DRAM cell group output to the bit line, and amplifies this. The amplified data is again written in to the DRAM cell group through the bit line detected by the sense amplifier. After a predetermined time following this, the word line is made the non-selective condition, the potentials of the bit lines and the sense amplifier are balanced, and the refresh operation is terminated.

11. "Incomplete Operation Command"

The incomplete operation command of CKE=H, /CS=L, and /RAS=/CAS /WE=H shown in FIG. 16 is not an execution command.

12. "Device Non-selection Command"

The device non-selection command of CKE=H, and /CS=H shown in FIG. 17 is not an execution command.

13. "Register Setting Command"

This command is a command for setting data for various operation modes, in a register. As shown in FIG. 18 and FIG. 19, the condition of the respective input control signals at the rising edge of the external clock signal are, CKE=H, and /CS=/RAS=/CAS=/WE=L. At the time of this command input, valid data of A0~A13 is taken in as the setting data for the operation modes. After switching on the power, input of the register setting by this command is necessary in order to perform initialization of the devices.

FIG. 20 shows the operations according to the address data, at the time of the register setting command.

Part of the register setting commands (a), (b), (c), and (d) of FIG. 20, are command inputs for the first cycle clock as shown in FIG. 18, while part of the later described register setting command (d) is a command input for the second cycle clock shown in FIG. 19. Address set (a) in FIG. 20, is a test set of a refresh counter, being a test set similar to that for a normal synchronous DRAM. This address set is selected at the time of input of A7=H and A8=L Address set (b) in FIG. 20 is an unused set. This address set is selected at the time of input of A7=L and A8=H. Address set (c) in FIG. 20 is a set for device tests. This address set is selected at the time of input of A7=H and A8=H. Address set (d) in FIG. 20 is a mode register setting set. This address set is selected at the time of input of A7=L and A8=L, and performs setting of later described various data input/output formats. The mode register stores data input/output format; for each SRAM cell group of the auxiliary storage portion.

FIG. 21 shows a list of detailed setting items for mode register setting.

The mode register setting (1) command is an address data set for performing switching between a latency mode and an input/output address sequence (lap type). This command is input by one clock of the external clock signal, as in FIG. 18. This address set is selected when A6=L, A7=L and A8=L. The latency mode setting is made by data of A1, A2, A3 input simultaneously, and setting of the input/output address sequence (lap type) is made by data of A0. The latency mode is set to the latency=2 when A1=L A2=H, and A3=L, and at the time of other address data becomes an unset set condition. The input/output address sequence (lap type) is set to sequential when A0=L, and is set to interleave when A0=H.

The mode register setting (2) command is an address-data set for performing setting of burst length for each selected row of the SRAM, and is continuously input spanning the two clocks of the external clock signal as in FIG. 19, for input of row specification and burst length data of the SRAM. This address set is selected when A6=H, A7=L, and A8=L. Selection of the SRAM cell group is performed using the data for A0, A1, A2, and A3 at the first clock CLK1, and burst length of the SRAM cell group is set using the data for A3, A4 and A5 at the next clock CLK2. With A3=L, A4=L, and A5=L, the burst length is set to one, with A3=H, A4=L, and A5=L, the burst length is set to two, with A3=L, A4=H, and A5=L, the burst length is set to four, with A3=H, A4=H, and A5=L, the burst length is set to eight, and with A3=L, A4=L, and A5=H, the burst length is set to 16.

Hereunder is a brief explanation of the various data input/output formats.

Burst length: This represents the number of data continuously input/output by the input/output of one read command or write command. Continuous input/output of data is performed based on the clock signal. FIG. 22 shows the timing for each signal at read time. Here the burst length is four. That is to say, when the read command is input at CLK0, a total of four data DO-1~DO-4 is continuously output at the clock of CLK2, CLK3, CLK4, and CLK5. FIG. 23 shows the timing for each signal at write time. Since the burst length is four, then when the write command is input at CLK0, a total of four data DO-1~DO-4 is continuously taken in at the clock of CLK0, CLK1, CLK2, and CLK3.

Latency: This is the waiting time from input of the read command or the write command until input/output of data is possible, represented by means of the clock number. FIG. 22 shows the timing of each signal at the time of read. With this embodiment, the latency at the time of read is two. That is to say, when the read command is input at CLK0, since the latency is two, then after CLK2, data starts to be output to the DQ terminal. FIG. 23 shows the timing for each signal at the time of write. With this embodiment, the latency at the time of write is zero. That is to say, when the write command is input at CLK 0, since the latency is zero, then after CLK0, data for the DQ terminal starts to be taken in.

Lap type: Lap type (input/output address sequence) determines the address sequence of the data input/output for when data is input/output continuously for the set burst length. There is a sequential and interleave lap type.

For the other control functions, there are function controls using control of the clock enable signal CKE. These are controls identical to those for the normal synchronous DRAM.

Hereunder is a brief description of a part of the operation of the semiconductor memory device according to the present invention.

Read for the case where there is assigned data from outside in the SRAM portion:

As shown in FIG. 24, data assigned by only the read command is output to the outside through the data amplifier.

Read for the case where there is no assigned data from outside in the SRAM portion:

As shown in FIG. 28, after termination of the active command, the prefetch command shown in FIG. 26 is executed, and the assigned data is transferred to the SRAM portion. Then, by the read command shown in FIG. 24, the assigned data is output to the outside through the data amplifier.

Read for the case where there is no assigned data from outside in the SRAM portion, and for the case where there is write data which has not yet been restored:

By the restore command shown in FIG. 27, write data is transferred to the DRAM portion. After this, the active command shown in FIG. 28 and the prefetch command shown in FIG. 26 are executed, and the assigned data is transferred to the SRAM portion. Then, by the read command shown in FIG. 24, the assigned data is output to the outside through the data amplifier.

(6) Layout
1. "Overall Layout"

FIG. 30 shows the overall layout of a chip of one embodiment of a semiconductor memory device applicable to the present invention. The semiconductor memory device shown in FIG. 30 is one with x8 bit two bank configuration having a 64M bit DRAM array, and a 16K bit SRAM array. This is an embodiment having a synchronous interface. However the semiconductor memory device is not particularly limited to this.

As shown in FIG. 30, a cross shape area comprising a vertical (in the figure) central portion and a horizontal (in the figure) central portion is provided on a chip. DRAM arrays are arranged in the four divided portions divided up by the abovementioned cross shape area. These are made DRAM array 110-1, 110-2, 110-3, and 110-4. The DRAM arrays each have a storage capacity of 16M bits, so that the overall DRAM array has a storage capacity of 64M bits. In the DRAM arrays 110-1, and 110-2 are arranged DRAM row decoders 113 respectively corresponding to adjoining portions of the bottom portions of the DRAM arrays. Similarly, in the DRAM arrays 110-3, and 110-4 are arranged DRAM row decoders 113 respectively corresponding to adjoining portions of the top portions of the DRAM arrays.

Between the DRAM arrays 110-1 and 110-2 are arranged a SRAM array 120-1, a SRAM row decoder 121 and column decoder 123, corresponding to the left and right DRAM arrays. Similarly, between the DRAM arrays 110-3 and 110-4 are arranged a SRAM array 120-2, a SRAM row decoder 121 and column decoder 123, corresponding to the left and right DRAM arrays. A data transfer bug line for performing data transfer between a selected DRAM cell group and a selected SRAM cell group is arranged across the horizontal direction (in the figure) so as to enable data transfer between the DRAM array 110-1, the SRAM array 120-1, and the DRAM array 110-2. Similarly, a data transfer bus line (not shown) is arranged across the horizontal direction (in the figure) so as to enable data transfer between the DRAM array 110-3, the SRAM array 120-2, and the DRAM array 110-4. In the other parts of FIG. 30 is arranged an operation control device, a data control device and the like. Moreover, while not being a particular limitation, with the present embodiment, terminals for signal input/output with the outside are arranged in the horizontal central portion.

With the example shown in FIG. 30, the main storage portion is a two bank configuration. The simultaneously selected parts at the time of bank A selection are DRAM array 110-1 and 110-4, and at the time of bank B selection are DRAM array 110-2 and 110-3. FIG. 37 shows the power source wiring VCC for supplying each array and the ground wiring GND. This gives a configuration where the simultaneously selected portions are not concentrated at one part, so that the load applied to the internal power source wiring VCC or the internal ground wiring GND is not biased to one part.

FIG. 31 shows another embodiment of an overall layout of a semiconductor memory device applicable to the present invention.

DRAM arrays are arranged in each of the four divided areas, respectively giving DRAM array 110-1, 110-2, 110-3 and 110-4. The DRAM arrays are each 16M bit storage capacity and comprise bank A and bank B, so that the overall DRAM array has a storage capacity of 64M bit. In the DRAM arrays 110-1, and 110-2 are arranged DRAM row decoders 113 respectively corresponding to adjoining portions of the bottom portions of the DRAM arrays. Similarly, in the DRAM arrays 110-3, and 110-4 are arranged DRAM row decoders 113 respectively corresponding to adjoining portions of the top portions of the DRAM arrays. Between the DRAM arrays 110-1 and 110-2, and the DRAM arrays 110-3 and 110-4 are arranged SRAM arrays 120-1, 120-2, 120-3 and 120-4, a SRAM row decoder 121 and column decoder 123, respectively corresponding to the left and right DRAM arrays.

In FIG. 31 the SRAM column decoder 123 is shown as one block for the left and right SRAM arrays, however this may be provided for each SRAM array. A data transfer bus line for performing data transfer between a selected DRAM cell group and a selected SRAM cell group is arranged across the horizontal direction (in the figure) so as to enable data transfer between the DRAM array 110-1 and the SRAM array 120-1. Moreover, a data transfer bus line (not shown) is similarly arranged between the other DRAM array and SRAM array. In the other parts of FIG. 31 is arranged an operation control device, a data control device and the like. Moreover, while not being a particular limitation, with the present embodiment, terminals for signal input/output with the outside are arranged in the horizontal (in the figure) central portion.

FIG. 32 shows another embodiment of an overall layout of a semiconductor memory device applicable to the present invention. DRAM arrays 110 are arranged in each of the four divided areas. The DRAM arrays are each 16M bit storage capacity and comprise bank A and bank B, so that the overall DRAM array has a storage capacity of 64M bit. DRAM row decoders 113 corresponding to the respective DRAM arrays are arranged at adjoining portions of the top portions, and bottom portion of the DRAM arrays 110. Moreover, SRAM arrays 120, SRAM row decoders 121 and SRAM column decoders 123 corresponding to the respective DRAM arrays, are arranged adjacent to the DRAM row decoders 113. A data transfer bus line for performing data transfer between a selected DRAM cell group and a selected SRAM cell group is arranged in a horizontal direction (in the figure) at the DRAM array portion part, and is connected with the SRAM array by another wiring layer different to that of the data transfer bus line. In the other parts of FIG. 32 is arranged an operation control device, a data control device and the like.

FIG. 33 shows another embodiment of an overall layout of a semiconductor memory device applicable to the present invention. The embodiment shown in FIG. 33 is one where the arrangement of the SRAM array, the SRAM row decoder, and the SRAM column decoder of the layout shown in FIG. 32 has been changed. Moreover, as long as data transfer is possible between the selected DRAM cell group and the selected SRAM cell group, then the arrangement of these is not limited.

FIG. 34 shows another embodiment of an overall layout of a semiconductor memory device applicable to the present invention. FIG. 34 is an embodiment for where the abovementioned layout configuration shown in FIG. 30 has been combined. The number of partitions of the DRAM array is increased to give an in line configuration for the configuration of FIG. 30. Furthermore, similarly a layout configuration where the configuration of FIG. 30 is further multiply combined, and where this is combined with the configuration of FIG. 31 is also possible. With the example shown in FIG. 34, the main storage part is a two bank configuration, and as with the example shown in FIG. 30, this gives a layout where the simultaneously selected portions are not concentrated at one part, for both the bank A and the bank B.

FIG. 38 shows the allocation for the power source wiring and the ground wiring for the respective DRAM arrays shown in FIG. 34. As shown in FIG. 38, power source wiring VCC1 and ground wiring GND1, power source wiring VCC2 and ground wiring GND2, power source wiring VCC3 and ground wiring GND3, and power source wiring VCC4 and ground wiring GND4 are respectively allocated to DRAM arrays 110-1, 110-4, 110-5, and 110-8 belonging to bank A. Moreover, power source wiring VCC1 and ground wiring GND1, power source wiring VCC2 and ground wiring GND2, power source wiring VCC3 and ground wiring GND3, and power source wiring VCC4 and ground wiring GND4 are respectively allocated to DRAM arrays 110-2, 110-3, 110-6, and 110-7 belonging to bank B.

In this way, with the examples shown in FIG. 34 and 38 also, the configuration is such that separate power source wiring and ground wiring is allocated to DRAM arrays belonging to the same bank, so that the load carried by the internal power source wiring VCC and/or the internal ground wiring GND and the like is not biased to one part. However, with the examples shown in FIG. 34 and 38, compared to the beforementioned examples shown in FIG. 30 and FIG. 37, assuming that the size of the memory is assumed to be the same, the size of the DRAM array to which one power source wiring and ground wiring is assigned becomes half. Therefore, the current supply amount becomes half, so that the load on the respective power supply and ground wiring can be further reduced. Moreover, the invention is not limited to the abovementioned examples, and arrangements with other combinations, or an increase in the number of division with simultaneous selection areas dispersed, or a reduction in the simultaneous selection areas, is also possible. In this way, noise can be further suppressed.

FIG. 35 shows another embodiment of an overall layout of a semiconductor memory device applicable to the present invention. In FIG. 35, the arrangement of the layout configuration shown in FIG. 34 is changed, with the data transfer bus lines crossing in the vertical direction (in the figure). In FIG. 35, the DRAM row decoder and the SRAM row decoder are shown as one block each with respect to the left and right DRAM array and SRAM array, however these may be provided for each of the respective DRAM arrays and SRAM arrays. Moreover, the configuration may be such that as in FIG. 36, the left and right banks of the DRAM row decoders are connected by a common data transfer line.

Also with these examples shown in FIG. 35 and 36, as with the abovementioned example shown in FIG. 34, the configuration is such that the adjacent DRAM arrays belong to different banks, and the power supply/ground wiring for the respective DRAM arrays is separated, so that noise can be validly suppressed.

(7) Detailed Description of each Block

A detailed description will now be given of each circuit block of the overall block diagram shown in FIG. 1.

The following description strictly shows one embodiment, however the invention is not limited to this description.

1. "Operation Control Device"

FIG. 39 shows a block diagram of the operation control device. The operation control device 150 comprises; an internal clock generator 410, a command decoder 420, a control logic 430, an address control device 440, and a mode register 450. The internal clock generator 410 generates an internal clock signal iCLK from external input signals CLK and CKE. The internal clock signal iCLK is input to the command decoder 420, the control logic 430, the address control device 440, and a data control device, and performs timing control of each part.

The command decoder 420 has a buffer 421 for receiving respective input signals, and a command judgment circuit 422. The /CS signal, /RAS signal, /CAS signal, /WE signal and address signals, which are synchronized with the internal clock signal iCLK are transmitted to the command judgment circuit 422 to generate an internal command signal iCOM. The command judgment circuit 422 performs response operations such as shown in the correspondence table for the commands and respective input terminal conditions of FIG. 5, with respect to the respective input signals. The control logic 430 receives the internal command signal iCOM, the internal clock signal iCLK, and a register signal iREG, and generates Control signals necessary for performing the operations assigned by these signals.

The control logic is divided into a DRAM control device 431, a transfer control device 432, and a SRAM portion control device 433, and generates respective control signals. The register 450 has the function of holding data defined by combinations of data for specific address inputs, in the case where a specific register write in signal is received from the command judgment circuit. Thereafter, the data is held until a register write in signal is again input. The data held in the register is referred to in the case where the control logic 430 is operated.

2. "DRAM Portion"
"DRAM Portion and Data Transfer Circuit"

The specific configuration of the DRAM portion and the data transfer circuit shown in FIG. 1, is shown in FIG. 40. In FIG. 40, the DRAM portion 101 has a plurality of dynamic type memory cells DMC arranged in matrix form. The memory cells DMC contain one memory transistor N1 and one memory capacitor C1. A constant potential Vgg (e.g. ½ Vcc) is applied across opposite poles of the memory capacitor C1. Moreover, the DRAM portion 101 has DRAM word lines DWL which connect the DRAM cells DMC in rows, and DRAM bit lines DBL which connect the DRAM cells DMC in respective columns. The bit lines are each constructed in complementary pairs. The DRAM cells DMC are respectively arranged at the interportions of the words lines DWL and the bit lines DBL.

Moreover, the DRAM portion 101 has DRAM sense amplifiers DSA corresponding to the bit lines DBL The sense amplifiers DSA have the function of detecting and amplifying a potential difference between the paired bit lines, and are operation controlled by means of sense amplifier control signals DSAP and DSAN. Here since the DRAM array is 64M bit of a x8 bit two bank configuration, then this has word lines DWL1~DWL8192, bit lines DBL1~DBL512, and sense amplifiers DSA1~DSA512. These are a one bank x 1 bit configuration.

The DRAM portion 101 has a DRAM row decoder 113 for performing selection of the word lines DWL1~DWL8192, and has a DRAM row control device 115 for generating DRAM internal row address signals iADR0~iADR12 and a bank selection signal iAD13. Moreover, the DRAM portion 101 has a DRAM bit line selector DBSW, which selects a pair of bit lines from four pairs of bit lines by means of DRAM bit line selection signals DBS1~DBS4 generated from the DRAM column decoder 114, to thereby perform connections to data transfer bus lines TBL via a data transfer circuit 103. Moreover, this has a DRAM column control device 116 for generating DRAM column address signals iADC5 and iADC6 used by the DRAM column decoder.

FIG. 41 shows one example of a specific array configuration for the DRAM array 110-1 in the overall layout of one embodiment of the present invention shown in FIG. 30. In FIG. 41, the DRAM array is divided into 16 memory cell blocks DMB1~DMB16. DRAM row decoders DRB1~DRB16 respectively corresponding to memory cell blocks DMB1~DMB16, and blocks SAB1~SAB17 corresponding to (sense amplifier +DRAM bit selector +data transfer circuit) are provided. In this figure, the memory cell blocks DMB1~DMB16 are each furnished with 1M bit capacity of 512 rows x2048 columns. Moreover, the number of divisions is not limited to this.

When as shown in FIG. 41, the DRAM memory cell array is multiply divided, since the length of one bit line is shortened the capacity of the bit line is reduced, and the potential difference occurring in the bit line at time of data read can be increased. Moreover, at the time of operation, since the sense amplifier corresponding to the memory cell block which includes the word line selected by the row data does not operate, then the power consumption accompanying discharging and charging of the bit line can be reduced.

FIG. 42 is a diagram of one example showing in detail the connection relation between the transfer bus lines and bit lines in one portion 140 (bit line 4 pair) of the layout of FIG. 41. In FIG. 42, the sense amplifiers DSA are arranged in a staggered form so that there is a sense amplifier DSA1 corresponding to one column at one end of a memory cell block, and a sense amplifier DSA2 corresponding to the next column at the other end. This is necessary in the case where, with the most recent processes, the memory cell size is miniaturized, but the size of the sense amplifier is not reduced in proportion to this, and hence there is no margin for arranging the sense amplifier to match the bit line pitch. In the case where the bit line pitch is large, the sense amplifiers can also be arranged at only one end of the memory cell block. Moreover, the sense amplifiers DSA are shared by two memory cell blocks by means of a shared selector. Furthermore, each bit line has a bit line control device for performing potential balancing and precharge between bit line pairs. However, these bit line control devices also, as with the sense amplifiers can be shared by two memory cell blocks.

The bit lines and data transfer bus lines are connected via DRAM bit line selectors DBSW1~DBSW4 which are selected by DRAM bit line selection signals DBS1~DBS4, and data transfer circuits TSW1 and TSW2 which use switching transistors SWTR shown by the detailed circuit in FIG. 43. Data transfer activation signals TE1 and TE2 for activating the data transfer circuits are signals which are obtained by applying logic to the transfer control signal generated by the operation control device shown in FIG. 39, and the address signal for selecting the memory cell block. Moreover, regarding the connections of the data transfer bus lines shown in FIG. 42, since the data transfer bus lines are connected using the data transfer circuit, then in the case where the data transfer circuit of a memory cell block which is not activated becomes a non conducting condition, the load of the DRAM bit line selector connected before this is not seen. Therefore, the load of the data transfer bus line at the time of operation can be kept as small as possible. However, with the configuration shown in FIG. 42, there is the problem that the chip area is increased due to the requirement for arranging the data transfer circuit, and wiring the data transfer activation signal for activating this data transfer circuit.

The configuration of one example for solving this problem is shown in FIG. 44. In FIG. 44, the bit lines and data transfer bus lines are connected by means of only DRAM bit line selectors DBSW1~DBSW4 which are selected by DRAM bit line selection signals DBS1~DBS4. This can be realized by adding a logic for data transfer activation signals to a DRAM column decoder which generates DRAM bit line selection signals DBS1~DBS4, to give the function of a data transfer circuit. If this is done, the load on the data transfer bus line at the time of operation becomes large, however the chip area can be dramatically reduced.

The activation of the DRAM portion, the column selection, and the operation of the data transfer will now be explained using FIG. 40 and FIG. 42. At first, the activation of the DRAM portion will be explained. In FIG. 40, when a control signal for DRAM row selection which is one of the signals of the DRAM control signals generated by the operation control device shown in FIG. 39, and internal address signals iA0~iA13 are input to a DRAM row control device 115, bank selection signal iAD13 and DRAM internal row address signals iADR0~iADR12 are generated, and the word line DWL of the bank assigned by the DRAM row decoder 113 is selected. When the selected word line DWL rises, the data held in the cell DMC is output to the bit line DBL The difference potential for the data appearing on the bit line pair is detected and amplified by the operation the sensor amplifier DSA by means of the sensor amplifier drive signals DSAN and DSAP. The number of sensor amplifiers activated simultaneously in the DRAM portion 101 is 512, and since these are x8 bit configuration, this gives a total of 512×8=4096 bits.

Next is a description of the column selection and data transfer of the DRAM portion. The DRAM column control device 116 of FIG. 40, takes the input of internal address signals iA5 and iA6, and a control signal being one of the DRAM portion control signals generated by the drive control device shown in FIG. 39, and generates DRAM column address signals iADC5 and iADC6. The DRAM column address signals iADC5 and iADC6 are input to the DRAM column decoder 114, and DRAM bit line selection signals DBS1~DBS4 are generated. After the bit lines are selected, bit line data is transferred to the data transfer bus lines TBL by means of a data transfer activation signal TE which takes a logic by means of the transfer control signal generated by the operation control device shown in FIG. 39, and the address signal for selecting the memory cell block. As shown in FIG. 44, by adding a logic for data transfer activation signals to the DRAM column decoder the function of data transfer circuit can be given, and the DRAM bit line selection signals DBS1~DBS4 can be made signals which perform transfer operation at the same time as column selection.

In FIG. 44, when the DRAM bit selection signal DBS1 is selected, the signal synchronized with the transfer control signal is input to the DRAM bit line selector DBSW1, and the data of bit lines DBL1 and /DBL1 amplified by the sense amplifier DSA1 is transmitted to the data transfer bus lines TBL1 and /TBL1. With this part shown in FIG. 44, since in the DRAM portion 101 of FIG. 40 there are 128 sets with x8 bit configuration, then the data transferred simultaneously from the bit lines to the data transfer bus lines is in total 128×8=1024 bits. This simultaneously transferred number is the same with other bit configurations.

"DRAM row control device and DRAM row decoder"

FIG. 45 shows the configuration of a DRAM row control device 115. The DRAM row control device 115 has a DRAM internal row address latch circuit 460, a multiplexer 470, an internal address counter circuit 480, and a refresh control device 490. With normal DRAM portion activation, the DRAM row control device 115 outputs DRAM internal row address signals iADR0~iADR12 and bank selection signal iAD13 to the DRAM row decoder 111 through the multiplexer 470, by means of the address latch circuit 460 into which is input a DRAM row address latch signal ADRL and the internal address signals iA0~iA13.

Regarding the refresh operation, the DRAM row control device 115 receives the input of the refresh control signal, and the refresh control device 490 operates the internal address counter circuit 480, and controls the multiplexer 470 to output an address signal from the internal address counter circuit 480. As a result, the DRAM internal row address signals iADR0~iADR12 and the bank selection signal iAD13 are output to the DRAM row decoder 113 without input of the address signal. Moreover, the internal address counter circuit 480 performs automatic addition or subtraction of the addresses by a previously set method, for each refresh operation, so that all of the DRAM rows can be automatically selected.

"DRAM column control device and DRAM column decoder"

FIG. 46 shows one example of a specific configuration for the DRAM column control device and DRAM column decoder shown in FIG. 40. In FIG. 46, the DRAM column control device 116 comprises a DRAM internal column address latch circuit 495. The DRAM internal column address signals iADC5 and iADC6 are generated by means of the internal address signals iA5 and iA6, and a DRAM column address latch signal ADCL which is taken in in a clock cycle at the time of inputting a command for data transfer (prefetch transfer operation) from the DRAM cell to the SRAM cell, and for data transfer (restore transfer operation) from the SRAM cell to the DRAM cell.

Here the DRAM column address latch signal ADCL is one of the transfer control signals generated by the operation control device shown in FIG. 39. Moreover, the DRAM column decoder 114 is a circuit for decoding the DRAM internal column address signals iADC5 and iADC6 generated by the DRAM column control device 116. The output signal therefrom is a DRAM column selection signal which is generated only when the memory cell block selection address signal and the transfer control signal TE are activated. Therefore, the activation signals TE1 and TE2 of the data transfer circuit shown in FIG. 42 double as the output signals from the DRAM column decoder 114 for this column, and the data transfer circuit doubles as a later described DRAM bit line selector.

"DRAM bit line selector"

FIG. 47 through FIG. 50 show one example of a specific circuit configuration for the DRAM bit line selector in FIG. 44. FIG. 47, with the simplest configuration, comprises switching transistors made up of N channel type MOS transistors (hereunder referred to as NMOS transistors) N200 and N201, with DRAM bit lines DBL and data transfer bus lines TBL connected by means of DRAM column selection signals.

The example shown in FIG. 48 comprises NMOS transistors N210 and N211 with DRAM bit line pairs respectively connected to the gates, for differentially amplifying the DRAM bit lines DBL when data of the DRAM bit lines DBL is transmitted to the data transfer bus lines TBL, and a switching transistor comprising NMOS transistors N212 and N213 for transmitting the amplified signals to the data transfer bus lines TBL by means of prefetch transfer DRAM column selection signals. One terminal of the NMOS transistors N210 and N211 is connected for example to a fixed potential of ground potential or the like. Moreover, in order to transmit data on the data transfer bus lines TBL to the DRAM bit lines DBL, then as with the arrangement shown in FIG. 47, a switching transistor comprising NMOS transistors N214 and N215 is provided, and by means of this, the DRAM bit lines DBL and the data transfer bus lines TBL are connected by a restore transfer DRAM column selection signal.

The example shown in FIG. 49 comprises NMOS transistors N230 and N231 with DRAM bit line pairs respectively connected to the gates as with FIG. 48, for differentially amplifying the DRAM bit lines DBL when data of the DRAM bit lines DBL is transmitted to the data transfer bus lines TBL, and a switching transistor comprising NMOS transistors N232 and N233 for transmitting the amplified signals to the data transfer bus lines TBL by means of prefetch transfer DRAM column selection signals. One terminal of the NMOS transistors N230 and N231 is connected for example to a fixed potential of ground potential or the like.

Moreover, in order to transmit data on the data transfer bus lines TBL to the DRAM bit lines DBL there is provided NMOS transistors N250 and N251 with data transfer bus line pairs respectively connected to the gates, for differentially amplifying the data transfer bus line TBL, and a switching transistor comprising NMOS transistors N234 and N235 for transmitting the amplified signals to the DRAM bit line DBL by means of restore transfer DRAM column selection signals. One terminal of the NMOS transistors N250 and N251 is connected for example to a fixed potential of ground potential or the like.

The example shown in FIG. 50 is a configuration where in the configuration shown in FIG. 49, only one data transfer bus line is used. Naturally the NMOS transistor N260 does not differentially amplify the DRAM bit line DBL, and the data transfer line performs a selection operation by means of the potential of the DRAM bit line. The NMOS transistor N280 is also the same. Moreover, as with FIG. 47, this may be configured with only the switching transistor. By making the data transfer bus line a single body as with this example, the wiring layout is simplified, and also noise between data transfer bus lines can be reduced.

Furthermore, with the configurations as in FIG. 48 through FIG. 50 where the DRAM bit line or the data transfer bus line are received by the gate of the transistor for transmitting data, the DRAM bit line and the data transfer bus line are completely separated and hence noise generated on one is difficult to propagate. Moreover drive at high speed is possible.

"Configuration of DRAM bit line selector and SRAM cell"

FIG. 51 shows the relation between the pair of data transfer bus lines in the layout shown in FIG. 29, and DRAM bit line connection circuits, and a SRAM cell. In FIG. 51, the cell on the same column as the DRAM cell is connected to the data transfer bus lines via a DRAM bit line selector, so that data transfer with the cell on the same column as the SRAM cell is possible. Moreover, the data transfer bus lines and the SRAM cell are connected via a transfer bus control device 498. This data transfer bus control device 498 includes a circuit for selecting and connecting DRAM arrays (here bank A and bank B) arranged on opposite sides of the SRAM cell, so that it is possible to connect to only the activated bank. By reducing the load on the data transfer bus line, a reduction in discharge and charge current and speeding up of data transfer can be realized. Furthermore, when as shown by the operation in FIG. 52, the data transfer for both bank is alternately executed (a bank ping-pong operation), since the data transfer bus line of one bank is separated, then data transfer for both banks can be executed superimposed, so that the valid data transfer period can be shortened, As described above, with the semiconductor memory device according to this embodiment, the number of bits for data transfer at one time is 1024 bits, and additionally the load of this data transfer bus line is extremely large. Therefore, if all of the signals on the data transfer bus line are made full amplitude up to the power source voltage level, the peak current and consumption current become extremely large. Therefore, by not making the signals on the data transfer bus line full amplitude, but making these an amplitude up to about one half of the power source voltage at a maximum, the peak current and consumption current can be considerably reduced.

However, when the amplitude of the data transfer bus line is small, the minute potential difference thereof must be amplified by the SRAM cell, and hence the transfer speed is somewhat slowed down. Therefore, in order to fully amplify only the data transfer bus line TBLS inside the SRAM cell portion, a differential type amplifying circuit for differentially amplifying may be provided in the transfer bus control device 498, with the data transfer bus line TBLA or TBLA inside the DRAM bank connected to the gate. Alternatively, a sense amplifier or the like may be provided for amplifying only the data transfer bus line TBLS inside the SRAM portion, with the data transfer bus line TBLA or TBLB inside the DRAM bank in a separated condition. Moreover, the transfer bus control device 498 has a circuit for balancing the potentials of the data transfer bus line pair, and precharging.

3. "SRAM Portion"

"Configuration between the SRAM portion and the data input/output terminals"

FIG. 53 shows an example of a specific configuration between the SRAM portion shown in FIG. 1 and the data input/output terminals. In this figure, a configuration for one bit portion of the external data input/output terminal DQ is selected and shown. This example is an embodiment having a 16K bit SRAM array with a x8 bit configuration. However the present invention is not limited to this and includes combinations of the main storage portion configuration, and the same can be realized with various configuration.

In FIG. 53, the SRAM memory cells SMC, as shown by one example in FIG. 54, have connection circuits 312 for connecting data transfer bus lines TBL coming from DRAM portions, with opposite ends of flip-flop circuits 311 (with this example, these are flip-flop circuits, however there is no limitation to these provided that these are circuits which store data statically), and connection circuits 313 for connecting to SRAM bit lines SBL. Moreover, the configuration has the SRAM row decoder 121 for generating, SRAM cell data transfer row selection signals TWL1~TWL6 for activating connection circuits of the beforementioned data transfer bus lines when performing data transfer between DRAM cells and SRAM cells, and SRAM cell read/write row selection signals SWL1~SWL16 for activating a connection circuit for the beforementioned SRAM bit line SBL when performing reading out or writing in with respect to the SRAM cell, and the SRAM row control device 124 for generating SRAM internal row address signals iASR0~iASR3 for input to the SRAM row decoder 121, by means of internal address signals iA0~iA3 and SRAM portion control signals. Of course the SRAM cell data transfer row selection signals TWL, and the SRAM cell read/write row selection signals SWL may also be made common.

Furthermore, the SRAM bit lines SBL have the SRAM bit line control device 303 for performing balancing and precharging of the bit line, and the SRAM column selector 304 for making conducting the data input/output line SIO and the SRAM bit line SBL. Moreover, the configuration has the SRAM column decoder 123 for generating selection signals SSL1~SSL128 for input to the SRAM column selector 304, and the SRAM column control device 122 for generating SRAM internal column address signals iASC4~iASC10 for input to the SRAM column decoder 123, by means of internal address signals iA0~iA13, and SRAM portion control signals. Here the SRAM bit line control device 303 may may have a sense amplifier circuit for detecting and amplifying the level of the SRAM bit lines SBL.

Furthermore, the data input/output lines SIO are connected to an external data input/output terminal DQ via a data input/output circuit 308 and a read/write amplifier 307. Concerning the data input/output lines SIO, these may be separated into a write line and a read line. Moreover, with the read operation or the write in operation with respect to the SRAM cell, since both the transfer bus line TBL for performing data transfer, and the SRAM bit line SBL for performing read are respectively provided, then read can be performed regardless of the data transfer operation.

"SRAM cell"

FIG. 55 shows several specific circuit examples of the flip-flop circuit 311 of the SRAM cell shown in FIG. 54. (a) is a flip-flop circuit constructed by P channel type MOS transistors (hereunder referred to as PMOS transistors) P100, P101, and NMOS transistors N100, N101. (b) is a f lip flop circuit constructed with resistors R100, R101, and NMOS transistors N100, N101. Both are widely generally used in the SRAM. Moreover, (c) is a circuit where a PMOS transistor P102 and an NMOS transistor N102 being power cut transistors for respectively controlling control signals PE, NE, and a balancer circuit 315, are added to the flip-flop circuit of (a) Here both the P102 and the N102 are not necessarily required, and only one may be provided. The balancer circuit 315 also need not necessarily be provided.

Furthermore, (d) is constructed as a sense amplifier which is widely and generally used in a normal DRAM, and is provided with the flip-flop circuits of (a) with a plurality arranged in the row direction, a PMOS transistor P103 for controlling a contact point 316 with a control signal SPE, and an NMOS transistor N103 for controlling a contact point 317 with a control signal SNE. Moreover, this has a balancer circuit 318 for balancing the contact point 316 and the contact point 317, and a balancer circuit 315 inside the flip-flop circuits as in (c). Here the power source voltage may be an external power source voltage or an internal power source voltage which is generated by a power source voltage conversion circuit (internal power source circuit). Moreover, the PMOS transistor P102 of the power cut transistor, and the PMOS transistor P103 which controls the contact point 316 with the control signal SPE may be both constructed from NMOS transistors. The level of the control signals PE, SPE at this time may be a level of an internally produced power source voltage of a higher level than the power source voltage generated by the power source voltage conversion circuit. By reducing the through current flowing inside the flip-flops as in (c) or (d), the noise occurring at the time of transfer can be considerably reduced. Moreover, by balancing both ends and transferring, stabilized transfer operation at high speed can be realized. Furthermore, the transistors which make up the flip-flop circuits are not special transistors, and may be the same as the transistors used in the peripheral circuits or the DRAM sense amplifier.

"Connection circuit for SRAM bit line, and connection circuit for data transfer bus line"

FIG. 56 through FIG. 58 show specific circuit examples for connection circuits for connecting to the SRAM bit lines SBL.

The example shown in FIG. 56, is the simplest configuration, being made up of a switching transistor comprising NMOS transistors N104 and N105, and connects to the SRAM bit line SBL by means of a read/write row selection signal SWL.

The example shown in FIG. 57 comprises NMOS transistors N108 and N109 with opposite terminals of a flip-flop circuit respectively connected to the gates, for differentially amplifying the data of the opposite terminals of the flip-flop circuit, in order to read data from the flip-flop circuits, and a switching transistor comprising NMOS transistors N106 and N107 for transmitting this amplified signal to a SRAM bit line SBL by means of a read row selection signal SRWL. One terminal of the NMOS transistors N108 and N109 is connected for example to a fixed potential of ground potential or the like. Moreover, in order to write in data to the flip-flop circuit, then in the same manner as shown in FIG. 56, a switching transistor comprising NMOS transistors N110 and N111 is provided, and the SRAM bit line SBL and the flip-flop circuit are connected by means of the write in row selection signal SWWL.

The example shown in FIG. 58 comprises NMOS transistors N108 and N109 with opposite terminals of a flip-flop circuit respectively connected to the gates as with FIG. 57, for differentially amplifying the data of the opposite terminals of the flip-flop circuit, in order to read data from the flip-flop circuits, and a switching transistor comprising NMOS transistors N106 and N107 for transmitting this amplified signal to a SRAM read bit line SRBL by means of a read row selection signal SRWL. One terminal of the NMOS transistors N108 and N109 is connected for example to a fixed potential of ground potential or the like.

Moreover, in order to write in data to the flip-flop circuit, there is provided NMOS transistors N114 and N115 with SRAM write in bit line pairs respectively connected to the gates in the same manner as shown above, for differentially amplifying the data on the SRAM write in bit line SWBL, and a switching transistor comprising NMOS transistors N112 and N113 for transmitting this amplified signal to opposite terminals of the flip-flop circuit by means of a write in row selection signal SWWL. One terminal of the NMOS transistors N114 and Nl15 is connected for example to a fixed potential of ground potential or the like.

Furthermore, with the configurations as in FIG. 57 and FIG. 58 where the opposite terminals of the flip-flop circuit and the SRAM bit line SBL are received by the gate of the transistor for transmitting data, the opposite terminals of the flip-flop circuit, and the SRAM bit line SBL are completely separated and hence noise generated on one is difficult to propagate. Moreover drive at high speed is possible. The connection circuit for the data transfer bus line TBL can also be of exactly the same configuration as in FIG. 56 through FIG. 58.

"SRAM row control device"

FIG. 59 shows one example of a specific circuit configuration for the SRAM row control device 124 shown in FIG. 53. In FIG. 59, the SRAM row control device comprises a SRAM internal row address latch circuit 350. SRAM internal row address signals iASR0~iASR3 are generated from internal address signals iA0~iA3, and a latch signal ASRL for taking these in with the clock switching at the time of read/write command input. Here the latch signal ASRL is one of the SRAM portion control signals generated by the operation control device shown in FIG. 39.

"SRAM column control device"

FIG. 60 shows one example of a specific circuit configuration for the SRAM column control device 122 shown in FIG. 53. In FIG. 60, the SRAM column control device has a SRAM internal column address latch circuit 507 for taking in internal address signals iA4~iA10 with a latch signal ASCL generated with the clock switching at the time of read/write input, and a counter circuit 506 which takes in the output from the SRAM internal column address latch circuit 507 by means of a control signal SCE, and counts up in a predetermined address sequence by means of an internal count up signal CLKUP which operates during a burst operation which performs read and write in with respect to the SRAM. The SRAM internal column address signals iASC4~iASC10 are output via a multiplexer 508 which passes either of the outputs from the latch circuit 507 and the counter circuit 506. Moreover, the multiplexer 508 selects the output from the latch circuit 507 in the clock cycle at the time of a read/write command input, and is controlled by the control signal SCSL so as to output a little faster the SRAM internal column address signal.

Furthermore, with the SRAM column control device according to the present invention, so as to be able to set completely different data input/output formats (for example burst length, data input/output address sequence, latency etc.) with respect to each of the plurality of SRAM cell groups (with this example, the SRAM cell groups divided for each row), there is provided a data input/output format storage portion 505 which takes in and holds the data input/output format in the beforementioned mode sequence set (2) command cycle (with this example, the setting of only the burst length is possible with respect to each SRAM cell group, however similarly this may be such that the setting of the data input/output address sequence, the latency etc. is also possible) depending on the condition of the internal address iA0~iA13.

This data input/output format storage portion 505 is provided with, in an equivalent number to the number of divided SRAM cell groups; a take in logic 502 for generating take in setting data depending on the condition of internal addresses iA0~iA3, and a register 503 which takes in setting data (the output from the take in logic 502) for data input/output format for each SRAM cell group, by means of an output from a decoder circuit 501 decoded by iA0~iA3 and selected by means of an enable signal CRE which is generated in the beforementioned mode register setting (2) command cycle. Furthermore, this has a multiplexer 504 which, in the read/write command cycle, selectively controls the iASR0~iASR3 output from the beforementioned SRAM internal row address latch circuit 350, by mean; of signals decoded by the decoder circuit 509, and passes one or other of the outputs from the register 503 which holds the set data for the SRAM cell group.

The counter circuit 506 takes in the output from the multiplexer 504 and operates by means of the data input/output format set by the respective SRAM cell groups. Moreover, the data input/output format storage portions 505 must be provided in a number corresponding to the number of data input/output formats to be set. Here the internal count up signal CLKUP, the enable signal CRE, the control signals SCE and SCSL, and the latch signal ASCL are the SRAM portion control signals generated by the operation control device shown in FIG. 39. Of course, the latch signal ASRL input to the SRAM internal row address latch circuit 350, and the latch signal ASCL input to the SRAM internal column address latch circuit 507 may be made common.

Moreover, with the setting of the data input/output format storage portion 505, as well as being performed for each of the respective SRAM cell groups according to the beforementioned mode register setting (2) command cycle, executing the same setting at the same time for the set data of two or more SRAM cell groups is also possible by setting the logic for the addresses A4 and A5 at the time of setting the SRAM column data for the mode register setting (2) command shown in FIG. 5. For example, this can be set from various combinations such that when A4=L and A5=4 this is set for each of the respective SRAM cell groups, when A4=H and A5=L, this is set for the two SRAM cell groups which ignore the least significant bit of the SRAM row data, and when A4=L and A5=H, this is set for the four SRAM cell bits which ignore the low-order two bits of the SRAM row data.

Furthermore, with the data input/output format storage portion 505, it is not really necessary that the take in logic 502 and the register 503 are provided in the same number as the divided SRAM cell groups, and these may exist in common with a plurality of SRAM cell groups. Moreover, iASR0~iASR3 input to the decoder circuit 509 do not necessarily need to use signals from the SRAM internal row address latch circuit 350, and besides this, a separate circuit may be provided.

Moreover, as shown in FIG. 61, by having the SRAM internal column address latch circuit 507 and the multiplexer 508 in a circuit configuration which immediately outputs via logic with the internal clock signal iCLK which is synchronized with the external standard clock signal, then internal address signals can be generated at high speed. Here in FIG. 61, INTAi and /INTAi are address signals from the counter circuit 506, and EXTAi and /EXTAi are signals generated from an internal address signal iAi. Switching of these signals is performed by the control signals SCSL, /SCSL, and a burst control signal. SCSL is the control signal, and /SCSL is the negative phase signal of the control signal SCSL FIG. 62 shows an operation example for this circuit. With this circuit configuration, the delay from iCLK until the internal address signal Yi is output is the inverter first stage part, and is suppressed to a minimum. Furthermore, the internal address signals Yi and YiB are output as address pulse signals.

"Basic configuration of the SRAM column decoder and data control device"

FIG. 63 shows the basic configuration of the SRAM column decoder 123 and the data control device 160. The SRAM column decoder 123 has a first column decoder 390 and a second column decoder 391, and the SRAM column selection signal iASC is transmitted in sequence to each of these. The first column decoder and second column decoder operate with one address selection data iASC. In order to realize this, they have a first column address buffer 392 and a second column address buffer 393 for respective decoder use. The selection signals SSL from the respective column decoders are arranged in parallel in the column direction. The data input/output lines SIO and the data latch circuits also have two corresponding sets.

FIG. 64 shows an internal operation timing in this SRAM column decoder. The respective column address buffers perform selection signal control (iASC~1, and iASC~2) of the respective column decoders in sequence based on the clock signal. That is to say, when as at the time of burst mode, there is continuous column address selection, the first column decoder and second column decoder are operated alternately. The data of the columns (SSL1 and SSL2) selected by the respective column decoders is sequentially output to the data input/output lines (SIO~1 and SIO~2) corresponding to these. These data input/output lines operate at two times the required cycle time. Temporary holding of the data is performed by a first data latch circuit 395 and a second data latch circuit 396. The data of these two sets is synthesized before a data out buffer, and then output from the data input/output terminal DQ at the required cycle time.

By using the above configuration, speeding up of the cycle for continuous data output or continuous data read in is possible, without raising the internal operation cycle. Also in the synchronous DRAM of DOUBLE DATA RATE (DDR), by using this configuration, speeding up is possible.

"Configuration example between a SRAM portion and data input/output terminals"

FIG. 65 and FIG. 66 show a configuration example for between a SRAM portion and data input/output terminals, for the case of an x8 bit configuration (DQ0~DQ7).

With this configuration example, a data input/output line for transferring data between the outside and the SRAM portion is hierarchized into local data input/output lines SIO, and global data input/output lines GIO. As shown in FIG. 66, the data input/output lines SIO connected to SRAM cells SMC shown later in FIG. 67 are arranged so as to approximately intersect data transfer bus lines TBL for interchange of data of the DRAM portions, while the global data input/output lines GIO are arranged approximately parallel with these data transfer bus lines TBL.

With this example, 8 global data lines GIO are provided corresponding to data DQ0~DQ7, and for each global data line GIO there is provided 16 data input/output lines SIO. Moreover, a set of for example 64 cells (a set of a predetermined numbers of memory cells) are connected to one data input/output line SIO. Each data input/output line SIO is connected to a global data input/output line GIO via a data input/output line connection circuit (switch circuit) 155 which is conduction controlled by a read/write SRAM row selection signal 501. A cell group common with the global data input/output line GIO is matched with the same data DQ (each bit of external 8 bit data). The data input/output line connection circuit 155 becomes the object of control by the read/write SRAM row selection signal 501, together with the SRAM cells.

In this way, this gives a configuration where the data input/output lines for transferring data between the outside and the SRAM, are divided into local data input/output lines SIO which connect at least two SRAM cells (cells of a set) and global data input/output lines GIO, and the data input/output lines between the SRAM portion and the outside become hierarchized.

FIG. 67 shows a configuration example of a SRAM cell used in the example shown in FIG. 66. As shown in this figure, the SRAM cell is configured with the main constituent being a flip-flop comprising N type transistors N2000, N2001 with a SRAM cell control signal SAN connected to the source, and P type transistors P2000, P2001 with a SRAM cell control signal SAP connected to the source. A pair of memory nodes of this flip-flop are connected to data transfer bus lines TBL via N type transistors N2002, N2003 which are conduction controlled by a data transfer SRAM row selection signal, and are thus connected to a DRAM portion via these data transfer bus lines TBL. Furthermore, the pair of memory nodes of the flip-flop constituting this SRAM cell are connected to the abovementioned data input/output lines SIO via N type transistors N2004, N2005 which are conduction controlled by a read/write SRAM row selection signal, and N type transistors 2006, 2007 which are conduction controlled at the gate by a SRAM column selection signal.

Here the data transfer SRAM row selection signal is applied to the gate of the N type transistors N2002, N2003 connected to the data transfer bus lines TBL By means of this signal, the connection between the flip-flop of the SRAM cells, and the data transfer bus lines TBL is controlled. Furthermore, the read/write SRAM row selection signal is applied to the gates of the N type transistors N2004, N2005, and the SRAM column selection signal is applied to the gates of the N type transistors N2006, N2007. By means of these signals, the SRAM cells are selectively connected to the data input/output lines SIO. Focusing on a SRAM connected to one data input/output line SIO, the read/write SRAM row selection signal is applied in common to each SRAM cell, while the read write SRAM column selection signal is individually applied.

With this SRAM cell configuration, in the case where the read/write SRAM row selection signal and the SRAM column selection signal are activated together, the SRAM cell is electrically connected to the data input/output line. Consequently, by controlling the activation condition of the read/write SRAM row selection signal and the SRAM column selection signal applied to each memory cell, then even with SRAM cells belonging to the same row, the connection condition for the memory nodes and data input/output lines SIO can be controlled in SRAM cell units. That is to say, the plurality of SRAM cells on the same row common with the read/write SRAM column selection signal become the object for simultaneous activation by this signal. However since the SRAM row selection signal of each SRAM cell is different, then ultimately one SRAM cell on the same row is assigned by the SRAM column selection signal, so that this is electrically connected to the data input/output line SIO.

Hereunder is a description with reference to FIG. 68 for the case where data output from the SRAM portion to the outside is performed, in the operation of the configuration example shown in FIG. 65 and FIG. 66.

At first, a SRAM cell of a certain column of a certain row is selected by a read/write SRAM row selection signal and a SRAM column selection signal, and is connected to a data input/output line SIO. At this time, all of the other cells are in a non selected condition. The read/write SRAM row selection signal which selects the SRAM cell, makes the data input/output line connection circuit 155 provided in the row belonging to the selected SRAM cell conduct simultaneously, so that the data input/output line SIO and the global data input/output line GIO to which this SRAM cell is connected are electrically connected.

In this way, the data of the selected SRAM cell is sent to the data amplifier 153 via the data input/output line SIO, the data input/output line connection circuit 155, and the global data input/output line GIO. After this, the data passes through the previously mentioned read/write bus line RWL and is output to the data input/output terminal DQ via a data latch circuit 151 and a data buffer 152. Of course, due to the x8 configuration, the 8 group data input/output circuits operate simultaneously so that 8 units of data are output. Also at the time of writing in to the SRAM cell also, the same path is followed with the writing in.

On the other hand, the flip-flop of the SRAM cell which is not selected (not activated) is electrically separated from the data input/output line SIO. Moreover, the data input/output line connection circuit (switch circuit) 155 provided in the data input/output line SIO connected to this cell becomes non conducting. As a result, this data input/output line SIO is electrically separated from the global input/output line GIO.

Here focusing on the drive condition of the load of the data input/output line S10, the load of the data input/output line SIO electrically connected to the global data input/output line GIO, is driven by the selected SRAM cell, while the load of the other data input/output lines SIO is in the non driven condition. Consequently, the drive current generated due to the load of the data input/output lines SIO is limited to only the data input/output line SIO which connected the selection SRAM cell. Furthermore, only one data input/output line SIO is electrically connected to the global data input/output line GIO by means of the conduction controlled data input/output line connection circuit 155. Consequently, the load of the other data input/output lines SIO is electrically separated from the global data input/output lines GIO, so that the load on the global data input/output lines GIO is reduced, and the drive current required for charging and discharging this load is thus suppressed.

In this way, by having a configuration using the data input/output lines SIO and the global data input/output lines GIO, SRAM row selection for each SRAM cell becomes unnecessary. Hence the load related to the SRAM row selection signal can be reduced, and it becomes possible to operate data input/output of the SRAM cell at high speed. Moreover, by having this configuration, then even in the case where the number of rows of the SRAM cell is increased, the load on the data input/output lines SIO is not increased, so that this does not become an obstacle to high speed operation.

Here with this example, the SRAM cell group common with the global data input/output line GIO, that is to say the SRAM cells in sets of 64 connected to the same global data input/output line, are matched with the same data DQ. However each of the cells of sets connected to the same data input/output line SIO can be matched to different data DQ.

"SRAM column redundant circuit configuration"

FIG. 69 shows a first configuration example for the case where a SRAM redundant cell column is provided. The example shown in this figure is a configuration example of the SRAM cell array corresponding to one of the beforementioned input/output terminals DQ shown in FIG. 65. As shown in FIG. 69, this has a redundant SRAM cell array (SRAM cell array) MAR arranged above the SRAM cell array MA, a redundant data input/output line SIOR leading upward from the SRAM cell array MAR, the normal (non redundant) data input/output line SIO taken out downward of the MA of the SRAM array, and the SRAM data input/output line connection circuits (row selection switches) 155R and 155 on respective data input/output lines. A redundant global input/output line GIOR is arranged on the upper side of the SRAM array MAR, while a normal (non redundant) global data input/output line GIO is arranged on the lower side. These global data input/output lines GIOR and GIO are respectively connected to the read/write amplifiers (data amplifier and write buffer) 153R and 153.

FIG. 70 shows a detailed configuration of the abovementioned example shown in FIG. 69.

With the configuration shown in FIG. 69, compared to the beforementioned configuration shown in FIG. 66, redundant SRAM cell columns in two columns are provided as the redundant SRAM cell array MAR, and the redundant SRAM cell array MAR and the normal SRAM cell array MA are arranged adjacent to each other and matching with the position of the rows. With the redundant SRAM cell array M, omitting the number of columns, then basically this is configured the same as the normal SRAM array MA.

That is to say, redundant SRAM cells SMCR (SMCR11, SMCR12, ...) configured the same as the beforementioned SRAM cells SMC (SMC11, SMC12 ...) shown in FIG. 67, are arranged in matrix form in the redundant SRAM cell array MAR. The redundant data input/output lines SIOR are arranged in respective rows so as to approximately intersect with data transfer bus lines TBL for interchange of data of the beforementioned DRAM portion, while the redundant global data input/output lines GIOR are arranged approximately parallel with these data transfer bus lines TBL. In other word, the redundant data input/output lines SIOR are arranged along the rows of the redundant SRAM cell array MAR, and the redundant global input/output lines GIOR are arranged along the columns of the redundant SRAM cell array MAR.

Here the redundant SRAM cell SMCR, as with the normal SRAM cell SMC, is alternatively selected by later mentioned redundant SRAM column selection signals SELR1, SELR2, and a SRAM row selection signal 501. That is to say, of the redundant SRAM cells SMCR constituting the redundant SRAM array MAR, only one of these SRAM cell is connected to the data input/output line SIOR. The other redundant SRAM cells are not connected to the data input/output line SIOR even if there is one which belongs to the same column as the selected SRAM cell, and are thus not selected at all. In other words, the redundant SRAM cells are alternatively selected as cell units by the redundant SRAM row selection signals and SRAM column selection signals.

To the redundant data input/output lines SIOR of the respective rows are connected to the redundant SRAM cell groups belonging to these rows. To one end side of the respective redundant data input/output lines SIOR is connected a redundant data input/output line connection circuit (switch circuit) 155R which is alternatively conduction controlled by read/write SRAM row selection signals 501 (predetermined address signals). The redundant data input/output line SIOR is connected in common with the redundant global data input/output line GIOR via a redundant data input/output line connection circuit 155R.

With this example, the redundant data input/output lines SIOR and the normal data input/output lines SIO belonging to the same row are led out in mutually opposite directions rather than side by side, and the redundant global data input/output lines GIOR and the normal global data input/output lines GIO are connected separately via the data input/output connection circuit. The redundant global data input/output line GIOR and the normal global data input/output line GIO are arranged so as to be on either guide of the redundant SRAM array MAR and the normal SRAM array MA. The redundant global data input/output line GIOR is connected to a read/write bus line by means of a redundant read/write amplifier 153R which is activated by redundant SRAM column selection signals SELR1 and SELR2. This read/write line is connected to a data input/output circuit 1500 corresponding to the data DQ.

Moreover, there is provided substitution address judgment circuits 2001, 2002, for inputting SRAM column address signals to generate the abovementioned redundant SRAM column selection signals SELR1, SELR2. The substitution address judgment circuits 2001, 2002 have for example a fuse circuit, and judge SRAM column addresses in which defects exist (defect column addresses) from column addresses of normal SRAM arrays MA. Defective column arrays previously detected by means of evaluation trials, are programmed (defined) into the fuse.

The redundant SRAM column selection signals SELR1, SELR2 are activated in the case where the SRAM column address corresponds with a previously programmed defective column address. In the case where these redundant SRAM column selection signals SELR1, SELR2 are activated, the redundant read/write amplifier 153R is activated, and the normal read/write amplifier 153 is deactivated.

In this example, a two system substitution address judgment circuit is provided, and hence saving for defective column addresses at two places can be performed.

Hereunder, in the configuration shown in FIG. 70, the operation will be explained in relation to defect saving, with the case where a defect exists in the normal SRAM cell SMC22 as an example.

By performing evaluation trials beforehand, a column address in which the SRAM cell SMC22 exists is detected as the defect column address. This defect address is programmed in either one of the substitution address judgment circuits 2001 or 2002. With this example, the defect column address is programmed in the substitution address judgment circuit 2001.

In the case where defects exist in column addresses for two locations, each of the defect addresses can be programmed to the substitution address judgment circuits 2001, 2002.

At first is a description of the operation at the time of writing.

In the condition where the defect address has been programmed as described above, the SRAM cell of the normal SRAM array MA is accessed based on the SRAM row address and SRAM column address. At this time, by means of the substitution address judgment circuits 2001, 2002, the SRAM column addresses are sequentially compared with the defect column address which has been programmed beforehand. Here, in the case where a SRAM column address coincides the defect column address, the substitution address judgment circuit 2001 judges that the SRAM column address is a defect column address, and the redundant SRAM column selection signal SELR1 is activated. As a result, the column to which the redundant SRAM cells SMCR11, SMCR11 . . . belong is selected.

Moreover, the read/write SRAM row selection signal 501 is alternatively activated based on the SRAM row address. Here, the read/write SRAM row selection signal 501 corresponding to the row to which the SRAM cell SMC22 belongs is activated. In this case, the SRAM cell SMC22 is connected to the data input/output line SIO, and the data input/output line connection circuit 155 provided in this data input/output line conducts. As a result, the SRAM cell SMC22 in which the defect exists is connected to the normal read/write amplifier 153. On the other hand, the redundant SRAM cell SMCR12 is connected to the data input/output line SIOR by means of the activated read/write SRAM row selection signal 501 and the SRAM column selection signal SELR1, and the data input/output line connection circuit 155R provided in this redundant data input/output line SIOR conducts. As a result, the redundant SRAM cell SMCR12 is connected to the redundant read/write amplifier 153R.

Here, in the case where the SRAM column selection signal SELR1 is activated, the redundant read/write amplifier 153R is activated, and the normal read/write amplifier 153 is deactivated. As a result, the data DQ appearing on the read/write bus line, taken in from outside by means of the data input/output circuit 1500, is written in to the redundant SRAM cell SMCR12 by means of the redundant read/write amplifier 153R. That is to say, instead of the SRAM cell SMC22 in which the defect exists, data is written in to the redundant SRAM cell SMCR12.

Here with this example, the arrangement is such that the normal read/write amplifier 153 is deactivated at the time of writing. However this need not necessarily be deactivated, and may still write in data to the normal SRAM cell in which the defect exists. However, in the case where, due to this, an inconvenience such as the generation of an excess current is involved, the read/write amplifier 153 may be deactivated.

Next is a description concerning the operation at the time of reading, referring to FIG. 73, taking as an example the case where the normal SRAM cell SMC12 is accessed.

The read/write SRAM row selection signal and the SRAM column selection signal are activated based on the SRAM row address and the SRAM column address, and the normal SRAM cell SMCR12 is selected. As a result, the data of this cell is output to the normal data input/output line SIO, and appears on the normal global data input/output line GIO via the data input/output line connection circuit 155. In this case, the normal read/write amplifier 153 is activated, and as a result, the data of the SRAM cell SMC12 which appears on the normal global data input/output line GIO is amplified and output as data DQ.

At this time, the SRAM column address is compared with the defect column address by the substitution address judgment circuit 2001. However in this case, since the SRAM column address is not the defect column address, the substitution address judgment circuit 2001 does not judge that this SRAM column address is the defect address, and thus does not activate the redundant SRAM column selection signal SELR1. As a result, all of the SRAM cells of the redundant SRAM array MAR are made the nonselective condition. Moreover, the redundant read/write amplifier 153R is in the deactivated condition. Consequently, the data from the redundant SRAM cell does not appear at all on the redundant data input/output line SIOR and the redundant global data input/output line GIOR. Moreover, the output condition of the redundant read/write amplifier 153R becomes a high impedance condition.

In this way, in the case where the SRAM column address does not correspond to the defect address, the read of data from the normal SRAM array MA is performed without accessing the redundant SRAM array. Consequently, wasteful operating current is not generated in the redundant SRAM array.

Next is a description concerning the operation at the time of reading, referring to FIG. 74, taking as an example the case where the normal SRAM cell SMC22 in which a defect exists is accessed.

The read/write SRAM row selection signal and the SRAM column selection signal are activated based on the SRAM row address and the SRAM column address, and the SRAM cell SMC22 is selected. As a result, the data of this cell is output to the normal data input/output line SIO, and appears on the normal global data input/output line GIO via the data input/output line connection circuit 155. However, in this case as described later, the result of activating the redundant SRAM column selection signal SELR1 is that the normal read/write amplifier 153 is made the deactivated condition. Consequently, the data of the SRAM cell SMC22 in which a defect exists is not output to the read/write line.

On the other hand, the SRAM column address is compared with the defect column address by means of the substitution address judgment circuit 2001. Here when the SRAM column address coincides with the defect column address, the substitution address judgment circuit 2001 judges that the SRAM column address is the defect column address, and activates the redundant SRAM column selection signal SELR1. Moreover, based on the SRAM row address, the read/write SRAM row selection signal 501 corresponding to the row to which the SRAM cell SMC22 belongs (that is, the row to which the redundant SRAM cell SMCR12 belongs) is activated. Consequently, the redundant SRAM cell SMCR12 is alternatively selected. As a result, the data of the redundant SRAM cell SMCR12 is output to the redundant data input/output line SIOR, and also appears on the redundant global data input/output line GIOR via the redundant data input/output line connection circuit 155R.

Here when the redundant SRAM column selection signal SELR1 is activated, the redundant read/write amplifier 153R is activated, and the normal read/write amplifier 153 is deactivated. As a result, the data from the redundant SRAM cell SMCR12 appearing on the redundant global data input/output line GIOR is amplified (sense) by the redundant read/write amplifier 153R, and applied to the data input/output circuit 1500 via the read/write bus. The data input/output circuit 1500 sends this to the outside as data DQ.

With the abovementioned first configuration example, since the normal data input/output line SIO and the redundant data input/output line SIOR are not side by side, an overhead from the point of layout due to provision of this redundant data input/output line does not arise.

Moreover, since the redundant data input/output line SIOR is provided separate to the normal data input/output line SIO, then in tho road operation for the data, in the case where a column in which a defect exists is accessed, the read from the redundant SRAM cell, and the read from the normal SRAM cell, are performed in parallel up until the stage prior to the read/write amplifier. Consequently, due to selecting the redundant SRAM cell and saving the defect, a high speed read operation is possible, without exerting an influence on the access time.

Hereunder is a detailed supplemental explanation of the reason that high speed read operation is possible by providing the redundant data input/output line SIOR.

Supposing that the redundant SRAM cell and the normal SRAM cell are connected to a common data input/output line SIO (local data input/output line), then in the case where data is read from the redundant SRAM cell, at first it is judged if the accessed address is a defect address, and if this is a defect address, it is necessary to read the data from the redundant SRAM cell, after first prohibiting generation of the normal SRAM column selection signal. Consequently, it is necessary to process so that data is not read from the normal cell before reading out data from the redundant SRAM cell. Hence ultimately, read of data is delayed.

To address this, in the case where as with the first configuration example, the redundant data input/output line SIOR is exclusively provided, there is no conflict between the data from the redundant SRAM cell and the data from the normal SRAM cell. Therefore it is not necessary to prohibit generation of the normal SRAM column selection signal. Hence the read from the redundant SRAM cell and the read from the normal SRAM cell can be performed in parallel, and the read operation from the redundant SRAM cell does not incur any restriction due to the operation for prohibiting read of data from the normal SRAM cell. Consequently, it is possible to perform read of data from the redundant SRAM cell at high speed.

With this first configuration example, each data output to the redundant data input/output line SIOR and the normal data input/output line SIO is applied to the read/write amplifier via the respective redundant global data input/output line GIOR and the normal global data input/output line GIO, and by selectively operating this read/write amplifier, the data appearing on one of the redundant or normal global data input/output lines is amplified and then output to a later stage data input/output circuit. However the arrangement is not limited to this, and provided the data respectively appearing on the redundant data input/output line SIOR and the normal data input/output line SIO can be selectively sent to the outside, then any means may be used.

Next, FIG. 71 shows a second configuration example for the case where a SRAM redundant cell column is provided.

The example shown in this figure is configured such that in the abovementioned example shown in FIG. 70, the redundant global data input/output line GIOR and the normal global data input/output line GIO are arranged between the redundant SRAM array MAR and the normal SRAM array MA, and the global data input/output line connected to the normal read/write amplifier 153 is switched by means of a global data input/output line switching circuit 2000. In other words, the redundant SRAM cells are arranged on either side of the global data input/output lines GIO and GIOR so as to be adjacent to the normal SRAM array MA, and are connected to the redundant data input/output line SIOR which is different from the data input/output line SIO connecting the normal SRAM cells.

With this second configuration example, at the time of reading, as with the abovementioned first configuration example, each data is read in parallel with each of the redundant and normal global data lines. After this, the data on either global data line is applied to the read/write amplifier 153 by means of the global data input/output line switching circuit 2000. That is to say, the global data input/output line switching circuit 2000, in the case where the redundant SRAM column selection signals SELR1, SELR2 output from the substitution address judgment circuits 2001, 2002 are activated (that is to say, in the case where a defect column address is detected), connects the redundant global data input/output line GIOR to the read/write amplifier 153. The read/write amplifier 153 amplifies the data on the connected global data line, and applies this to the data input/output circuit 1500. As a result, the normal SRAM cell in which a defect exists is replaced by a redundant SRAM cell, and the defect thus dealt with.

Here with this example, since the redundant SRAM cells are arranged on either side of the global data input/output lines GIO and GIOR so as to be adjacent to the normal SRAM array MA, and are connected to the redundant data input/output line SIOR which is different from the data input/output line SIO connecting the normal SRAM cells, then the normal global data input/output line GIO and the redundant global data input/output line GIOR can be arranged close to each other. Consequently, by connecting these global data input/output lines to the same read/write amplifier, and switching either by the data input/output line switching circuit (switching circuit) to connect to the amplifier, the number of read/write amplifiers can be reduced.

Next, FIG. 72 shows a third configuration example for the case where a SRAM redundant cell column is provided.

With the example shown in this figure, the global data input/output line GIOR in the abovementioned example shown in FIG. 70 and FIG. 71, is shared as a redundant and normal global data input/output line, and the normal data input/output line SIO is connected to the global data input/output line GIO via a data input/output line connection circuit 1550 which is non selective controlled by the redundant SRAM column selection signals SELR1, SELR2. Moreover, the redundant data input/output line SIOR is connected via a data input/output line connection circuit 155OR which is selective controlled by the redundant SRAM column selection signals SELR1, SELR2. Furthermore, the global data input/output line GIO is connected to the read/write amplifier 153 and the data input/output circuit 1500 is connected to a subsequent stage of this amplifier.

That is to say, with this third configuration example, the configuration is such that the normal data input/output line SIO and the redundant data input/output line SIOR are connected to a common global data input/output line, and are switched by the data input/output line connection circuit.

Next is a description concerning the operation at the time of read with this third configuration example, referring to FIG. 75, taking as an example the case where the normal SRAM cell SMC22 in which a defect exists is accessed.

The read/write SRAM row selection signal and the SRAM column selection signal are activated based on the SRAM row address and the SRAM column address, and when the normal SRAM cell SMC22 is selected, the data of this cell is output to the normal data input/output line SIO. However, in this case, as described later, the result of the redundant SRAM column selection signal SELR1 being activated controls the data input/output line connection circuit 1550 to the non conduct condition. Consequently, the data of the normal SRAM cell SMC22 in which a defect exists does not appear on the common global data input/output line GIO.

On the other hand, the SRAM column address is compared with the defect column address by means of the substitution address judgment circuit 2001. Here when the SRAM column address coincides with the defect column address, the substitution address judgment circuit 2001 judges that the SRAM column address is the defect column address, and activates the redundant SRAM column selection signal SELR1. Moreover, based on the SRAM row address, the read/write SRAM row selection signal 501 corresponding to the row to which the SRAM cell SMC22 belongs (that is, the row to which the redundant SRAM cell SMCR12 belongs), is activated. Consequently, the redundant SRAM cell SMCR12 is selected.

As a result, the data of the redundant SRAM cell SMCR12 is output to the redundant data input/output line SIOR. In this case, the redundant data input/output line connection circuit 155R is conduction controlled, and the data of the SRAM cell SMCR12 appears on the redundant global data input/output line GIOR via this redundant data input/output line connection circuit 155R. This data is amplified (sense) by the read/write amplifier 153 and applied to the data input/output circuit 1500. The data input/output circuit 1500 sends this to the outside as data DQ.

With the abovementioned third configuration example, since the normal and redundant global data input/output lines are common, the number of global data input/output lines, and the circuit elements such as the read/write amplifiers accompanying these can be reduced. Consequently, the layout pitch can be relaxed.

In the above, the respective redundant configurations have been described focussing on the SRAM portion 102. With this embodiment however, the configuration is such that the saving of a defect of the DRAM portion 101 is also performed at the same time.

That is to say, as shown beforehand in FIG. 30 and FIG. 44, the memory cell group of the DRAM portion 101 and the memory cell group of the SRAM portion 102 are connected to each other via the data transfer bus line TBL so as to be able to transfer data. Therefore, in the case where the SRAM portion 102 is replaced by the redundant SRAM cell, there is the requirement for the presence of a memory cell on the DRAM portion side for this redundant SRAM cell. Therefore, with this invention, the memory cell group of the DRAM portion 101 and the memory cell group of the SRAM portion 102 which are made common with the data transfer bus line TBL are simultaneously replaced as a unit by the redundant memory cell group.

More specifically, in addition to the abovementioned redundant SRAM array MAR, a redundant DRAM array (omitted from the figure) is further provided for saving defects existing in the DRAM portion 101, and a redundant data transfer bus line (omitted from the figure) is wired between these redundant SRAM array and redundant DRAM array. Then, in the case where a certain memory cell column of the SRAM portion 102 in which a defect exists is replaced by a redundant SRAM cell, a memory column of the DRAM portion 101 which performs delivery of data via a data transfer bus line between memory cell columns (columns in which a defect exists) of this SRAM portion 102, is simultaneously replaced by a redundant memory cell column of the DRAM portion 101 which performs delivery of data via a redundant data transfer bus line between the redundant memory cell columns of the SRAM portion.

Here with the abovementioned example, the case where a defect exists in the SRAM portion 102 has been explained. However the case where a defect existing in the DRAM portion 101 is saved, also in the same manner, involves performing saving of defects with the memory cell group of the DRAM portion 101 and the memory cell group of the SRAM portion 102 which are made common by the data transfer bus line TBL, as a unit. Of course, the configuration may be such that the DRAM portion and the SRAM portion perform saving independently.

With the abovementioned first through third configuration examples for the case where the SRAM redundant cell column it provided, the switching from the SRAM cell column which is to be replaced, to the redundant SRAM cell column is performed by switching of the global data input/output lines or switching of the data amplifier and the write buffer. By having the abovementioned means, switching to the redundant cell column of the SRAM array for each data DQ (the data corresponding to the external data input/output terminal) becomes possible, so that even in the case where switching to a redundant cell column is performed, the difference in the access time for the non redundant cell array can be eliminated. Here the redundant SRAM cell array, the data input/output line, and the global data input/output line are arranged at the upper portion of the SRAM cell array, however there is no particular limitation to this arrangement.

(8) Other Items

1. Power Source Voltage

"Power source voltage supplied to DRAM and SRAM"

FIG. 76 shows an example of a configuration for power supply voltage supplied to the DRAM array portion and the SRAM array portion. In FIG. 76, this configuration incorporates a power supply voltage conversion circuit (internal power supply circuit) 603, and generates an internal power source voltage VINT from an external power source voltage VEXT. The configuration is such that this internal power source voltage VINT is supplied to a DRAM array portion 601, and the external power source voltage VEXT is supplied to a SRAM array portion 602. With recent DRAMS, miniaturization of processes has progressed, and it has become difficult to maintain voltage breakdown resistance, so that in the memory cell array portion, the power supply voltage is used at a reduced level to the external power supply voltage.

However, as a matter of course, if the power supply voltage drops, the drive capability of the transistor drops, hindering speed increase. Therefore with this example, by holding back miniaturization of the SRAM array portion more than for the DRAM array portion, and making the power source voltage supplied to the SRAM array portion the external power source voltage VEXT, speeding up the operating speed of the SRAM portion is achieved. For example, with the write in speed at the time of writing in data to the SRAM cell, as is apparent from the simulation results for dependence of write in time to the SRAM cell on power source voltage as shown in FIG. 78, in the case where the external power source voltage VEXT=3.3 V, compared to an internal power source voltage VINT=2.5 V, there is a speed increase of 41%.

FIG. 77 shows another example of a configuration for a power source voltage supplied to the DRAM array portion and the SRAM array portion. In FIG. 77, the power source voltage conversion circuit 603 generates a first internal power source voltage VINT1 and a second internal power source voltage VINT2 from an external power source voltage VEXT. The first internal power source voltage VINT1 is supplied to the DRAM array portion 601, and the second internal power source voltage VN12 is supplied to the SRAM array portion 602. At this time, by having the second internal power source voltage VINT2 higher than the first internal power source voltage VINT1, then the same result as before can be obtained. Moreover, it is not necessary that the power source voltage conversion circuit 603 is one unit, and this may be constructed separately as two units with one for the first internal power source voltage VINT1, and the other for the second internal power source voltage VINT2. Furthermore, for the substrate potential which is also related to the power source voltage, various cases can be considered depending on the type of memory cell constituting the main storage portion and the auxiliary storage portion. For example, in the case where the main storage portion comprises a dynamic type memory, the main storage portion may have a substrate potential lower than other regions, or the main storage portion, the auxiliary storage portion and both data transfer circuits may have substrate potentials lower than other regions. These substrate potentials can be realized by forming P wells, N wells, deep N wells or the like on a P substrate.

2. Description of Other Functions

"Function 1: copy transfer"

The semiconductor memory device according to the present invention can also have a function enabling data transfer between SRAM memory cells on the same column, for example between memory cell SMC1 and memory cell SMC16 in FIG. 53. As a result, copying of the cell data for a certain one row part of the SRAM cell to another row, and transfer at a much higher speed than transfer from a DRAM cell is possible. Moreover, this function can be realized without being hindered by the data transfer operation of the DRAM.

Hereunder is a description using FIG. 53, of the data transfer operation from the cell of one row portion containing the memory cell SMC1 to the cell of one row portion containing the memory cell SMC16. The SRAM cell read/write row selection signal SWL1 is activated, so that data of the cell of the one row portion containing the memory cell SMC1 is transferred to each SRAM bit line. After this, the SRAM cell read/write row selection signal SWL16 is activated, so that data of each bit line is transmitted to the cell of the one row portion containing the memory cell SMC16, and the cell data is re-written. Since the SRAM bit line SBL is used in the data transfer, then for example the data transfer between the DRAM cell and the cell of one row portion containing the memory cell SMC2 selected by the SRAM cell data transfer row selection signal TWL2, can be performed using the data transfer bus line TBL. Hence data transfer from the cell of the one row portion containing the memory cell SMC1 to the cell of the one row portion containing the memory cell SMC16 can be effected completely regardless. These operations are all performed by the command input, and a command specifying the transfer SRAM cell group and the transfer destination SRAM cell group must be added.

"Function 2: Temporary cell transfer"

With the configuration of the SRAM array portion shown in FIG. 53, there is data which is written in to a assigned SRAM cell, and in the case where data transfer (prefetch transfer operation) is newly made from a DRAM cell of a different row, and the data of the assigned SRAM cell is read, the data once written into the SRAM cell must be data transferred (restore transfer operation) to the DRAM cell, and after this, data transfer must be newly made (prefetch transfer operation) from a DRAM cell of another row, and data of the SRAM cell read. If the data transfer cycle time to the DRAM cell is tRC, and the time from data transfer (prefetch transfer operation) from the DRAM cell to the SRAM cell up until the data of the SRAM cell is read is tRAC, then it takes a time of tRC+tRAC until read. However, by having the following function, a faster read is possible.

FIG. 79 shows an example of a specific configuration of a SRAM array portion for realizing this function. In FIG. 79, practically all of the configuration is identical to that described for FIG. 53. The difference is that a temporary SRAM cell adds one row portion, and a selector 309 is provided for performing selection of rows of the temporary cell by a control signal TCSL. Here the control signal TCSL is one of the transfer control signals generated by the operation control device shown in FIG. 39, and is generated at the time of performing data transfer to the temporary cell. Moreover, while here the temporary SRAM cell adds one row, however the arrangement is not limited to this, and one part within the existing SRAM cell may be selected as a temporary cell. Moreover, this temporary SRAM cell may have not one, but a plurality of rows.

An explanation is given using FIG. 80, of one example of the internal operation for the case where in FIG. 79, the data of the cells of one row portion containing the memory cell SMC1 is transferred (copied) to the cells of one row portion containing the temporary memory cell SMCD, and the data transfer from the DRAM cells (prefetch transfer operation) is made to the cells of one row portion containing the memory cell SMC1, and the data of the SRAM cells is read. At first, the active command is input, and the DRAM row which has the read data is selected. Then, when a newly added command (temporary cell copy command) for transfer to the temporary SRAM cells is input, the control signal TCSL is activated accompanying this. By means of the data transfer SRAM row address which is input at the same time as the command, the SRAM cell read/write row selection signal SWL1 is activated, and the data of the cells of one row portion containing the memory cell SMC1 is transmitted to each SRAM bit line. After this, the SRAM temporary cell read/write row selection signal SWLD is activated by the control signal TCSL, so that the data of each bit line is transmitted to the temporary cells of one row portion containing the temporary memory cell SMCD, and cell data is rewritten.

This operation is the same as the beforementioned "Function 1" operation for copying the cell data of the one row portion having the SRAM cell to another row. In this way, the cell data which must be data transferred to the DRAM can be temporarily stored in the temporary cell. Then the prefetch command is input and data transfer is performed (prefetch transfer operation) from the DRAM cell to the cell of the one row portion containing the memory cell SMC1, and the read data is transmitted to the SRAM memory cell. After this, the read command is input, and the data is read from the SRAM cell. By means of the above, the tRC part can be eliminated, so that read is possible in the time tRAC.

With the data transferred to the temporary cell, data transfer to the DRAM (temporary cell restore transfer operation) may be performed after performing this operation.

"Function 3: Simultaneous transfer of a plurality of rows"

Furthermore, the semiconductor memory device according to the present invention can also have a function where, when the cell group within the selected one row of the DRAM data transfers to the SRAM portion, the multiple row SRAM cell group is simultaneously selected so that the same data can be transferred. This can be realized with a simple circuit addition. In FIG. 53, a control signal which is generated by means of a newly added command for realizing the above function may be added to the SRAM row control device 124, so that the SRAM internal row address signals are controlled by this signal to multiply activate the SRAM cell data transfer row selection signals TWL.

"Function 4: Auto continuous prefetch/restore transfer"

Moreover, the semiconductor memory device according to the present invention may also have a function where, when of the DRAM cells of the selected one row of the DRAM, a DRAM cell group further selected by the DRAM column decoder data transfers to the SRAM portion, rather than repeating the data transfer with a plurality of commands, but by continuously repeating the transfer operation by moans of a one time command in a predetermined delay time interval of the chip interior, shortening of the total time for the data transfer is possible.

FIG. 81 shows an example of the internal operation of this function. Here a one row DRAM cell is divided into four DRAM cell groups by means of a DRAM column decoder. There is no particular limitation to this number of divisions, and this may be divided into any number. In FIG. 81, when a newly added command (prefetch (2) command) defined by this function is input, a four times internal count up signal is generated continuously in the predetermined delay time interval of the chip interior. Respective counter circuits are provided in the DRAM column control device for generating DRAM internal column address signals, and in the SRAM row control device for generating SRAM internal row address signals. The DRAM column address and the SRAM row address which are input simultaneously at the time of the next command input are taken in by the first internal count up signal, and the sequential respective addresses are counted up by the subsequent internal count up signals. These respective transfer operations are performed in the cycle of the four times internal count up signal.

In the same manner as this, this can also have a function where, at the time of data transfer of the data of the plurality of SRAM cell groups to the plurality of DRAM cell groups selected by the respective DRAM row decoder and column decoder, rather than repeating commands several times, by continuously repeating the transfer operation by means of a one time command in a predetermined delay time interval of the chip interior, transfer is possible to each of a plurality of DRAM cell groups. As with the previous function, this can be realized by providing in the DRAM column control device which generates DRAM internal column address signals, and in the SRAM row control device which generates SRAM internal row address signals, respective counter circuits which generate a continuous internal count up signal at the predetermined delay time interval of the chip interior.

"Function 5: Multiple row continuous read/write"

Furthermore, the semiconductor memory device according to the present invention may have a function where, rather than repeating the command several times, all of the data of the SRAM cell group is continuously read and written in a predetermined sequence according to a sequence determined with respect to SRAM cell groups of a plurality of rows, by means of a one time command. By having this function, then for example when the cell data of one row portion of a DRAM is separated and held in a plurality of SRAM cell groups, the cell data of one row portion of the DRAM can all be continuously read and written in a predetermined sequence. Hence the load on the memory controller or chip set for controlling the semiconductor memory device is reduced, and during this time the other SRAM cell groups and DRAM portions can be made to operate. Moreover, if this is used with optional function 4, then still more effect is obtained.

FIG. 82 shows an example of a specific configuration of a GRAM row control device for realizing this function. In FIG. 82, a counter circuit 351 which takes in the output from a SRAM internal row address latch circuit 350 by means of a control signal SRE, and counts up at a predetermined address sequence by means of an internal count up signal SRUP which is generated when a SRAM column address comes to a most significant address, and a multiplexer 352 which passes either one of the outputs from the latch circuit 350 and the counter circuit 351, are added to the SRAM internal address latch circuit 350 shown in FIG. 59. The multiplexer 352 selects the output from the latch circuit 350 in the clock cycle at the time of read/write command input, and is controlled by the control signal SRSL so as to output a little faster the SRAM internal column address signal. Moreover, in the SRAM column control device, the counter circuit 506 shown in FIG. 60 has the function of sequentially shifting up from the taken in column address to the most significant address when the newly added command defined by this function is input.

FIG. 83 shows an example of an internal operation of a read function from among these functions. In FIG. 83, when a newly added command (read (2) command) defined by this function is input, a control signal SRSL is generated, and by means of the multiplexer 352, the output of the SRAM internal row address latch circuit 350 becomes SRAM internal row addresses iASR0~iASR3. At the same time, the output from the latch circuit 350 is taken in to the counter circuit 351 by means of the control signal SRE. After this, in synchronous with the standard clock signal CLK, the column address is incremented, and the counter circuit 351 increments the row address by means of the internal count up signal SRUP which is generated when the most significant address results. Furthermore, after achieving the most significant address, the multiplexer 352 is controlled by the control signal SRSL, and the output from the counter circuit 351 becomes the SRAM internal row address iASR0~iASR3. By sequentially shifting the row and column addresses in this manner, all of the data of the multiple row SRAM cell group can be continuously read. Here the internal count up signal SRUP, the control signal SRE, and the control SRSL are the SRAM portion control signals generated by the operation control device shown in FIG. 39.

"Function 6: Real time mode setting"

Moreover, the semiconductor memory device according to the present invention may have a function where, when the read/write command is input to effect reading and writing with respect to the SRAM cell, the data input format for the burst length, the data input/output address sequence, the latency and the like, can be set at the same time as that command input. By having this function, then with respect to the requirement for different data input/output format, this can be assigned each time on each occasion. Therefore the burden on the memory controller and/or chip set for controlling the semiconductor memory device becomes very light, so that system performance can be improved.

FIG. 84 shows a correspondence table for a read (3) /write (3) command by means of this function, and respective input/output terminal conditions. The difference to the table shown in FIG. 5 is the point that the burst length selection is assigned to the address terminals A11, A12, A13 which are not used at the time of read/write command input. By means of the condition of the address terminals for these three bits, the burst length such as in FIG. 21 can be selected and assigned at the same time as the read (3) /write (3) command input. Here the burst length selection is assigned, however similarly, data input/output format such as the data input/output address sequence, the latency and the like can also be assigned.

FIG. 85 shows an example of the operation for the case where this function is used. Here with the data input/output address sequence, sequential and latency are set to 2, and at the time of the read (3) command input, the burst length is changed by means of the address signals A11~A13 (internal address signals iA11~iA13). This can be realized circuit wise, as with the normal SDRAM, by controlling the counter circuit inside the SRAM column control device shown in FIG. 60, by burst length setting, and controlling the SRAM internal column addresses iASC4~iASC10.

"Function 7: Auto restore/prefetch transfer"

The semiconductor memory device according to the present invention may also have a function where, after data transfer from the DRAM cell group to the SRAM cell group, the data of another SRAM cell group can be transferred to a DRAM cell group the same as the one which has made the transfer. If the DRAM row address and DRAM column address at the time of data transfer are retained internally, then this can be realized by using the DRAM internal row address latch circuit shown in FIG. 45, and the DRAM internal column address latch circuit shown in FIG. 46.

Moreover, by having this latch circuit for each bank, then even if different banks are alternately accessed, this can be made possible. As a result, at the time of the restore transfer operation, there is no need to specify the DRAM column address and DRAM row address, so that the time required for the restore transfer operation is effectively shortened. Therefore, the control by the memory controller or chip set for controlling this semiconductor device is simplified and load is reduced so that system performance is improved. Moreover, in an identical manner, this can also have a function where, after data transfer from the DRAM cell group to the SRAM cell group, the data of another DRAM cell group can be transferred to a SRAM cell group the same as the one which has made the transfer.

As described above, with the present invention, the configuration is such that data transfer in both directions is possible between the main memory portion and the auxiliary memory portion. Moreover, a plurality of auxiliary data lines which connect memory cell groups of each row are separately provided in a normal memory cell array and a redundant memory cell array belonging to the auxiliary storage portion. Therefore a semiconductor integrated circuit apparatus can be realized where it is possible to quickly correspond to access requests from a plurality of memory masters, without lowering the cache hit ratio, and moreover defects of the auxiliary storage portion can be saved without having an influence on the read speed.

What is claimed is:

1. A semiconductor integrated circuit device having a main storage portion, and an auxiliary storage portion functioning as a cache memory, constructed such that two way data transfer is possible between said main storage portion and said auxiliary storage portion, said auxiliary storage portion comprising:

a normal memory cell array with memory cells which are alternatively selected based on a selection signal, arranged in matrix form, and a redundant memory cell array provided so as to be adjacent to said memory cell array with the positions of rows matching, and with redundant memory cells which are alternatively selected based on a redundant selection signal, arranged in matrix form, wherein a plurality of auxiliary data lines, to which memory cell groups of each row are connected, are separately provided for said normal memory cell array and for said redundant memory cell array, wherein said semiconductor integrated circuit device comprises:

a data line connecting said main storage portion to said auxiliary storage portion, a plurality of redundant auxiliary data lines provided along rows of said redundant memory cell array, to which redundant memory cell groups belonging to each row of said redundant memory cell array are connected, and a plurality of redundant switch circuits respectively provided in said plurality of redundant auxiliary data lines, and alternatively conducting controlled based on a predetermined redundant address signal.

2. A semiconductor integrated circuit device having a main storage portion, and an auxiliary storage portion functioning as a cache memory, constructed such that two way data transfer is possible between said main storage portion and said auxiliary storage portion, said auxiliary storage portion comprises:

a memory cell array with memory cells which are alternatively selected based on a selection signal, arranged in matrix form;

a plurality of auxiliary data lines provided along rows of said memory cell array, to which memory cell groups belonging to each row of said memory cell array are connected;

a plurality of switch circuits respectively provided in said plurality of auxiliary data lines, and alternatively conducting controlled based on a predetermined address signal; and a main data line provided along columns of said memory cell array, and connected to said plurality of auxiliary data lines via said plurality of switching circuits;

wherein the semiconductor integrated circuit device comprises:

a redundant memory cell array provided so as to be adjacent to said memory cell array with the position of rows matching, and with redundant memory cells which are alternatively selected based on a redundant selection signal, arranged in matrix form, and a plurality of redundant auxiliary data lines provided along rows of said redundant memory cell arrays, to which redundant memory cell groups belonging to each row of said redundant memory cell array are connected, a plurality of redundant switch circuits respectively provided in said plurality of redundant auxiliary data lines, and alternatively conducting controlled based on a predetermined redundant address signal, and a redundant main data line provided along columns of said redundant memory cell array, and connected to said plurality of redundant auxiliary data lines via said plurality of redundant switching circuits.

3. A semiconductor integrated circuit device according to claim 2, wherein said main data line and said redundant main data line are arranged so as to locate said memory cell array and said redundant memory cell array therebetween.

4. A semiconductor integrated circuit device according to claim 2, wherein said main data line and said redundant main data line are arranged between said memory cell array and said redundant memory cell array.

5. A semiconductor integrated circuit device according to claim 2, wherein said main data line and said redundant main data line are arranged between said memory cell array and said redundant memory cell array and share each other.

6. A semiconductor integrated circuit device having a main storage portion, and an auxiliary storage portion functioning as a cache memory, constructed such that two way data transfer is possible between said main storage portion and said auxiliary storage portion, wherein memory cell groups of said main storage portion and said auxiliary storage portion are simultaneously replaced as a unit with redundant memory cell groups of the memory cell group of said main storage portion and the memory cell group of said auxiliary storage portion which are commonly connected with a data line for executing said data transfer.

* * * * *